(12) United States Patent
Myung et al.

(10) Patent No.: US 12,021,618 B2
(45) Date of Patent: *Jun. 25, 2024

(54) METHOD AND APPARATUS FOR CHANNEL ENCODING AND DECODING IN COMMUNICATION OR BROADCASTING SYSTEM

(71) Applicant: Samsung Electronics Co., Ltd., Suwon-si (KR)

(72) Inventors: Seho Myung, Seoul (KR); Kyungjoong Kim, Suwon-si (KR); Seokki Ahn, Suwon-si (KR); Hongsil Jeong, Suwon-si (KR); Min Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,668

(22) Filed: Aug. 4, 2023

(65) Prior Publication Data

US 2023/0388048 A1 Nov. 30, 2023

Related U.S. Application Data

(63) Continuation of application No. 17/979,289, filed on Nov. 2, 2022, now Pat. No. 11,722,247, which is a
(Continued)

(30) Foreign Application Priority Data

| Jun. 23, 2017 | (KR) | 10-2017-0079497 |
| Jun. 26, 2017 | (KR) | 10-2017-0080773 |
| Nov. 14, 2017 | (KR) | 10-2017-0151743 |

(51) Int. Cl.
*H04L 1/00* (2006.01)
*H03M 13/00* (2006.01)
*H03M 13/11* (2006.01)

(52) U.S. Cl.
CPC ....... *H04L 1/0058* (2013.01); *H03M 13/1102* (2013.01); *H03M 13/116* (2013.01);
(Continued)

(58) Field of Classification Search
CPC ... H04L 1/0058; H04L 1/0041; H04L 1/0045; H04L 1/0057; H04L 1/0068;
(Continued)

(56) References Cited

U.S. PATENT DOCUMENTS

| 7,343,548 B2 * | 3/2008 | Blankenship | H03M 13/1137 |
| | | | 714/752 |
| 9,031,161 B2 * | 5/2015 | Yoo | H04L 25/03866 |
| | | | 375/298 |

(Continued)

FOREIGN PATENT DOCUMENTS

| CN | 1960190 A | 5/2007 |
| CN | 101335596 A | 12/2008 |

(Continued)

OTHER PUBLICATIONS

Chinese Notice of Allowance dated Nov. 9, 2023, issued in Chinese Patent Application No. 201880034919.9.
(Continued)

*Primary Examiner* — John J Tabone, Jr.
(74) *Attorney, Agent, or Firm* — Jefferson IP Law, LLP

(57) ABSTRACT

A pre-5th-generation (pre-5G) or 5G communication system for supporting higher data rates beyond a 4th-generation (4G) communication system, such as long term evolution (LTE) is provided. A channel encoding method in a communication or broadcasting system includes identifying an
(Continued)

input bit size, determining a block size (Z), determining a low density parity check (LDPC) sequence to perform LDPC encoding, and performing the LDPC encoding based on the LDPC sequence and the block size.

20 Claims, 62 Drawing Sheets

Related U.S. Application Data continuation of application No. 17/409,054, filed on Aug. 23, 2021, now Pat. No. 11,502,781, which is a continuation of application No. 16/845,726, filed on Apr. 10, 2020, now Pat. No. 11,101,926, which is a continuation of application No. 16/016,013, filed on Jun. 22, 2018, now Pat. No. 10,623,139.

(52) U.S. Cl.
CPC ... *H03M 13/1188* (2013.01); *H03M 13/6306* (2013.01); *H03M 13/6393* (2013.01); *H03M 13/6516* (2013.01); *H04L 1/0041* (2013.01); *H04L 1/0045* (2013.01); *H04L 1/0057* (2013.01); *H04L 1/0068* (2013.01); *H04L 2001/0093* (2013.01)

(58) Field of Classification Search
CPC ...... H04L 2001/0093; H03M 13/1102; H03M 13/116; H03M 13/1188; H03M 13/6306; H03M 13/6393; H03M 13/6516
USPC ................ 714/776, 752, 786, 790, 799, 821
See application file for complete search history.

(56) References Cited

U.S. PATENT DOCUMENTS

| | | | | |
|---|---|---|---|---|
| 10,484,010 B2* | 11/2019 | Myung | ............. | H03M 13/6516 |
| 10,623,139 B2* | 4/2020 | Myung | ................. | H04L 1/0058 |
| 2008/0168324 A1* | 7/2008 | Xu | ..................... | H03M 13/1105 |
| | | | | 714/758 |
| 2009/0083604 A1* | 3/2009 | Tong | ................. | H03M 13/1194 |
| | | | | 714/752 |
| 2011/0029756 A1* | 2/2011 | Biscondi | ........... | H03M 13/3715 |
| | | | | 712/22 |
| 2011/0029835 A1 | 2/2011 | Li et al. | | |
| 2011/0239075 A1* | 9/2011 | Xu | ..................... | H03M 13/618 |
| | | | | 714/751 |
| 2011/0239077 A1 | 9/2011 | Bai et al. | | |
| 2014/0372825 A1 | 12/2014 | Jeong et al. | | |
| 2016/0013809 A1 | 1/2016 | Myung et al. | | |
| 2016/0020933 A1 | 1/2016 | Rajagopal et al. | | |
| 2016/0344412 A1 | 11/2016 | Jeong et al. | | |
| 2017/0149528 A1 | 5/2017 | Kim et al. | | |
| 2017/0222660 A1* | 8/2017 | Li | ........................ | H03M 13/116 |
| 2017/0230058 A1* | 8/2017 | Xu | ........................ | H03M 13/118 |
| 2018/0175886 A1* | 6/2018 | Myung | .............. | H03M 13/1148 |
| 2018/0375611 A1* | 12/2018 | Myung | ................. | H04L 1/0045 |
| 2020/0244396 A1* | 7/2020 | Myung | ................. | H04L 1/0058 |
| 2021/0391946 A1 | 12/2021 | Myung et al. | | |

FOREIGN PATENT DOCUMENTS

| | | |
|---|---|---|
| CN | 101965687 A | 2/2011 |
| CN | 105284053 A | 1/2016 |
| EP | 2 091 156 A2 | 8/2009 |
| WO | 2009/110722 A2 | 9/2009 |

OTHER PUBLICATIONS

Zte, 'Shift coefficient design for base graph #1', R1-1710845, 3GPP TSG RAN WG1 NR Ad-Hoc#2, Qingdao, P.R. China, Jun. 20, 2017.
Mediatek Inc., 'On NR LDPC design and performance', R1-1710829, 3GPP TSG RAN WG1 NR Ad-Hoc#2, Qingdao, P.R. China, Jun. 20, 2017.
Nokia, 'Summary of [89-24] Email discussion on LDPC code base graph #1 for NR', R1-1711545, 3GPP TSG RAN WG1 NR Ad-Hoc#2, Qingdao, P.R. China, Jun. 19, 2017.
International Search Report dated Sep. 20, 2018 issued in International Application No. PCT/KR2018/007055.
Extended European Search Report dated May 12, 2020, issued in a counterpart European Application No. 18821156.9-1210/3613148.
LG Electronics: "LDPC Codes Design for eMBB data channel", 3GPP Draft; R1-1709641_LDPC Codes Design for EMBB_Final, 3rd Generation Partnership Project (3GPP), vol. RAN WG1, No. XP051285332; May 18, 2017, Hangzhou, China. Retrieved from the Internet: URL:http://www.3gpp.org/ftp/tsg_ran/WG1_RL1/TSGR1_89/Docs/.
"3rd Generation Partnership Project; Technical Specification Group Radio Access Network; NR; Multiplexing and channel coding (Release 15)", 3GPP Standard ; Technical Specification ; 3GPP TS 38.212 V0.0.1, 3rd Generation Partnership Project (3GPP), vol. RAN WG1, No. XP051336737, V0.0.1, Aug. 12, 2017. pp. 1-23.
Chinese Office Action dated Mar. 20, 2023, issued in Chinese Patent Application No. 201880034919.9.

* cited by examiner

FIG. 19A

| 19B | 19C | 19D |
|-----|-----|-----|
| 19E | 19F | 19G |
| 19H | 19I | 19J |

FIG. 19B

| 1 | 1 | 1 | 1 |   |   | 1 |   |   | 1 | 1 | 1 |   |   |   |   |
|---|---|---|---|---|---|---|---|---|---|---|---|---|---|---|---|
| 1 |   |   | 1 | 1 | 1 | 1 | 1 | 1 |   | 1 | 1 |   |   |   |   |
| 1 | 1 |   | 1 | 1 |   |   | 1 |   | 1 |   | 1 | 1 |   |   |   |
|   | 1 | 1 |   | 1 | 1 | 1 | 1 | 1 | 1 |   |   | 1 |   |   |   |
| 1 | 1 |   |   |   |   |   |   |   | 1 |   | 1 |   |   |   |   |
| 1 | 1 |   |   | 1 |   | 1 |   |   | 1 |   |   | 1 |   |   |   |
| 1 |   |   |   | 1 |   | 1 |   | 1 |   | 1 |   |   |   | 1 |   |

FIG. 19E

| | 1 | | | 1 | | 1 | | | 1 | | 1 | | | |
|---|---|---|---|---|---|---|---|---|---|---|---|---|---|---|
| 1 | 1 | | | | | | | | | 1 | | | | |
| | 1 | | | | | | 1 | | 1 | 1 | | | | |
| 1 | 1 | | | | 1 | 1 | | | | | | | | |
| 1 | | | | | 1 | | 1 | | | 1 | | | | |
| | 1 | 1 | | | | | | | 1 | | | | | |
| 1 | 1 | | | | | 1 | | | | 1 | | | | |
| | 1 | | | 1 | | | | | 1 | 1 | | | | |
| 1 | | | | | | | | 1 | 1 | | | | | |
| | 1 | | | | | | 1 | | 1 | 1 | | | | |
| | 1 | | 1 | | | | | | 1 | 1 | | | | |
| 1 | | | | 1 | 1 | | | | | | | | | |
| 1 | 1 | | | | | | 1 | | | | | | | |
| | 1 | | 1 | | | | | 1 | | | | | | |
| 1 | | | | | 1 | | | 1 | | | | | | |

FIG. 20A

| 20B | 20C | 20D |
|-----|-----|-----|
| 20E | 20F | 20G |
| 20H | 20I | 20J |

FIG. 20B

| 190 | 219 | 193 | 18  |     |     | 182 |     |     | 0   | 0   | 0   |     |     |     |     |
|-----|-----|-----|-----|-----|-----|-----|-----|-----|-----|-----|-----|-----|-----|-----|-----|
| 203 |     |     | 4   | 212 | 173 | 46  | 45  | 172 | 213 |     | 0   | 0   |     |     |     |
| 164 | 125 |     | 251 | 238 |     |     | 240 |     | 1   |     | 0   | 0   |     |     |     |
|     | 73  | 228 |     | 129 | 95  | 226 | 246 | 81  | 209 | 0   |     |     | 0   |     |     |
| 217 | 168 |     |     |     |     |     |     |     |     | 73  |     |     | 0   |     |     |
| 210 | 76  |     |     |     | 177 |     | 110 |     |     | 224 |     |     |     | 0   |     |
| 115 |     |     |     |     | 204 |     | 29  |     | 59  | 124 |     |     |     |     | 0   |

FIG. 20E

|   |     |     |     |     |     |     |    |     |     |     |   |   |   |   |
|---|-----|-----|-----|-----|-----|-----|----|-----|-----|-----|---|---|---|---|
|   | 138 |     |     | 161 | 181 |     |    | 123 | 179 |     |   |   |   |   |
| 44| 138 |     |     |     |     |     |    |     |     | 195 |   |   |   |   |
|   | 194 |     |     |     |     | 4   |    | 192 | 105 |     |   |   |   |   |
| 36| 80  |     |     | 243 | 25  |     |    |     |     |     |   |   |   |   |
| 224|    |     |     |     | 189 |     | 89 |     |     | 238 |   |   |   |   |
|   | 207 | 133 |     |     |     |     |    |     | 233 |     |   |   |   |   |
| 147| 184|     |     |     |     | 226 |    |     |     | 3   |   |   |   |   |
|   | 228 |     |     | 14  |     |     |    |     | 31  | 33  |   |   |   |   |
| 22|     |     |     |     |     |     |    | 138 | 38  |     |   |   |   |   |
|   | 61  |     |     |     |     |     | 74 |     | 105 | 2   |   |   |   |   |
|   | 46  |     | 38  |     |     |     |    |     | 83  | 5   |   |   |   |   |
| 6 |     |     |     | 6   | 248 |     |    |     |     |     |   |   |   |   |
| 202| 212|     |     |     |     |     |    | 250 |     |     |   |   |   |   |
|   | 232 |     | 156 |     |     |     |    |     | 251 |     |   |   |   |   |
| 35|     |     |     |     |     | 249 |    |     | 36  |     |   |   |   |   |

FIG. 20H

| | 106 | 166 | | | | | | | | | | | | | |
|---|---|---|---|---|---|---|---|---|---|---|---|---|---|---|---|
| 109 | | | 10 | | 181 | | | | | | | | | | |
| | | 166 | 29 | | | | | 221 | | | | | | | |
| 138 | | | | | 38 | | | | | | | | | | |
| | | | 226 | | | | 55 | | | | 28 | 150 | | | |
| 5 | | | | | 115 | | | | | | | | | | |
| | 64 | 3 | | 240 | | | | | | | | | | | |
| 12 | | | | 177 | | | | | | | | | | | |
| | | 3 | | | 109 | | 96 | | 241 | | | | | | |
| | 9 | | | | | | | | | | 237 | | | | |
| 25 | | | | | 78 | | | | | | 51 | | | | |
| | | 227 | | | | | 130 | | 91 | | | | | | |
| 177 | | | | | | | | | | | 254 | 220 | | | |
| | 177 | | | | 48 | | | | 46 | | | | | | |
| 22 | | 0 | | | | 236 | | | | | | | | | |
| | | | | | | | | | 231 | | 191 | | | | |
| | 50 | | | | 11 | | | | 191 | | | | | | |
| 16 | | | | | | 253 | | | 207 | | | | | | |
| | | 1 | | | | | | 243 | | 129 | | | | | |
| | 218 | | | 8 | | | | 202 | | | | | | | |

FIG. 21A

| 21B | 21C | 21D |
|-----|-----|-----|
| 21E | 21F | 21G |
| 21H | 21I | 21J |

FIG. 21B

| 143 | 19  | 176 | 165 |     |     | 196 |     |     | 13  | 0   | 0   |     |     |     |     |
| --- | --- | --- | --- | --- | --- | --- | --- | --- | --- | --- | --- | --- | --- | --- | --- |
| 18  |     |     | 27  | 3   | 102 | 185 | 17  | 14  | 180 |     | 0   | 0   |     |     |     |
| 126 | 163 |     | 47  | 183 |     |     |     | 132 |     | 1   |     | 0   | 0   |     |     |
|     | 36  | 48  |     | 18  | 111 | 203 | 3   | 191 | 160 | 0   |     |     | 0   |     |     |
| 43  | 27  |     |     |     |     |     |     |     |     |     | 117 |     |     | 0   |     |
| 136 | 49  |     |     |     | 36  |     | 132 |     |     |     | 62  |     |     |     | 0   |
| 7   |     |     |     |     | 34  |     | 198 |     | 168 |     | 12  |     |     |     | 0   |

FIG. 21C

| | | | | | | | | | | | | | |
|---|---|---|---|---|---|---|---|---|---|---|---|---|---|
|  | 163 |  |  | 78 |  | 143 |  |  | 107 |  | 58 |  |  |
| 101 | 177 |  |  |  |  |  |  |  |  | 22 |  |  |  |
|  | 186 |  |  |  |  | 27 |  | 205 | 81 |  |  |  |  |
| 125 | 60 |  |  | 177 | 51 |  |  |  |  |  |  |  |  |
| 39 |  |  |  |  | 29 |  | 35 |  |  |  | 8 |  |  |
|  | 18 | 155 |  |  |  |  |  |  | 49 |  |  |  |  |
| 32 | 53 |  |  |  |  | 95 |  |  |  |  | 186 |  |  |
|  | 91 |  |  | 20 |  |  |  |  | 52 | 109 |  |  |  |
| 174 |  |  |  |  |  |  |  | 108 | 102 |  |  |  |  |
|  | 125 |  |  |  |  |  |  | 31 |  | 54 | 176 |  |  |
|  | 57 |  |  |  | 201 |  |  |  |  | 142 | 35 |  |  |
| 129 |  |  |  |  | 203 | 140 |  |  |  |  |  |  |  |
| 110 | 124 |  |  |  |  |  |  |  | 52 |  |  |  |  |
|  | 196 |  | 35 |  |  |  |  |  |  | 114 |  |  |  |
| 10 |  |  |  |  |  |  | 122 |  |  |  | 23 |  |  |

FIG. 21D

| | 202 | 126 | | | | | | | | | | | | |
|---|---|---|---|---|---|---|---|---|---|---|---|---|---|---|
| 52 | | | 170 | | 13 | | | | | | | | | |
| | 113 | 161 | | | | | 88 | | | | | | | |
| 197 | | | | | 194 | | | | | | | | | |
| | | 164 | | | | 172 | | | | 49 | 161 | | | |
| 168 | | | | | 193 | | | | | | | | | |
| | 14 | 186 | | | 46 | | | | | | | | | |
| 50 | | | | 27 | | | | | | | | | | |
| | | 70 | | | 17 | | 50 | | 6 | | | | | |
| | 115 | | | | | | | | | | 189 | | | |
| 110 | | | | | 0 | | | | | 163 | | | | |
| | | 206 | | | | 97 | | 136 | | | | | | |
| 81 | | | | | | | | | | 29 | 108 | | | |
| | 95 | | | | 207 | | | | 46 | | | | | |
| 82 | | 57 | | | | 48 | | | | | | | | |
| | | | | | | | | 74 | | | 20 | | | |
| | 15 | | | | 42 | | | | 49 | | | | | |
| 47 | | | | | | 96 | | | | 174 | | | | |
| | | 62 | | | | | | 24 | | | 167 | | | |
| | 52 | | | | 18 | | | | 49 | | | | | |

FIG. 22A

| 22B | 22C | 22D |
|---|---|---|
| 22E | 22F | 22G |
| 22H | 22I | 22J |

FIG. 22B

| 232 | 76  | 250 | 10  |     |     | 132 |     |     | 221 | 0   | 0   |     |     |     |     |
|-----|-----|-----|-----|-----|-----|-----|-----|-----|-----|-----|-----|-----|-----|-----|-----|
| 107 |     |     | 126 | 62  | 99  | 50  | 55  | 191 | 232 |     | 0   | 0   |     |     |     |
| 90  | 136 |     | 245 | 64  |     |     |     | 102 |     | 1   |     | 0   | 0   |     |     |
|     | 197 | 224 |     | 243 | 140 | 70  | 179 | 5   | 8   | 0   |     |     | 0   |     |     |
| 64  | 18  |     |     |     |     |     |     |     |     | 247 |     |     |     | 0   |     |
| 154 | 219 |     |     |     | 164 |     | 94  |     |     | 196 |     |     |     |     | 0   |
| 135 |     |     |     |     | 204 |     | 53  |     | 59  | 98  |     |     |     |     |     | 0 |

FIG. 22C

| | | | | | | | | | | | | | |
|---|---|---|---|---|---|---|---|---|---|---|---|---|---|
| | 210 | | | 253 | 103 | | | 110 | 255 | | | | |
| 200 | 222 | | | | | | | | 113 | | | | |
| | 83 | | | | | 18 | | 101 | 108 | | | | |
| 122 | 157 | | | 203 | 107 | | | | | | | | |
| 190 | | | | | 149 | 5 | | | 218 | | | | |
| | 38 | 58 | | | | | | 233 | | | | | |
| 118 | 68 | | | | | 40 | | | 245 | | | | |
| | 68 | | | 67 | | | | 79 | 243 | | | | |
| 14 | | | | | | | 227 | 39 | | | | | |
| | 38 | | | | | 244 | | 16 | 7 | | | | |
| | 114 | | | 156 | | | | 1 | 38 | | | | |
| 167 | | | | | 136 | 204 | | | | | | | |
| 201 | 215 | | | | | | 180 | | | | | | |
| | 75 | | 194 | | | | | 58 | | | | | |
| 217 | | | | | | 37 | | | 246 | | | | |

FIG. 22D

| | 190 | 58 | | | | | | | | | | | | | |
|---|---|---|---|---|---|---|---|---|---|---|---|---|---|---|---|
| 44 | | | 200 | | 147 | | | | | | | | | | |
| | 129 | 241 | | | | | 254 | | | | | | | | |
| 47 | | | | 197 | | | | | | | | | | | |
| | | 121 | | | | 14 | | | | 51 | 18 | | | | |
| | 19 | | | | 208 | | | | | | | | | | |
| | 229 | 191 | | | 155 | | | | | | | | | | |
| 197 | | | 138 | | | | | | | | | | | | |
| | | 104 | | 95 | 50 | 234 | | | | | | | | | |
| | 57 | | | | | | | | 233 | | | | | | |
| 218 | | | | 21 | | | | 61 | | | | | | | |
| | | 247 | | | 237 | | 45 | | | | | | | | |
| 196 | | | | | | | | 171 | 212 | | | | | | |
| | 254 | | | 72 | | | 150 | | | | | | | | |
| 212 | | 226 | | | 188 | | | | | | | | | | |
| | | | | | | | 204 | | 219 | | | | | | |
| | 214 | | 175 | | | 77 | | | | | | | | | |
| 47 | | | | 195 | | | 245 | | | | | | | | |
| | | 24 | | | | 81 | | 134 | | | | | | | |
| | 40 | | | 6 | | | | 112 | | | | | | | |

FIG. 23A

| 23B | 23C | 23D |
|-----|-----|-----|
| 23E | 23F | 23G |
| 23H | 23I | 23J |

FIG. 23B

| 156 | 143 | 14 | 3 | | | 40 | | | 123 | 0 | 0 | | | | |
|---|---|---|---|---|---|---|---|---|---|---|---|---|---|---|---|
| 17 | | | 65 | 63 | 1 | 55 | 37 | 171 | 133 | | 0 | 0 | | | |
| 98 | 168 | | 107 | 82 | | | | 142 | | 1 | | 0 | 0 | | |
| | 53 | 174 | | 174 | 127 | 17 | 89 | 17 | 105 | 0 | | | 0 | | |
| 86 | 67 | | | | | | | | | | 83 | | | 0 | |
| 79 | 84 | | | | 35 | | 103 | | | | 60 | | | | 0 |
| 47 | | | | | 154 | | 10 | | 155 | | 29 | | | | 0 |

FIG. 23C

| | 48 | | | 125 | 24 | | | 47 | 55 | | | | | |
|---|---|---|---|---|---|---|---|---|---|---|---|---|---|---|
| 53 | 31 | | | | | | | | 161 | | | | | |
| | 104 | | | | 142 | | 99 | 64 | | | | | | |
| 111 | 25 | | | 174 | 23 | | | | | | | | | |
| 91 | | | | 175 | | 24 | | | 141 | | | | | |
| | 122 | 11 | | | | | | 4 | | | | | | |
| 29 | 91 | | | | 27 | | | | 127 | | | | | |
| | 11 | | 145 | | | | 8 | 166 | | | | | | |
| 137 | | | | | | 103 | 40 | | | | | | | |
| | 78 | | | | | 158 | 17 | 165 | | | | | | |
| | 134 | | 23 | | | | 62 | 163 | | | | | | |
| 173 | | | | 31 | 22 | | | | | | | | | |
| 13 | 135 | | | | | | 145 | | | | | | | |
| | 128 | 52 | | | | | 173 | | | | | | | |
| 156 | | | | | 166 | | 40 | | | | | | | |

FIG. 23D

| | 18 | 163 | | | | | | | | | | | | | |
|---|---|---|---|---|---|---|---|---|---|---|---|---|---|---|---|
| 110 | | | 132 | | 150 | | | | | | | | | | |
| | 113 | 108 | | | | | | 61 | | | | | | | |
| 72 | | | | | 136 | | | | | | | | | | |
| | | 36 | | | | | 38 | | | | 53 | 145 | | | |
| 42 | | | | | 104 | | | | | | | | | | |
| | 64 | 24 | | | 149 | | | | | | | | | | |
| 139 | | | | 161 | | | | | | | | | | | |
| | | 84 | | | 173 | | 93 | | 29 | | | | | | |
| | 117 | | | | | | | | | | | 148 | | | |
| 116 | | | | | 73 | | | | | | 142 | | | | |
| | | 105 | | | | | 137 | | | 29 | | | | | |
| 11 | | | | | | | | | | | 41 | 162 | | | |
| | 126 | | | | 152 | | | | | 172 | | | | | |
| 73 | | 154 | | | | | 129 | | | | | | | | |
| | | | | | | | | | 167 | | | 38 | | | |
| | 112 | | | | 7 | | | | | 19 | | | | | |
| 109 | | | | | | | 6 | | | | 105 | | | | |
| | | 160 | | | | | | | 156 | | | 82 | | | |
| | 132 | | | | 6 | | | | | 8 | | | | | |

FIG. 24A

| 24B | 24C | 24D |
|-----|-----|-----|
| 24E | 24F | 24G |
| 24H | 24I | 24J |

FIG. 24B

| 195 | 175 | 31  | 165 |     |     | 92  |     |     | 203 | 0   | 0   |     |     |     |     |
|-----|-----|-----|-----|-----|-----|-----|-----|-----|-----|-----|-----|-----|-----|-----|-----|
| 18  |     |     | 131 | 152 | 206 | 81  | 174 | 165 | 171 |     | 0   | 0   |     |     |     |
| 126 | 59  |     | 99  | 72  |     |     |     | 39  |     | 1   |     | 0   | 0   |     |     |
|     | 36  | 215 |     | 63  | 59  | 99  | 4   | 114 | 173 | 0   |     |     | 0   |     |     |
| 147 | 27  |     |     |     |     |     |     |     |     |     | 13  |     |     | 0   |     |
| 84  | 101 |     |     |     | 140 |     | 133 |     |     |     | 114 |     |     |     | 0   |
| 111 |     |     |     |     | 86  |     | 43  |     | 81  |     | 64  |     |     |     |     | 0 |

FIG. 24C

| | 7 | | | 130 | | 144 | | | | 3 | | 6 | | | |
|---|---|---|---|---|---|---|---|---|---|---|---|---|---|---|---|
| 49 | 125 | | | | | | | | | | 22 | | | | |
| | 186 | | | | | | 75 | | 205 | 81 | | | | | |
| 177 | 60 | | | | 21 | 156 | | | | | | | | | |
| 195 | | | | | | 82 | | 185 | | | 164 | | | | |
| | 206 | | 83 | | | | | | | 81 | | | | | |
| 84 | 1 | | | | | | 53 | | | | 134 | | | | |
| | 39 | | | | | 176 | | | | 104 | 5 | | | | |
| 122 | | | | | | | | | 4 | 154 | | | | | |
| | 125 | | | | | | | 9 | 106 | 176 | | | | | |
| | 57 | | | 201 | | | | | 194 | 35 | | | | | |
| 77 | | | | | 47 | 141 | | | | | | | | | |
| 58 | 72 | | | | | | | 0 | | | | | | | |
| | 144 | | 184 | | | | | | 166 | | | | | | |
| 10 | | | | | | 135 | | | | 127 | | | | | |

FIG. 24D

| | 98 | 189 | | | | | | | | | | | | | |
|---|---|---|---|---|---|---|---|---|---|---|---|---|---|---|---|
| 156 | | | 118 | | 65 | | | | | | | | | | |
| | 36 | 43 | | | | | | 11 | | | | | | | |
| 145 | | | | | 38 | | | | | | | | | | |
| | | 123 | | | | | 17 | | | | | 101 | 5 | | |
| 168 | | | | | | 89 | | | | | | | | | |
| | 118 | 197 | | | 202 | | | | | | | | | | |
| 102 | | | | 72 | | | | | | | | | | | |
| | | 133 | | | 17 | | 207 | | 163 | | | | | | |
| | 11 | | | | | | | | | | | 33 | | | |
| 162 | | | | | 156 | | | | | | | 59 | | | |
| | | 70 | | | | | 70 | | | 179 | | | | | |
| 41 | | | | | | | | | | | | 128 | 17 | | |
| | 7 | | | | 175 | | | | | 75 | | | | | |
| 187 | | 167 | | | | | 77 | | | | | | | | |
| | | | | | | | | | 81 | | | 122 | | | |
| | 168 | | | | 78 | | | | | 109 | | | | | |
| 26 | | | | | | | 126 | | | | | 87 | | | |
| | | 66 | | | | | | | 34 | | | 207 | | | |
| | | 114 | | | 161 | | | | | 189 | | | | | |

FIG. 25A

| 25B | 25C | 25D |
|-----|-----|-----|
| 25E | 25F | 25G |
| 25H | 25I | 25J |

FIG. 25B

| 195 | 175 | 20  | 165 |     |     | 92  |     |     | 203 | 0   | 0   |     |     |     |     |
|-----|-----|-----|-----|-----|-----|-----|-----|-----|-----|-----|-----|-----|-----|-----|-----|
| 18  |     |     | 131 | 159 | 206 | 81  | 121 | 165 | 171 |     | 0   | 0   |     |     |     |
| 126 | 59  |     | 99  | 79  |     |     |     | 39  |     | 1   |     | 0   | 0   |     |     |
|     | 36  | 204 |     | 70  | 59  | 99  | 159 | 114 | 173 | 0   |     |     | 0   |     |     |
| 147 | 27  |     |     |     |     |     |     |     |     |     | 13  |     |     | 0   |     |
| 84  | 101 |     |     |     | 140 |     | 80  |     |     |     | 114 |     |     |     | 0   |
| 111 |     |     |     |     | 86  |     | 198 |     | 81  |     | 64  |     |     |     |     | 0 |

FIG. 25C

|   | 7 |   |   | 130 |   | 91 |   |   | 3 |   | 6 |   |   |   |   |
|---|---|---|---|---|---|---|---|---|---|---|---|---|---|---|---|
| 49 | 125 |   |   |   |   |   |   |   |   | 22 |   |   |   |   |   |
|   | 186 |   |   |   |   | 75 |   | 205 | 81 |   |   |   |   |   |   |
| 177 | 60 |   |   | 21 | 103 |   |   |   |   |   |   |   |   |   |   |
| 195 |   |   |   |   | 29 |   | 185 |   |   | 164 |   |   |   |   |   |
|   | 174 |   | 51 |   |   |   |   |   | 49 |   |   |   |   |   |   |
| 84 | 1 |   |   |   |   | 53 |   |   |   | 134 |   |   |   |   |   |
|   | 39 |   |   | 176 |   |   |   | 104 | 5 |   |   |   |   |   |   |
| 122 |   |   |   |   |   |   |   | 4 | 154 |   |   |   |   |   |   |
|   | 125 |   |   |   |   |   | 9 | 106 | 176 |   |   |   |   |   |   |
|   | 57 |   |   | 201 |   |   |   | 194 | 35 |   |   |   |   |   |   |
| 77 |   |   |   |   | 47 | 88 |   |   |   |   |   |   |   |   |   |
| 58 | 72 |   |   |   |   |   |   | 0 |   |   |   |   |   |   |   |
|   | 144 |   | 191 |   |   |   |   |   | 166 |   |   |   |   |   |   |
| 10 |   |   |   |   |   | 135 |   |   |   | 127 |   |   |   |   |   |

FIG. 25D

| 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|
|  | 98 | 178 |  |  |  |  |  |  |  |  |  |  |  |  |  |  |
| 156 |  |  | 118 |  | 65 |  |  |  |  |  |  |  |  |  |  |  |
|  | 61 | 57 |  |  |  |  |  | 36 |  |  |  |  |  |  |  |  |
| 145 |  |  |  | 38 |  |  |  |  |  |  |  |  |  |  |  |  |
|  |  | 112 |  |  |  | 172 |  |  |  | 101 | 5 |  |  |  |  |  |
| 168 |  |  |  |  | 89 |  |  |  |  |  |  |  |  |  |  |  |
|  | 118 | 186 |  |  | 202 |  |  |  |  |  |  |  |  |  |  |  |
| 102 |  |  |  | 79 |  |  |  |  |  |  |  |  |  |  |  |  |
|  |  | 122 |  |  | 17 |  | 154 | 163 |  |  |  |  |  |  |  |  |
|  | 11 |  |  |  |  |  |  |  |  | 33 |  |  |  |  |  |  |
| 162 |  |  |  | 156 |  |  |  |  |  | 59 |  |  |  |  |  |  |
|  |  | 163 |  |  |  | 173 |  | 179 |  |  |  |  |  |  |  |  |
| 197 |  |  |  |  |  |  |  |  |  | 191 | 193 |  |  |  |  |  |
|  | 157 |  |  | 167 |  |  |  |  | 181 |  |  |  |  |  |  |  |
| 197 |  | 167 |  |  |  | 179 |  |  |  |  |  |  |  |  |  |  |
|  |  |  |  |  |  |  |  | 181 |  | 193 |  |  |  |  |  |  |
|  | 157 |  |  | 173 |  |  |  |  | 191 |  |  |  |  |  |  |  |
| 181 |  |  |  |  |  | 157 |  |  | 173 |  |  |  |  |  |  |  |
|  |  | 193 |  |  |  |  |  | 163 |  | 179 |  |  |  |  |  |  |
|  | 191 |  |  | 197 |  |  |  | 167 |  |  |  |  |  |  |  |  |

FIG. 26A $$\mathbf{H} = \begin{bmatrix} \ddots & & \square & & \square & \iddots \\ & \square & P^{a_{ij}^{(1)}} + P^{a_{ij}^{(2)}} & \square & \square \\ & \square & & & \square & \square \\ \iddots & & \square & & \square & \ddots \end{bmatrix}$$

FIG. 26B $$E(\mathbf{H}) = \begin{bmatrix} \ddots & \square & & \square & \cdots \\ \square & \left(a_{ij}^{(1)}, a_{ij}^{(2)}\right) & & \square & \square \\ \square & & & \square & \square \\ \cdots & \square & & \square & \ddots \end{bmatrix},$$

METHOD AND APPARATUS FOR CHANNEL ENCODING AND DECODING IN COMMUNICATION OR BROADCASTING SYSTEM

CROSS-REFERENCE TO RELATED APPLICATION(S)

This is application is a continuation application of prior application Ser. No. 17/979,289, filed on Nov. 2, 2022, which will be issued as U.S. Pat. No. 11,722,247 on Aug. 8, 2023; which is a continuation application Ser. No. 17/409,054, filed on Aug. 23, 2021, which has issued as U.S. Pat. No. 11,502,781 on Nov. 15, 2022; which is a continuation application of Ser. No. 16/845,726, filed on Apr. 10, 2020, which has issued as U.S. Pat. No. 11,101,926 on Aug. 24, 2021; which is a continuation application of Ser. No. 16/016,013, filed on Jun. 22, 2018, which has issued as U.S. Pat. No. 10,623,139 on Apr. 14, 2020; and is based on and claims priority under 35 U.S.C. § 119(a) of a Korean patent application number 10-2017-0079497, filed on Jun. 23, 2017, in the Korean Intellectual Property Office, of a Korean patent application number 10-2017-0080773, filed on Jun. 26, 2017, in the Korean Intellectual Property Office, and of a Korean patent application number 10-2017-0151743, filed on Nov. 14, 2017, in the Korean Intellectual Property Office, the disclosure of each of which is incorporated by reference herein in its entirety.

BACKGROUND

1. Field

The disclosure relates to a method and an apparatus for channel encoding and decoding in a communication or broadcasting system. More particularly, the present disclosure relates to low density parity check (LDPC) encoding/decoding methods and apparatuses capable of supporting various input lengths and coding rates.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In communication or broadcasting systems, the link performance may be degraded significantly due to various noises of a channel, fading phenomena, and inter-symbol interference (ISI). Therefore, in order to realize high-speed digital communication or broadcasting systems, such as next generation mobile communication, digital broadcasting, and mobile Internet, that require high data throughput and reliability, it is required to develop techniques for overcoming noises, fading, and ISI. As one of such techniques, an error-correcting code capable of efficiently restoring the distortion of information and improving the reliability of communication has been studied in these days.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide low density parity check (LDPC) encoding/decoding methods and apparatuses capable of supporting various input lengths and coding rates.

Another aspect of the disclosure is to provide an LDPC code design method, together with encoding/decoding methods and related apparatuses, suitable for a case where an information word has a short length of about 100 bits or less and a coding rate is predetermined.

Additional aspects will be set forth in part in the description which follows and, in part, will be apparent from the description, or may be learned by practice of the presented embodiments.

The disclosure proposes a method for designing an LDPC code capable of supporting various lengths and coding rates by simultaneously considering a lifting technique and a trapping set characteristic.

The disclosure proposes a method for designing a dedicated LDPC code suitable for a case where the number of information word bits is small and a coding rate is fixed.

In accordance with an aspect of the disclosure, a channel encoding method of a transmitter in a communication system is provided. The channel encoding method includes identifying a block size (Z) and a shift value sequence, and performing LDPC encoding on a bit sequence of a code block based on the block size and the shift value sequence, and transmitting encoded bit sequence to a receiver, wherein the shift value sequence associated with circular shift values of a block is predetermined, and wherein the block is a permutation matrix of size Z×Z.

In accordance with another aspect of the disclosure, a channel decoding method of a receiver in a communication system is provided. The channel decoding method includes identifying a block size (Z) and a shift value sequence, and performing LDPC decoding on a demodulated received signal based on the block size (Z) and the shift value sequence, wherein the shift value sequence associated with circular shift values of a block is predetermined, and wherein the block is a permutation matrix of size Z×Z.

In accordance with another aspect of the disclosure, a transmitter in a communication system is provided. The transmitter includes a transceiver, and at least one processor coupled with the transceiver and configured to control to identify a block size (Z) and a shift value sequence, perform LDPC encoding on a bit sequence of a code block based on the block size and the shift value sequence, and transmit encoded bit sequence to a receiver, wherein the shift value sequence associated with circular shift values of a block is predetermined, and wherein the block is a permutation matrix of size Z×Z.

In accordance with another aspect of the disclosure, a receiver in a communication system is provided. The receiver includes a transceiver, and at least one processor coupled with the transceiver and configured to control to identify a block size (Z) and a shift value sequence, and perform LDPC decoding on a demodulated received signal based on the block size (Z) and the shift value sequence, wherein the shift value sequence associated with circular shift values of a block is predetermined, and wherein the block is a permutation matrix of size Z×Z.

According to various embodiments of the disclosure, it is possible to support efficiently LDPC codes with respect to variable lengths and variable rates.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 19A, 19B, 19C, 19D, 19E, 19F, 19G, 19H, 19I, and 19J are diagrams illustrating an LDPC code base matrix according to various embodiments of the disclosure;

FIGS. 20A, 20B, 20C, 20D, 20E, 20F, 20G, 20H, 20I, and 20J are diagrams illustrating an LDPC code exponential matrix according to various embodiments of the disclosure;

FIGS. 21A, 21B, 21C, and 21D are diagrams illustrating an LDPC code exponential matrix according to various embodiments of the disclosure;

FIGS. 22A, 22B, 22C, and 22D are diagrams illustrating an LDPC code exponential matrix according to various embodiments of the disclosure;

FIGS. 23A, 23B, 23C, and 23D are diagrams illustrating an LDPC code exponential matrix according to various embodiments of the disclosure;

FIGS. 24A, 24B, 24C, and 24D are diagrams illustrating an LDPC code exponential matrix according to various embodiments of the disclosure;

Figure 25A:
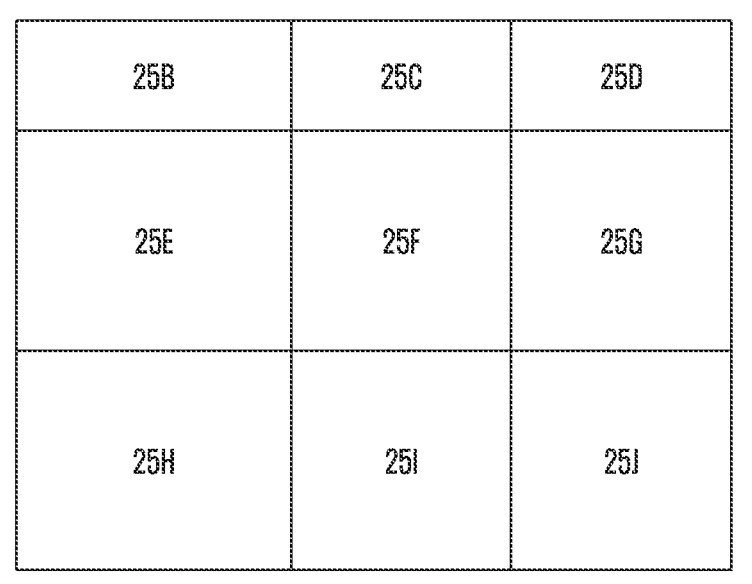

FIGS. 25A, 25B, 25C, and 25D are diagrams illustrating an LDPC code exponential matrix according to various embodiments of the disclosure; and FIGS. 26A and 26B are diagrams illustrating an LDPC code exponential matrix according to various embodiments of the disclosure.

Throughout the drawings, it should be noted that like reference numbers are used to depict the same or similar elements, features, and structures.

DETAILED DESCRIPTION

Figure 1:
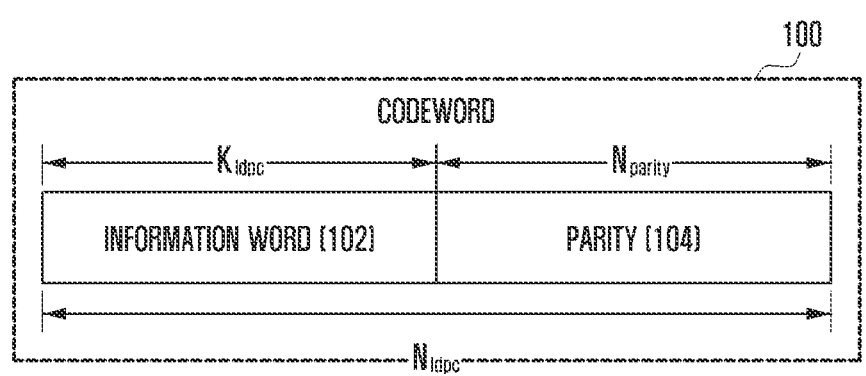
FIG. 1 is a diagram illustrating a structure of a systematic low density parity check (LDPC) codeword according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The advantages and features of the disclosure and the manner of achieving them will become apparent with reference to various embodiments to be described below with reference to the accompanying drawings. The disclosure may, however, be embodied in many different forms and should not be construed as limited to various embodiments set forth herein. Rather, these embodiments are provided to fully convey the subject matter of this disclosure to those skilled in the art. Like reference numerals refer to like elements throughout this disclosure.

A low density parity check (LDPC) code, first introduced by Gallager in the 1960s, has been long forgotten due to the complexity of implementation. However, as a turbo code proposed by Berrou, Glavieux, and Thitimajshima in 1993 showed performance close to the channel capacity of Shannon, many interpretations about the performance and characteristics of the turbo code were made, and also many studies of channel encoding based on iterative decoding and graph were performed. Motivated by this, the LDPC code was studied again in the late 1990s. As a result, it was found that the LDCP code as well has performance close to the channel capacity of Shannon when iterative decoding based on a sum-product algorithm is applied on the Tanner graph corresponding to the LDPC code.

In general, the LDPC code is defined as a parity-check matrix and may be represented using a bipartite graph, which is commonly referred to as a Tanner graph.

FIG. 1 is a diagram illustrating a structure of a systematic LDPC codeword according to an embodiment of the disclosure.

Referring to FIG. 1, LDPC encoding is performed on input of an information word 102 including Kldpc bits or symbols, so that a codeword 100 including Nldpc bits or symbols is generated. Hereinafter, for convenience of explanation, it is assumed that the codeword 100 including Nldpc bits is generated by receiving the information word 102 including Kldpc bits. For example, when the information word 102 of Kldpc input bits, $I=[i_0, i_1, i_2, \ldots i_{K_{ldpc}-1}]$, is subjected to LDPC encoding, the codeword 100, $c=[c_0, c_1, c_2, \ldots, c_{N_{ldpc}-1}]$, is generated. For example, each of the information word and the codeword is a bit string including a plurality of bits, and thus an information word bit or a codeword bit means each bit constituting the information word or the codeword. Typically, when a codeword includes an information word, i.e., $C=[c_0, c_1, c_2, \ldots, c_{N_{ldpc}-1}]=[i_0, i_1, i_2, \ldots i_{K_{ldpc}-1}, p_0, p_1, p_2, \ldots, p_{N_{ldpc}K_{ldpc}-1}]$, this referred to as a systematic code. Here, $P=[p_0, p_1, p_2, \ldots p_{N_{ldpc}K_{ldpc}-1}]$ is parity bits 104, and the number of parity bits may be represented as $N_{parity}=N_{ldpc}-K_{ldpc}$.

The LDPC code is a type of linear block code and includes a process of determining a codeword that satisfies the following Equation 1.

$$H \cdot c^T = \begin{bmatrix} h_1 & h_2 & h_3 & \ldots & h_{N_{ldpc}-1} \end{bmatrix} \cdot c^T = \sum_{i=0}^{N_{ldpc}} c_i \cdot h_i = 0 \quad \text{Equation 1}$$

Here, $c=[c_0, c_1, c_2, \ldots c_{N_{ldpc}-1}]$.

In Equation 1, H denotes a parity check matrix, C denotes a codeword, $c_i$ denotes the i-th bit of a codeword, and Nldpc denotes an LDPC codeword length. Here, hi denotes the i-th column of the parity check matrix H.

The parity check matrix H is including $N_{ldpc}$, columns equal to the number of bits of the LDPC codeword. Equation 1 means that the sum of products of the i-th column $h_i$ of the parity check matrix and the i-th codeword bit $c_i$ is zero, thus meaning that the i-th column hi is related to the i-th codeword bit $c_i$.

Now, a graphical representation method of an LDPC code will be described with reference to FIG. 2.

Figure 2:
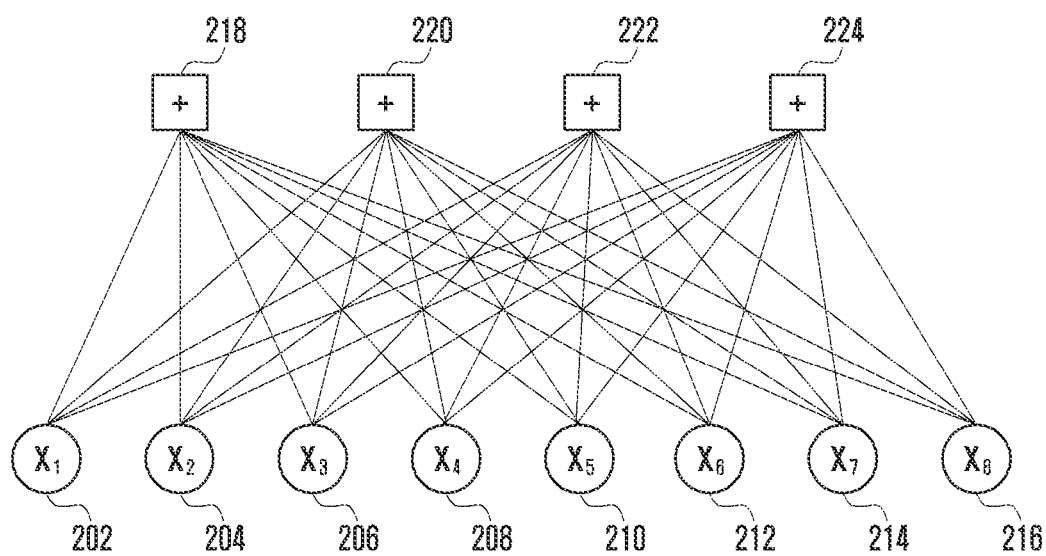
FIG. 2 is a diagram illustrating a graph representation method of an LDPC code according to an embodiment of the disclosure.

FIG. 2 illustrates a parity check matrix $H_1$ of an LDPC code, including four rows and eight columns, and a Tanner graph thereof according to an embodiment of the disclosure.

Referring to FIG. 2, the parity check matrix $H_1$ having eight columns generates a codeword having a length of 8. A code generated through $H_1$ means an LDPC code, and each column corresponds to encoded 8 bits.

Referring to FIG. 2, the Tanner graph of the LDPC code for encoding and decoding based on the parity check matrix $H_1$ includes eight variable nodes, i.e., x1 202, x2 204, x3 206, x4 208, x5 210, x6 212, x7 214, and x8 216, and four check nodes 218, 220, 222, and 224. Here, the i-th column and the j-th row of the parity check matrix $H_1$ of the LDPC code correspond to the variable node xi and the j-th check node, respectively. The value of 1, that is, a value other than 0, at the intersection of the i-th column and the j-th row in the parity check matrix $H_1$ of the LDPC code means that there is an edge (or referred to as a segment) connecting the variable node xi and the j-th check node in the Tanner graph.

Figure 3A:
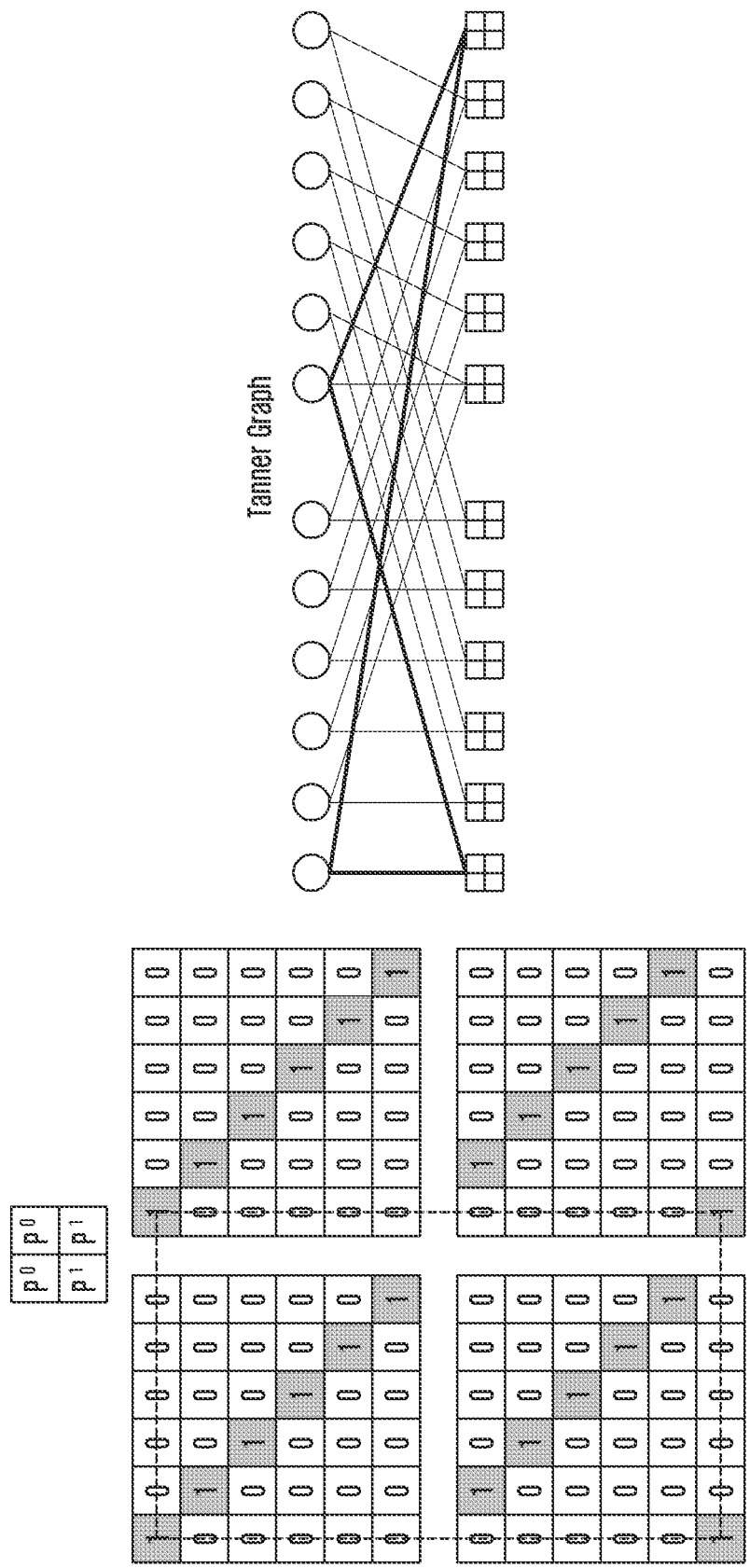
FIGS. 3A and 3B are diagrams illustrating cycle characteristics of a quasi-cyclic low density parity code (QC-LDPC) code according to various embodiments of the disclosure.
Figure 3B:
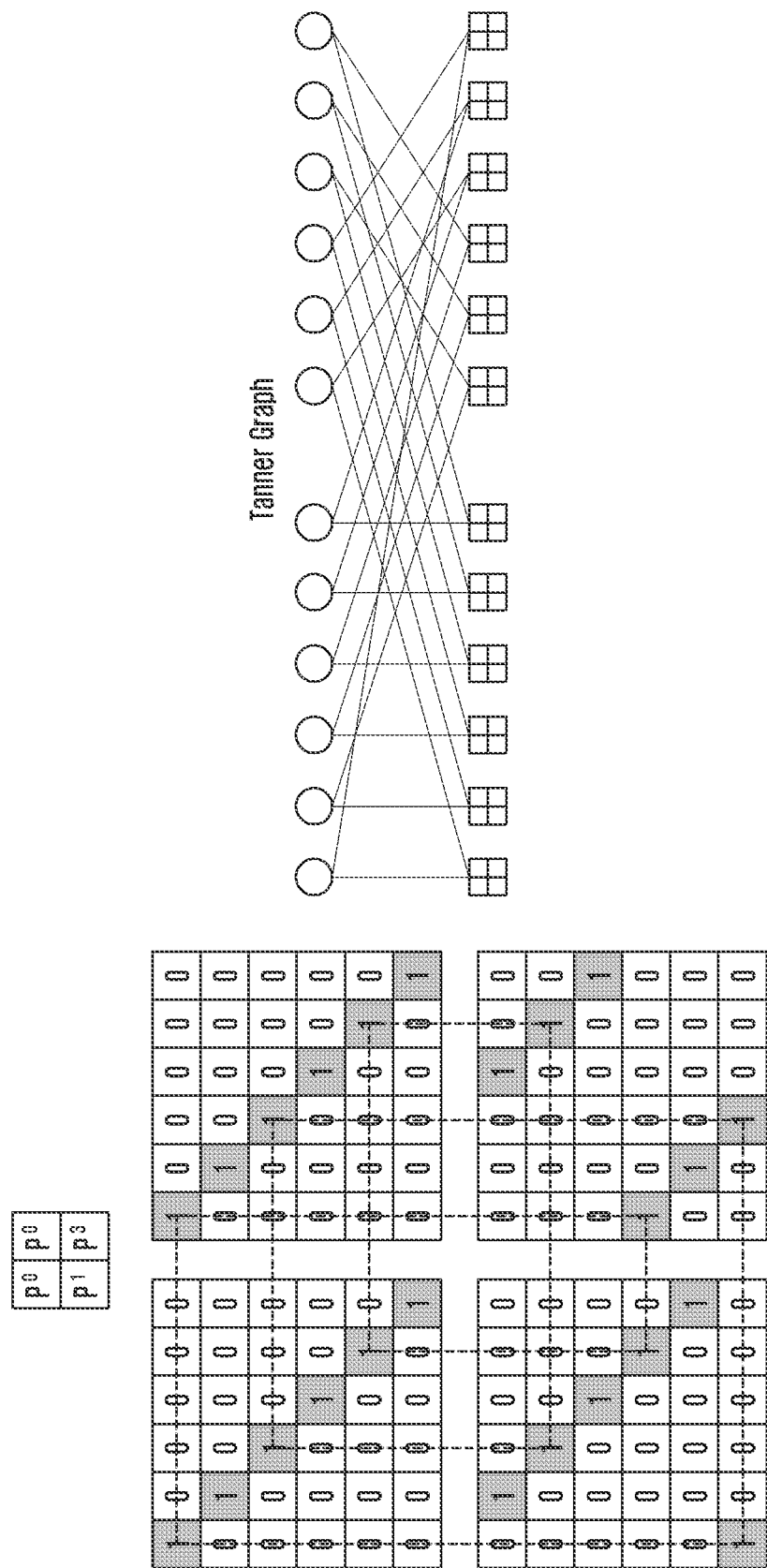

FIGS. 3A and 3B are diagrams illustrating cycle characteristics of a quasi-cyclic low density parity code (QC-LDPC) code according to various embodiments of the disclosure.

Referring to FIGS. 3A and 3B, in the Tanner graph of the LDPC code, the degree of each of the variable node and the check node means the number of edges connected to each node, and this is equal to the number of non-zero entries (or referred to as non-zero elements) in the column or row corresponding to a relevant node in the parity check matrix of the LDPC code. For example, in FIG. 2, the degrees of the variable nodes 202, 204, 206, 208, 210, 212, 214, and 216 are 4, 3, 3, 3, 2, 2, 2, and 2, respectively, and the degrees of the check nodes 218, 220, 222, and 224 are 6, 5, 5, and 5, respectively. In addition, in FIG. 2, the numbers of non-zero entries in the respective columns of the parity check matrix $H_1$ corresponding to the variable nodes are equal to the above degrees 4, 3, 3, 3, 2, 2, 2, and 2, respectively, and the numbers of non-zero entries in the respective rows of the parity check matrix $H_1$ corresponding to the check nodes are equal to the above degrees 6, 5, 5, and 5, respectively.

The LDPC code may be decoded using an iterative decoding algorithm based on a sum-product algorithm on the bipartite graph shown in FIG. 2. Here, the sum-product algorithm is a kind of message passing algorithm, which indicates an algorithm for exchanging messages through an edge on the bipartite graph and performing update by calculating an output message from messages inputted to the variable node or the check node.

Here, the value of the i-th encoded bit may be determined, based on a message of the i-th variable node. The value of the i-th encoded bit is available for both a hard decision and a soft decision. Therefore, the performance of the i-th bit ci of the LDPC codeword corresponds to the performance of the i-th variable node of the Tanner graph, and this may be determined according to the position and number of 1s in the i-th column of the parity check matrix. For example, the performance of the $N_{ldpc}$ codeword bits of the codeword may depend on the position and number of 1s of the parity check matrix. This means that the performance of the LDPC code is greatly affected by the parity check matrix. Therefore, a method for designing a good parity check matrix is needed to design the LDPC code with excellent performance.

In the communication or broadcasting systems, a quasi-cyclic LDPC code (QC-LDPC code) using a parity check matrix of a quasi-cyclic form is used typically for easy implementation.

The QC-LDPC code is characterized by having a parity check matrix including zero matrices or circulant permutation matrices, which have a small square matrix form. Here, the permutation matrix means a matrix in which each row or column contains only single entry of 1 and the other entries of 0. The circulant permutation matrix means a matrix obtained by circularly shifting all entries of the identity matrix to the right.

Hereinafter, the QC-LDPC code will be described.

First, a circulant permutation matrix, $P=(P_{ij})$, having a size of L×L is defined as shown in Equation 2. Here, Pij (0≤i, j<L) denotes an entry (or referred to as an element) of the i-th row and the j-th column in the matrix P.

$$P_{i,j} = \begin{cases} 1 & \text{if } i+1 \equiv j \bmod L \\ 0 & \text{otherwise} \end{cases} \quad \text{Equation 2}$$

With respect to the permutation matrix P defined as above, Pi (0≤i<L) is a circulant permutation matrix obtained by circularly shifting respective entries of the identity matrix having a size of L×L rightward by i times.

A parity check matrix H of the simplest QC-LDPC code may be represented in the form of the following Equation 3.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{Equation 3}$$

If $P_i$ is defined as a zero matrix having a size of L×L, each exponent $a_{ij}$ of the circulant permutation matrix or the zero matrix in Equation 3 has one of values {−1, 0, 1, 2, ..., L−1}. In addition, the parity check matrix H of Equation 3 has a size of mL×nL because of having n column blocks and m row blocks.

If the parity check matrix of Equation 3 has a full rank, the size of information word bits of a QC-LDPC code corresponding to the parity check matrix becomes (n−m)×L. For convenience, (n−m) column blocks corresponding to information word bits are referred to as information word column blocks, and m column blocks corresponding to the remaining parity bits are referred to as parity column blocks.

Normally, a binary matrix having a size of m×n obtained by replacing the circulant permutation matrix and the zero matrix by 1 and 0, respectively, in the parity check matrix of Equation 3 is referred to as a mother matrix or base matrix M(H) of the parity check matrix H. In addition, an integer matrix having a size of m×n obtained as shown in Equation 4 by selecting exponents of the circulant permutation matrix and the zero matrix is referred to as an exponential matrix E(H) of the parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{Equation 4}$$

As a result, one integer included in the exponential matrix corresponds to the circulant permutation matrix in the parity check matrix, so that the exponential matrix may be represented as an integer sequence for convenience. This sequence will be referred as an LDPC sequence or an LDPC code sequence to distinguish it from another sequence. In general, the parity check matrix may be represented not only as the exponential matrix but also as a sequence having the same characteristics algebraically. In this disclosure, the parity check matrix is represented as an exponential matrix or a sequence that indicates the positions of 1s in the parity check matrix. However, because there are various sequence notation methods for distinguishing the positions of 1s or 0s included in the parity check matrix, it is possible to alternatively represent a variety of sequence forms that exhibit the same effect algebraically.

FIGS. 26A and 26B are diagrams illustrating an LDPC code exponential matrix according to various embodiments of the disclosure.

Referring to FIGS. 26A and 26B, a transmitting/receiving apparatus of a device may directly generate the parity check matrix to perform LDPC encoding and decoding. However, depending on characteristics of implementation, the LDPC encoding and decoding may be performed using the exponential matrix or sequence having the same algebraic effect as the parity check matrix has. Therefore, although the encoding and decoding using the parity check matrix are described for convenience in this disclosure, the disclosure may be implemented actually in a device through various methods capable of achieving the same effect as the parity check matrix does.

For reference, the same algebraic effect means that two or more different representations are completely identical or converted to each other logically or mathematically.

Although described in this disclosure is only a case where the circulant permutation matrix corresponding to one block is single, the disclosure may be equally applied to another case where a plurality of circulant permutation matrices are included in one block. For example, when the sum of two circulant permutation matrices $P^{a_{ij}^{(1)}}$, $P^{a_{ij}^{(2)}}$ is included in one position of the i-th row block and the j-th column block as shown in FIG. 26A, the exponential matrix may be expressed as shown in FIG. 26B. As seen in FIG. 26B, two integers are contained in a position of the i-th row and the j-th column that correspond to the above position containing the sum of circulant permutation matrices.

Although the QC-LDPC code normally allows a plurality of circulant permutation matrices to correspond to one row/column block in the parity check matrix as described above, the disclosure will describe only a case where one circulant permutation matrix corresponds to one block. This, however, is not to be construed as a limitation. For reference, a matrix having a size of L×L in which a plurality of circulant permutation matrices are overlapped in one row/column block is referred to as a circulant matrix or circulant.

Meanwhile, a mother matrix or a base matrix for the parity check matrix and the exponential matrix of FIGS. 26A and 26B means a binary matrix obtained by replacing the circulant permutation matrix and the zero matrix by 1 and 0, respectively, similarly to the definition used in Equation 3.

In addition, the sum of a plurality of circulant permutation matrices included in one block (i.e., a circulant matrix) is replaced simply by 1.

Because the performance of the LDPC code is determined according to the parity check matrix, it is necessary to design the parity check matrix for the LDPC code having excellent performance. In addition, there is a need for an LDPC encoding or decoding method capable of supporting various input lengths and coding rates.

Lifting refers to a method used not only for efficiently designing the QC-LDPC code but also for generating the parity check matrices or LDPC codewords of various lengths from a given exponential matrix. For example, the lifting may be applied to efficiently design a very large parity check matrix by setting an L value that determines the size of the circulant permutation matrix or the zero matrix from a given small mother matrix according to a specific rule, or is used to generate the parity check matrices or LDPC codewords having various lengths by applying an appropriate L value to a given exponential matrix or corresponding sequence.

A typical lifting method and the characteristics of the QC-LDPC code designed through lifting are hereinafter described with reference to the following reference [Myung2006]:

REFERENCE [MYUNG2006]

S. Myung, K. Yang, and Y. Kim, "Lifting Methods for Quasi-Cyclic LDPC Codes", IEEE Communications Letters. vol. 10, pp. 489-491, June 2006.

When an LDPC code C0 is given, it is assumed that S QC-LDPC codes to be designed through the lifting method are $C_1, \ldots, C_S$, and that the size of a row block and a column block of a parity check matrix of each QC-LDPC code has a value of $L_k$. Here, $C_0$ corresponds to the smallest LDPC code having a mother matrix of $C_1, \ldots, C_S$ codes as a parity check matrix, and a value of $L_0$ corresponding to the size of a row block and a column block is 1. In addition, a parity check matrix $H_k$ of each code $C_k$ has an exponential matrix $E(H_k)=(e_{i,j}^{(k)})$ of a size m×n, and each exponent $e_{i,j}^{(k)}$ is selected as one of values $\{-1, 0, 1, 2, \ldots, L_k-1\}$.

The typical lifting method consists of operations $C_0 \to C_1 \to \ldots \to C_S$ and has characteristics that satisfy a condition $L_{k+1}=q_{k+1}L_k$ ($q_{k+1}$ is a positive integer, k=0, 1, ..., S-1). If only a parity check matrix $H_S$ of $C_S$ is stored according to the characteristics of the lifting process, all the QC-LDPC codes $C_0, C_1, \ldots, C_S$ can be represented using the following Equation 5 according to the lifting method.

$$E(H_k) \equiv \left\lfloor \frac{L_k}{L_S} E(H_S) \right\rfloor \text{ or} \quad \text{Equation 5}$$

$$E(H_k) \equiv E(H_S) \bmod L_k \quad \text{Equation 6}$$

Not only a method of designing large QC-LDPC codes $C_1, \ldots, C_S$ from $C_0$ but also a method of designing small codes $C_i$ (i=k-1, k-2, ..., 1, 0) from a large code $C_k$ by using a suitable technique, such as Equation 5 or 6 is called lifting.

According to the lifting method of Equation 5 or 6, the $L_k$ corresponding to the size of row block or column block in the parity check matrix of each QC-LDPC code $C_k$ has a multiple relation with each other, and also an exponential matrix is selected by a specific manner. The typical lifting method improves the algebraic or graph characteristics of each parity check matrix designed through lifting, thus allowing an easy design of the QC-LDPC code with an improved error floor feature.

However, because respective $L_k$ values are in a multiple relation, there is a disadvantage that the length of each code is greatly limited. For example, when it is assumed that the minimum lifting scheme, such as $L_{k+1}=2\times L_k$ is applied to each $L_k$ value, the size of a parity check matrix of each QC-LDPC code may have only a size of $2^k m \times 2^k n$. For example, when the lifting is applied in 10 operations (S=10), ten sizes of a parity check matrix may be generated. This means that it is possible to support the QC-LDPC codes having ten kinds of lengths.

For this reason, the typical lifting method is somewhat disadvantageous in designing the QC-LDPC code that supports various lengths. However, commonly used communication systems require a very high level of length compatibility based on various types of data transmission. For this reason, the LDPC coding technique based on the typical lifting method has a problem that it is difficult to apply to communication systems.

In order to address such an issue, the disclosure uses the following lifting method.

Normally, the lifting may be considered to vary the values of entries in the exponential matrix of Equation 4 with respect to various L values in order to use it for LDPC encoding and decoding. For example, when the exponential matrix of Equation 4 is $E=(a_{i,j})$, and when the exponential matrix converted according to an L value is $E_L=(a_{i,j}^{(L)})$, a conversion equation, such as Equation 7 may be applied in general.

$$a_{i,j}^{(L)} = \begin{cases} a_{i,j} & a_{i,j} < 0 \\ f(a_{i,j}, L) & a_{i,j} \geq 0 \end{cases} \text{ or} \quad \text{Equation 7}$$

$$a_{i,j}^{(L)} = \begin{cases} a_{i,j} & a_{i,j} \leq 0 \\ f(a_{i,j}, L) & a_{i,j} > 0 \end{cases}$$

In Equation 7, f(x,L) may be defined in various forms. For example, definitions as shown in the following Equation 8 may be used.

$$f(x, L) = \bmod(x, 2^{\lfloor \log_2 L \rfloor}) \text{ or } f(x, L) = \left\lfloor \frac{x}{2^{D-\lfloor \log_2 L \rfloor}} \right\rfloor \text{ or} \quad \text{Equation 8}$$

$$f(x, L) = \left\lfloor \frac{L}{D} x \right\rfloor$$

In Equation 8, mod(a,b) denotes a modulo-b operation for a, and D denotes a constant that is a predefined positive integer.

Although the criterion for applying a conversion formula 'f' in Equation 7 uses zero for convenience, a criterion value may be set differently depending on a block size L to be supported.

Figure 4:
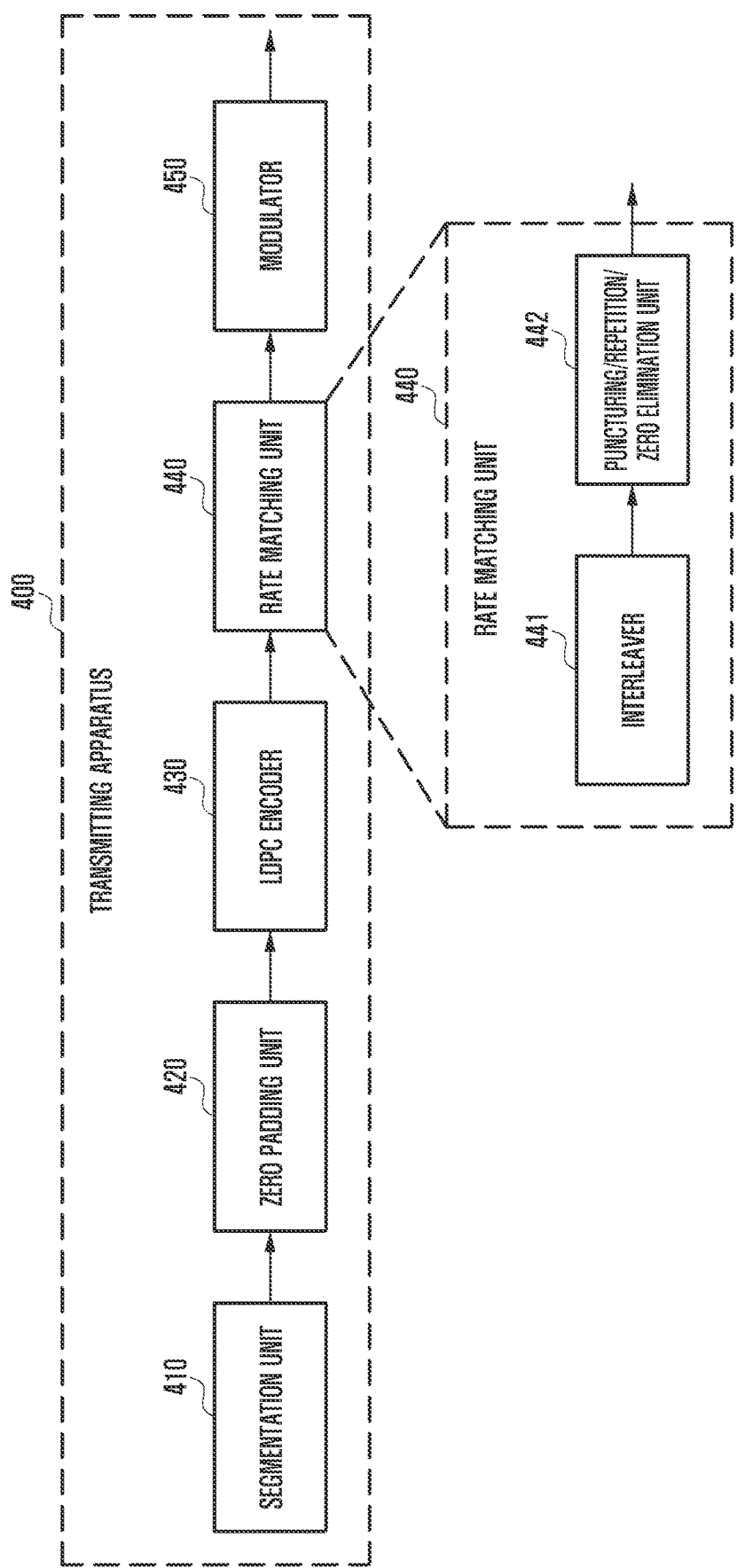
FIG. 4 is a block diagram illustrating a transmitting apparatus according to an embodiment of the disclosure.

FIG. 4 is a block diagram illustrating a transmitting apparatus according to an embodiment of the disclosure.

Referring to FIG. 4, in order to process variable-length input bits, an transmitting apparatus (or transmitter) 400 may include a segmentation unit 410, a zero padding unit 420, an LDPC encoder 430, a rate matching unit 440, and a modulator 450. The rate matching unit 440 may include an interleaver 441 and a puncturing/repetition/zero elimination unit 442.

Elements shown in FIG. 4 are configured to perform encoding and modulation for variable-length input bits. Some of these elements may be omitted or replaced or any other element may be added.

Meanwhile, the transmitting apparatus 400 may determine required parameters (e.g., input bit length, modulation and code rate (ModCod), parameter for zero padding (or shortening), coding rate and/or codeword length of LDPC code, parameter for interleaving, parameter for repetition and puncturing, modulation scheme), and perform encoding on the basis of the determined parameters before transmission to a reception apparatus 500.

The number of input bits is variable. Therefore, if the number of input bits is greater than a predetermined value, the input bits may be segmented to have a length equal to or smaller than the predetermined value. In addition, each segmented block may correspond to one LDPC encoded block. If the number of input bits is equal to or smaller than the predetermined value, no segmentation is performed. In this case, the input bits may correspond to one LDPC encoded block.

The transmitting apparatus 400 may store various parameters used for encoding, interleaving, and modulation. The parameters used for encoding may be a coding rate of the LDPC code, a codeword length, and information about the parity check matrix. The parameters used for interleaving may be information about an interleaving rule, and the parameters used for modulation may be information about a modulation scheme. Further, information about puncturing may be a puncturing length, and information about repetition may be a repetition length. The information about the parity check matrix may include an exponent value of the circulant matrix when the parity matrix proposed in the disclosure is used.

In this case, the respective elements constituting the transmitting apparatus 400 may perform an operation using the above-mentioned parameters.

Although not shown, the transmitting apparatus 400 may further include a controller (not shown) for controlling the operation of the transmitting apparatus 400.

Figure 5:
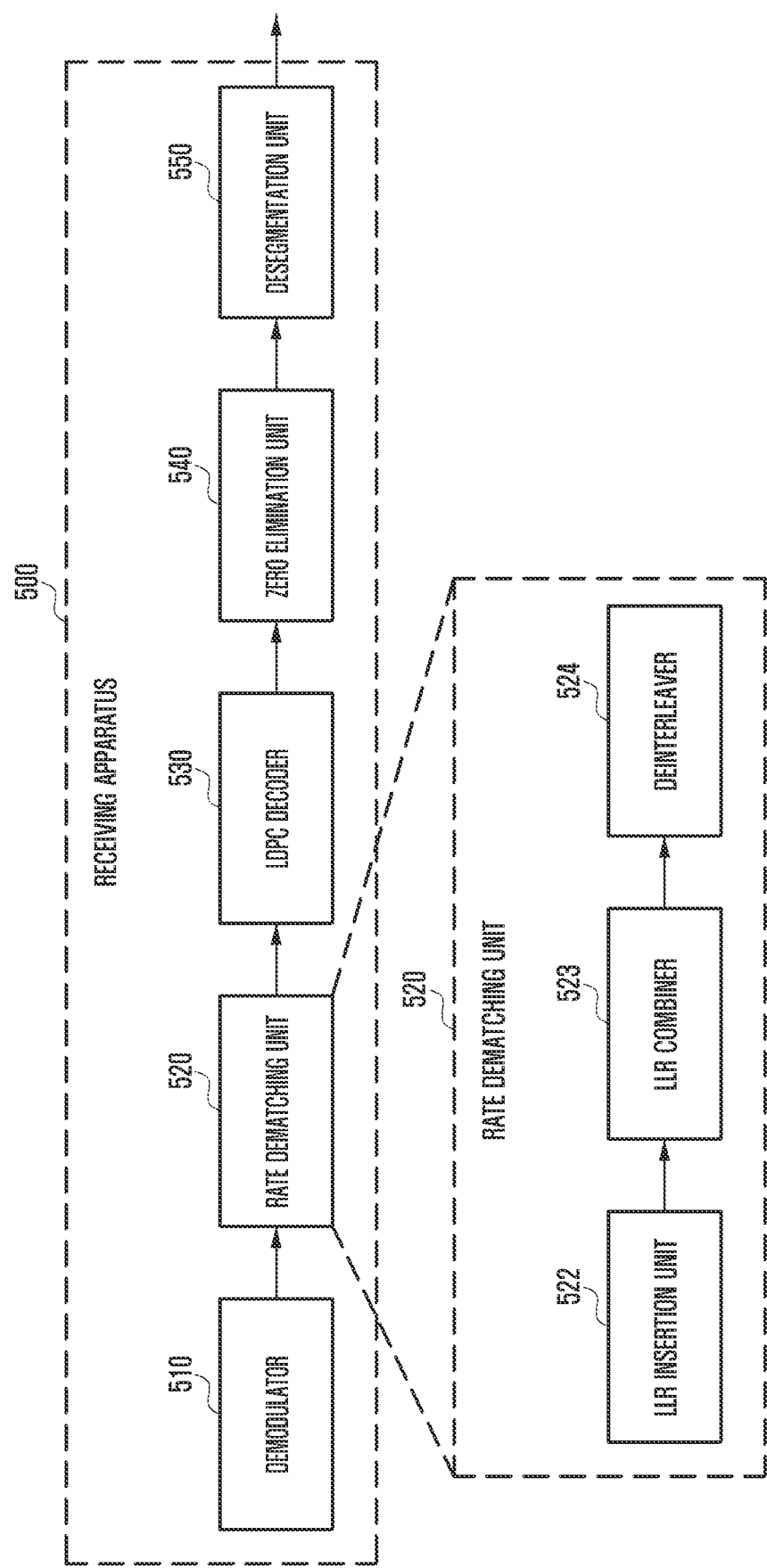
FIG. 5 is a block diagram illustrating a receiving apparatus according to an embodiment of the disclosure.

FIG. 5 is a block diagram illustrating a receiving apparatus according to an embodiment of the disclosure.

Referring to FIG. 5, in order to process variable-length information, a receiving apparatus (or receiver) 500 may include a demodulator 510, a rate dematching unit 520, an LDPC decoder 530, a zero elimination unit 540, and a desegmentation unit 550. The rate dematching unit 520 may include a log likelihood ratio (LLR) insertion unit 522, an LLR combiner 523, a deinterleaver 524, and the like.

Elements shown in FIG. 5 are configured to perform functions of the receiving apparatus. Some of these elements may be omitted or replaced or any other element may be added.

The parity check matrix disclosed herein may be read using a memory, be given in advance in the transmitting apparatus or the receiving apparatus, or be directly generated by the transmitting apparatus or the receiving apparatus. In addition, the transmitting apparatus may store or generate a sequence or exponential matrix corresponding to the parity check matrix, and apply it to encoding. Similarly, the receiving apparatus may store or generate a sequence or exponential matrix corresponding to the parity check matrix, and apply it to decoding.

Hereinafter, a receiver operation will be described with reference to FIG. 5.

The demodulator 510 demodulates a signal received from the transmitting apparatus 400.

Specifically, the demodulator 510, which is an element corresponding to the modulator 450 of the transmitting apparatus 400, demodulates a signal received from the transmitting apparatus 400 and then generates values corresponding to bits transmitted from the transmitting apparatus 400.

For this, the receiving apparatus 500 may previously store information about a modulation scheme used by the transmitting apparatus 400 depending on a mode. Therefore, depending on a mode, the demodulator 510 may demodulate a signal received from the transmitting apparatus 400 and generate values corresponding to LDPC codeword bits.

Meanwhile, a value corresponding to bits transmitted from the transmitting apparatus 400 may be a LLR value.

Specifically, the LLR value may be represented by the logarithm of the ratio of a probability that a bit transmitted from the transmitting apparatus 400 is zero, to a probability that the bit is one. Alternatively, the LLR value may be a bit value itself, or be a representative value determined according to an interval to which a probability that a bit transmitted from the transmitting apparatus 400 is 0 or 1 belongs.

The demodulator 510 has a function of performing multiplexing (not shown) on the LLR value. Specifically, a multiplexer (MUX) (not shown), which is an element corresponding to a bit demultiplexer (deMUX) (not shown) of the transmitting apparatus 400, may perform an operation corresponding to that of the bit deMUX.

For this, the receiving apparatus 500 may previously store information about parameters used for demultiplexing and block interleaving by the transmitting apparatus 400. Therefore, the MUX (not shown) may inversely perform the demultiplexing and block interleaving operation performed by the bit deMUX with respect to the LLR value corresponding to a cell word (i.e., information indicating a receiving symbol for the LDPC codeword as a vector value), and multiplex the LLR value corresponding to the cell word in a bit unit.

The rate dematching unit 520 may insert a certain LLR value into an LLR value output of the demodulator 510. For example, the rate dematching unit 520 may insert predetermined LLR values between LLR values outputted from the demodulator 510.

Specifically, the rate dematching unit 520 is an element corresponding to the rate matching unit 440 of the transmitting apparatus 400, and may perform operations corresponding to the interleaver 441 and the puncturing/repetition/zero elimination unit 442.

The LLR insertion unit 522 of the rate dematching unit 520 may insert an LLR value corresponding to zero bits in positions where the zero bits have been padded in the LDPC codeword. In this case, the LLR value corresponding to the padded zero bits, i.e., shortened zero bits, may be positive infinity ($\infty$) or negative infinity ($-\infty$). However, this is theoretical, and actually the LLR value corresponding to the padded zero bits may be the maximum or minimum value of LLR values used in the receiving apparatus 500.

For this, the receiving apparatus 500 may previously store information about parameters used for padding the zero bits by the transmitting apparatus 400. Therefore, the rate dematching unit 520 may identify the positions where the zero bits have been padded in the LDPC codeword, and then insert the LLR value corresponding to the shortened zero bits in the identified positions.

In addition, the LLR insertion unit 522 of the rate dematching unit 520 may insert an LLR value corresponding to punctured bits in positions of the punctured bits in the LDPC codeword. In this case, the LLR value corresponding to the punctured bits may be zero.

For this, the receiving apparatus 500 may previously store information about parameters used for puncturing by the transmitting apparatus 400. Therefore, the LLR insertion unit 522 may insert the corresponding LLR value in positions where the LDPC parity bits are punctured.

The LLR combiner 523 of the rate dematching unit 520 may combine (i.e., sum up) the LLR values outputted from the LLR insertion unit 522 and the demodulator 510. Specifically, the LLR combiner 523 which is an element corresponding to the puncturing/repetition/zero elimination unit 442 of the transmitting apparatus 400 may perform an operation corresponding to repetition. First, the LLR combiner 523 may combine an LLR value corresponding to repeated bits with other LLR value. Here, the other LLR value may be an LLR value for bits used as basis of generating the repeated bits by the transmitting apparatus 400, namely, for LDPC parity bits that have been selected for repetition.

For example, as described above, the transmitting apparatus 400 selects bits from LDPC parity bits, repeats the selected bits between the LDPC information word bits and the LDPC parity bits, and transmits the repeated bits to the receiving apparatus 500.

Therefore, the LLR value for the LDPC parity bits may be including an LLR value for repeated LDPC parity bits and an LLR value for non-repeated LDPC parity bits (i.e., LDPC parity bits generated by encoding). Thus, the LLR combiner 523 may combine the LLR values with the same LDPC parity bits.

For this, the receiving apparatus 500 may previously store information about parameters used for repetition by the transmitting apparatus 400. Therefore, the LLR combiner 523 may identify an LLR value for the repeated LDPC parity bits and combine the identified LLR value with an LLR value for LDPC parity bits on which the repetition is based.

In addition, the LLR combiner 523 may combine an LLR value corresponding to retransmission or increment redundancy (IR) bits with other LLR value. Here, the other LLR value may be an LLR value for the bits selected for the generation of LDPC codeword bits on which the generation of the retransmission or IR bits is based in the transmitting apparatus 400.

For example, when a non-acknowledgement (NACK) occurs for hybrid automatic repeat request (HARQ), the transmitting apparatus 400 may transmit some or all of the codeword bits to the receiving apparatus 500.

Therefore, the LLR combiner 523 may combine an LLR value for bits received via retransmission or IR with another LLR value for LDPC codeword bits received via the previous frame.

For this, the receiving apparatus 500 may previously store information about parameters used for retransmission or IR bits generation by the transmitting apparatus 400. Therefore, the LLR combiner 523 may identify an LLR value for the number of retransmission or IR bits and combine the identified LLR value with an LLR value for the LDPC parity bits on which the generation of the retransmission bits is based.

The deinterleaver 524 of the rate dematching unit 520 may deinterleave an LLR value outputted from the LLR combiner 523.

Specifically, the deinterleaver 524 is an element corresponding to the interleaver 441 of the transmitting apparatus 400, and may perform an operation corresponding to the interleaver 441.

For this, the receiving apparatus 500 may previously store information about parameters used for interleaving by the transmitting apparatus 400. Therefore, the deinterleaver 524 may deinterleave an LLR value corresponding to LDPC codeword bits by inversely performing an interleaving operation performed by the interleaver 441 on the LLR values corresponding to the LDPC codeword bits.

The LDPC decoder 530 may perform LDPC decoding, based on the LLR value outputted from the rate dematching unit 520.

Specifically, the LDPC decoder 530 is an element corresponding to the LDPC encoder 430 of the transmitting apparatus 400, and may perform an operation corresponding to the LDPC encoder 430.

For this, the receiving apparatus 500 may previously store information about parameters used for LDPC encoding by the transmitting apparatus 400 depending on a mode. Therefore, depending on a mode, the LDPC decoder 530 may perform LDPC decoding based on the LLR value outputted from the rate dematching unit 520.

For example, the LDPC decoder 530 may perform LDPC decoding on the basis of the LLR value outputted from the rate dematching unit 520 in accordance with an iterative decoding scheme based on the sum-product algorithm, and output error-corrected bits according to LDPC decoding.

The zero elimination unit 540 may remove zero bits from the bits outputted from the LDPC decoder 530.

Specifically, the zero elimination unit 540 is an element corresponding to the zero padding unit 420 of the transmitting apparatus 400 and may perform an operation corresponding to the zero padding unit 420.

For this, the receiving apparatus 500 may previously store information about parameters used for padding zero bits by the transmitting apparatus 400. Therefore, the zero elimination unit 540 may remove the zero bits padded by the zero padding unit 420 from bits outputted from the LDPC decoder 530.

The desegmentation unit 550 is an element corresponding to the segmentation unit 410 of the transmitting apparatus 400 and may perform an operation corresponding to the segmentation unit 410.

For this, the receiving apparatus 500 may previously store information about parameters used for segmentation by the transmitting apparatus 400. Therefore, the desegmentation unit 550 may recover bits before segmentation by combining bits outputted from the zero elimination unit 540, that is, segments for variable-length input bits.

Meanwhile, the LDPC code may be decoded using the iterative decoding algorithm based on the sum-product algorithm on the bipartite graph as shown in FIG. 2. As mentioned above, the sum-product algorithm is a kind of a message passing algorithm.

Hereinafter, a message passing operation normally used in LDPC decoding will be described with reference to FIGS. 6A and 6B.

Figure 6A:
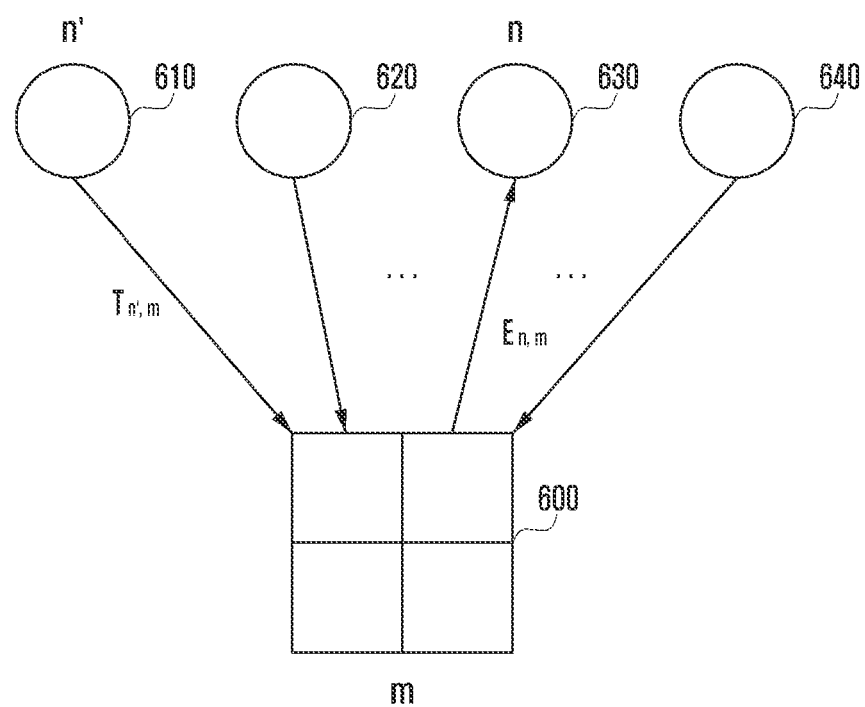
FIGS. 6A and 6B are message structure diagrams illustrating a message passing operation at a check node and a variable node for LDPC decoding according to various embodiments of the disclosure.
Figure 6B:
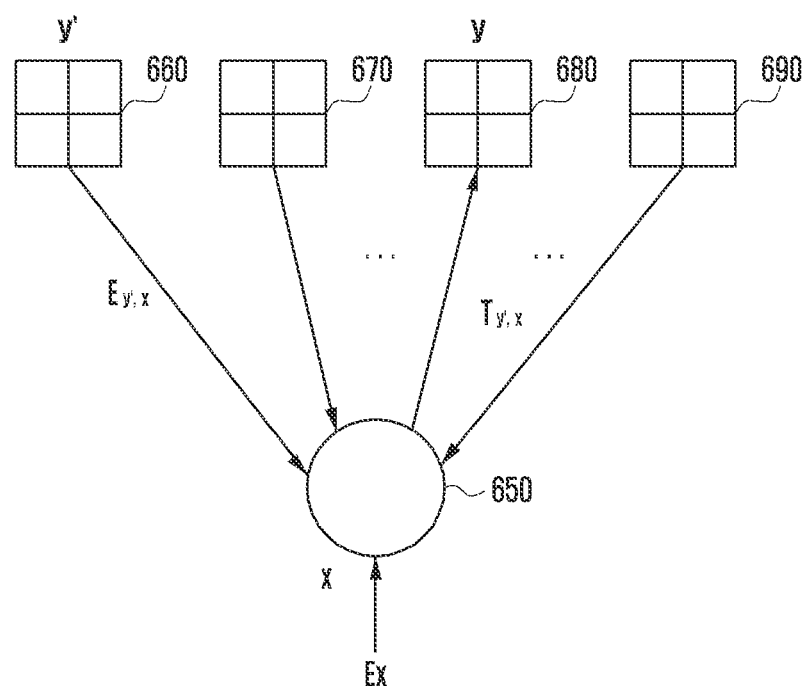

FIGS. 6A and 6B illustrate a message passing operation at a check node and a variable node for LDPC decoding according to various embodiments of the disclosure.

Referring to FIG. 6A, a check node m 600 and a plurality of variable nodes 610, 620, 630, and 640 connected to the check node m 600. In addition, $T_{n',m}$ denotes a message passed from the variable node n' 610 to the check node m 600, and $E_{n,m}$ denotes a message passed from the check node m 600 to the variable node n 630. Here, a set of all variable nodes connected to the check node m 600 is defined as N(m), and a set obtained by excluding the variable node n 630 from N(m) is defined as N(m)\n.

In this case, a message update rule based on the sum-product algorithm may be expressed by Equation 9.

$$|E_{n,m}| = \Phi\left[\sum_{n' \in N(m)\backslash n} \Phi(|T_{n',m}|)\right]$$

$$\text{Sign}(E_{n,m}) = \prod_{n' \in N(m)\backslash n} \text{sign}(T_{n',m})$$

Equation 9

Here, Sign(En,m) denotes the sign of a message En,m, and |En,m| denotes the magnitude of a message En,m. A function Φ(x) may be expressed by Equation 10 below.

$$\Phi(x) = -\log\left(\tanh\left(\frac{x}{2}\right)\right)$$

Equation 10

Referring to FIG. 6B, a variable node x 650 and a plurality of check nodes 660, 670, 680, and 690 connected to the variable node x 650. In this case, $E_{y',x}$ denotes a message passed from the check node y' 660 to the variable node x 650, and $T_{y,x}$ denotes a message passed from the variable node x 650 to the check node y 680. Here, a set of all check nodes connected to the variable node x 650 is defined as M(x), and a set obtained by excluding the check node y 680 from M(x) is defined as M(x)\y. In this case, a message update rule based on the sum-product algorithm may be expressed by Equation 11.

$$T_{y,x} = E_x + \sum_{y' \in M(x)\backslash y} E_{y',x}$$

Equation 11

Here, $E_x$ denotes the initial message value of the variable node x.

In case of determining the bit value of the node x, the following Equation 12 may be used.

$$P_x = E_x + \sum_{y' \in M(x)} E'_{y',x}$$

Equation 12

In this case, the encoding bit corresponding to the node x may be determined according to the $P_x$ value.

Because FIGS. 6A and 6B show a general decoding method, a detailed description will be omitted. In addition to the method shown in FIGS. 6A and 6B, other methods may be applied to determine the value of a message passed between the variable node and the check node. A related description is disclosed in Frank R. Kschischang, Brendan J. Frey, and Hans-Andrea Loeliger, "Factor Graphs and the Sum-Product Algorithm", IEEE TRANSACTIONS ON INFORMATION THEORY, Vol. 47, NO. 2, FEBRUARY 2001, pp 498-519.

Figure 7:
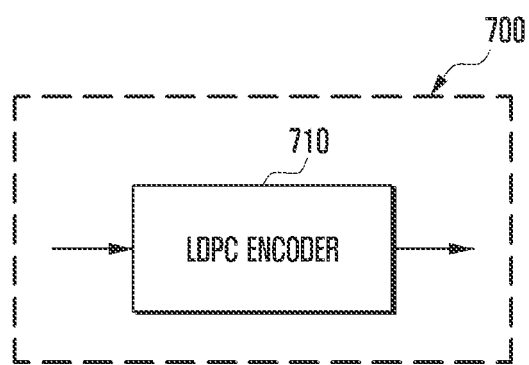
FIG. 7 is a block diagram illustrating an LDPC encoder according to an embodiment of the disclosure.

FIG. 7 is a block diagram illustrating an LDPC encoder according to an embodiment of the disclosure.

Referring to FIG. 7, $K_{ldpc}$ bits may constitute $K_{ldpc}$ LDPC information word bits I=($i_0, i_1, \ldots, i_{K_{ldpc}-1}$) for an LDPC encoder 700. The LDPC encoder 700 may perform systematic LDPC encoding of $K_{ldpc}$ LDPC information word bits and thereby generate LDPC codewords Λ=($c_0, c_1, \ldots, c_{N_{ldpc}-1}$)=($i_0, i_1, \ldots, i_{K_{ldpc}-1}, p_0, p_1, \ldots, p_{N_{ldpc}-K_{ldpc}-1}$) including $N_{ldpc}$ bits.

As described above in Equation 1, a codeword is determined so that a product of the LDPC codeword and the parity check matrix becomes a zero vector.

Referring to FIG. 7, an encoding apparatus 700 includes an LDPC encoder 710. The LDPC encoder 710 may generate an LDPC codeword by performing LDPC encoding for input bits, based on a parity check matrix or a corresponding exponential matrix or sequence. In this case, the LDPC encoder 710 may perform the LDPC encoding by using a parity check matrix defined differently according to a coding rate (i.e., a coding rate of an LDPC code).

The encoding apparatus 700 may further include a memory (not shown) for storing a coding rate of an LDPC code, a codeword length, and information about a parity check matrix. Using such information, the LDPC encoder 710 may perform the LDPC encoding. The information about a parity check matrix may include information about an exponent value of a circulant matrix when a parity matrix proposed herein is used.

Figure 8:
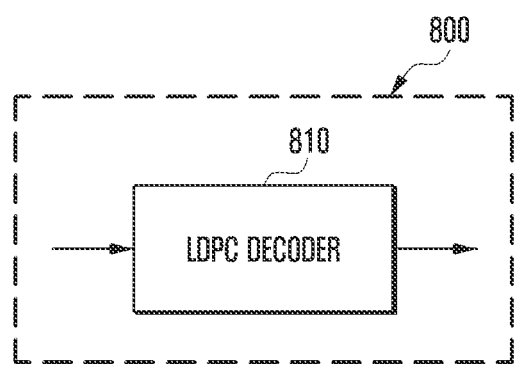
FIG. 8 is a block diagram illustrating an LDPC decoder according to an embodiment of the disclosure.

FIG. 8 is a block diagram illustrating an LDPC decoder according to an embodiment of the disclosure.

Referring to FIG. 8, a decoding apparatus 800 may include an LDPC decoder 810.

The LDPC decoder 810 performs LDPC decoding for an LDPC codeword, based on a parity check matrix or a corresponding exponential matrix or sequence.

For example, the LDPC decoder 810 may generate information word bits by passing a LLR value corresponding to LDPC codeword bits through an iterative decoding algorithm and then performing LDPC decoding.

Here, the LLR value is a channel value corresponding to the LDPC codeword bits, and may be expressed in various ways.

For example, the LLR value may be represented by the logarithm of the ratio of a probability that a bit transmitted from a transmitting side through a channel is zero, to a probability that the bit is one. Alternatively, the LLR value may be a bit value itself determined according to a hard decision, or be a representative value determined according to an interval to which a probability that a bit transmitted from the transmitting side is 0 or 1 belongs.

In this case, the transmitting side may generate the LDPC codeword by using the LDPC encoder 710 as shown in FIG. 7.

In addition, the LDPC decoder 810 may perform the LDPC decoding by using a parity check matrix defined differently according to a coding rate (i.e., a coding rate of an LDPC code).

Figure 9:
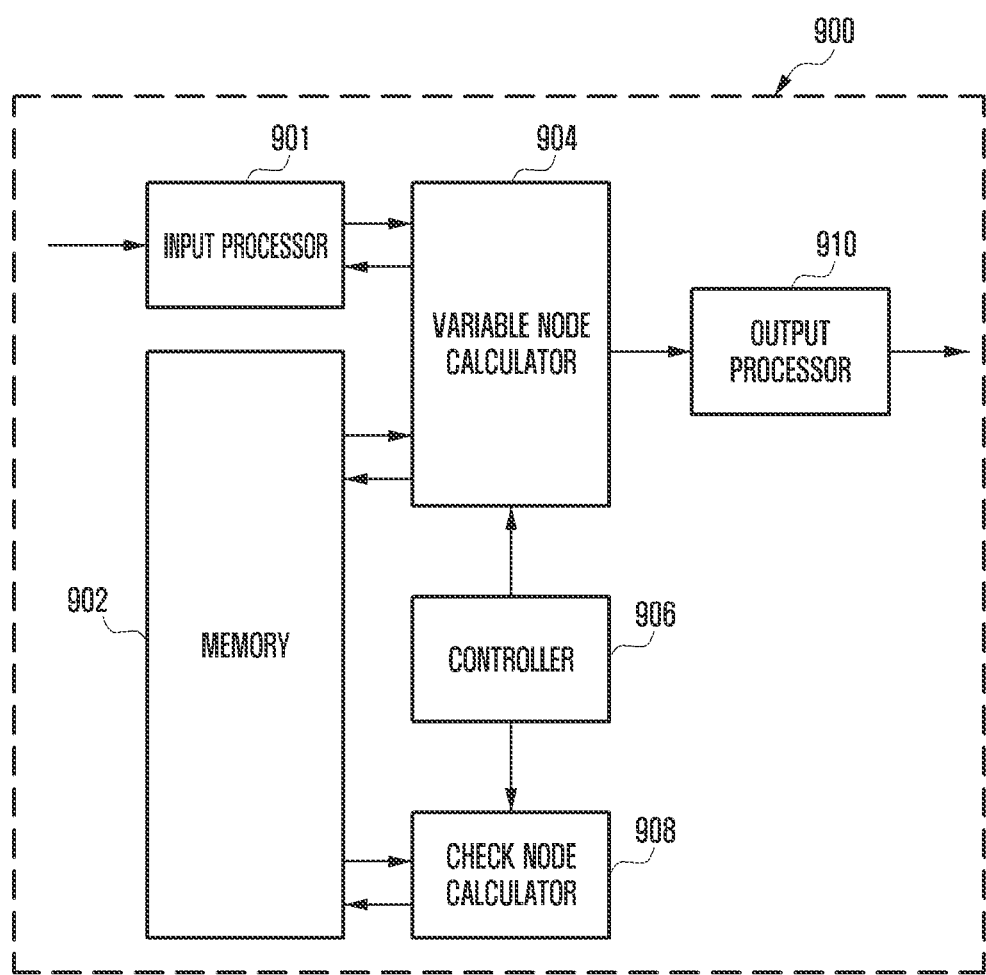
FIG. 9 is a block diagram illustrating a configuration of a decoding apparatus according to an embodiment of the disclosure.

FIG. 9 is a block diagram illustrating a configuration of a decoding apparatus according to an embodiment of the disclosure.

As described above, the LDPC decoder 810 may perform the LDPC decoding by using the iterative decoding algorithm. In this case, the LDPC decoder 810 may be configured as shown in FIG. 9.

Referring to FIG. 9, a decoding apparatus 900 includes an input processor 901, a memory 902, a variable node calculator 904, a controller 906, a check node calculator 908, and an output processor 910.

The input processor 901 stores an input value. Specifically, the input processor 901 may store an LLR value of a signal received via a radio channel.

Based on a parity check matrix corresponding to a block size (i.e., a codeword length) and coding rate of the received signal, the controller 906 determines the number of values inputted to the variable node calculator 904, an address value thereof in the memory 902, the number of values inputted to the check node calculator 908, and an address value thereof in the memory 902.

The memory 902 stores input and output data of each of the variable node calculator 904 and the check node calculator 908.

The variable node calculator 904 receives data from the memory 902, based on information about the number and address of input data received from the controller 906, and performs a variable node operation. Then, based on information about the number and address of output data received from the controller 906, the variable node calculator 904 stores the result of the variable node operation in the memory 902. In addition, based on data inputted from the input processor 901 and the memory 902, the variable node calculator 904 inputs the result of the variable node operation to the output processor 910. Here, the variable node operation is as described above with reference to FIGS. 6A and 6B.

The check node calculator 908 receives data from the memory 902, based on information about the number and address of input data received from the controller 906, and performs a check node operation. Then, based on information about the number and address of output data received from the controller 906, the check node calculator 908 stores the result of the check node operation in the memory 902. Here, the check node operation is as described above with reference to FIGS. 6A and 6B.

The output processor 910 performs a hard decision, based on data received from the variable node calculator 904, to determine whether information word bits of a codeword are zero or one at a transmitting side. Then, the output processor 910 outputs the result of the hard decision, and this output value of the output processor 910 becomes a finally decoded value. In this case, the hard decision may be performed based on the sum of all message values (an initial message value and all message values inputted from a check node) inputted to one variable node in FIGS. 6A and 6B.

Meanwhile, the memory 902 of the decoding apparatus 900 may store in advance information about a coding rate of an LDPC code, a codeword length, and a parity check matrix. Using such information, the LDPC decoder 810 may perform the LDPC decoding. However, such information may be provided by the transmitting side.

Figure 10:
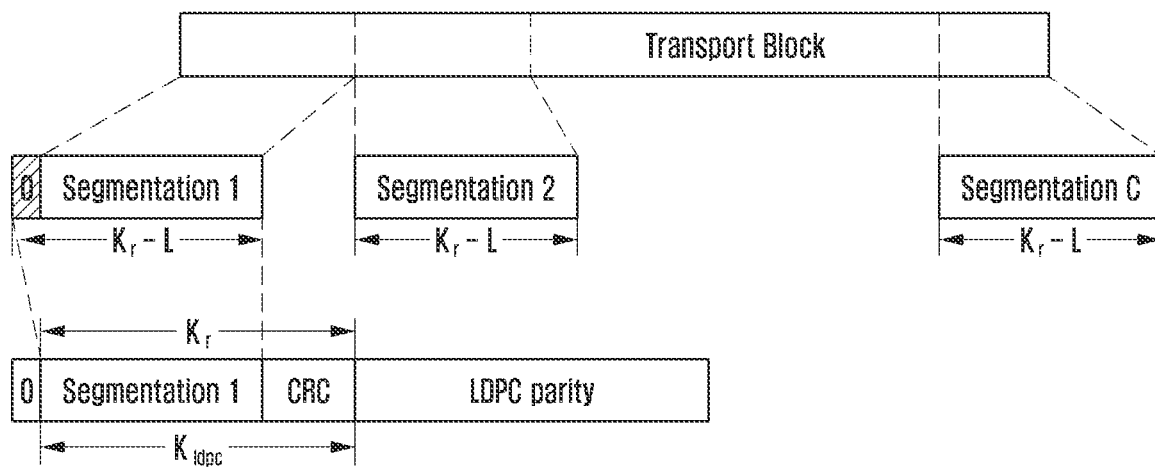
FIG. 10 is a diagram illustrating a structure of a transport block according to an embodiment of the disclosure.

FIG. 10 is a diagram illustrating a structure of a transport block according to an embodiment of the disclosure.

Referring to FIG. 10, <Null> bits may be added so that segmented lengths are equal to each other.

In addition, <Null> bits may be added to match an information length of an LDPC code.

Described hereinbefore is the method for applying various block sizes, based on the QC-LDPC code in the communication or broadcasting systems that support LDPC codes of various lengths. Now, a method for further improving the encoding performance in the above method will be described.

Normally, in case of suitably converting and using a sequence with respect to various block sizes L from a single LDPC exponential matrix or sequence, like the lifting method described in Equations 7 and 8, there are many advantages in system implementation because it only needs to be implemented with one or a few sequence. However, it is very difficult to design an LDPC code having good performance for all block sizes as the number of types of block sizes to be supported increases.

In order to address such an issue, an efficient design method of the QC LDPC code is proposed as follows. Proposed in this disclosure is a method for designing a parity check matrix having excellent performance based on the lifting method of Equations 7 and 8 and the parity check matrix of the LDPC code or the trapping set characteristic on the Tanner graph. For convenience, although assuming the lifting based on $f(x,L)=\mod(x,2^{\lfloor \log_2 L \rfloor})$ of Equation 8, this disclosure is not limited thereto.

Now, a first design method of a variable-length LDPC code will be described.

First operation: Find a weight distribution (i.e., a distribution of 1s contained in a row or column of a matrix) of a base matrix by performing a density evolution analysis while changing a convergence rule of a density evolution and an iteration decoding number in determining a noise threshold for a decoding success of a channel code.

Second operation: When it is possible to improve the weight distribution obtained at the first operation through the Hill Climbing method, set the improved weight distribution as the weight distribution of a base matrix.

Third operation: Obtain one base matrix, based on the weight distribution obtained at the second operation. At this operation, a method for obtaining the base matrix may be designed through various known techniques.

Fourth operation: Assume that the lifting is based on $f(x,L)=\mod(x,2^{\lfloor \log_2 L \rfloor})$ of Equation 8. For example, it is assumed that encoding and decoding are performed using the same exponential matrix for L values satisfying a range of $2^k \leq L < 2^{k+1}$.

Fifth operation: Maximize the girth (i.e., the smallest value of cycle lengths on the Tanner graph) in determining the exponential matrix according to the L values satisfying the above range, and then determine the exponential matrix from which trapping sets are removed maximally in a predetermined removal order. Here, the predetermined order of removing the trapping sets is as follows.

First priority: (4,0) trapping set
Second priority: (3,1) trapping set
Third priority: (2,2) trapping set
Fourth priority: (3,2) Trapping set
Fifth priority: (4,1) trapping set
Sixth priority: (4,2) trapping set Sixth operation: Repeat the first to fifth operations a given number of times, and then finally select a code having the best average performance according to the L value through a computation experiment for each obtained code. Here, the average performance may be defined in various ways. For example, it is possible to find the minimum signal-to-noise ratio (SNR) necessary for achieving a block error rate (BLER) required in the system while varying the L value, and then finally select a code having the smallest average SNR.

The above-described method of designing the variable-length QC LDPC code may be modified according to requirements of a channel code. For example, the fourth operation may be changed by considering the lifting method to be applied in the system. In addition, at the fifth operation, the order of removing the trapping sets may be changed according to the characteristics of a channel code required in the system. Meanwhile, the above-described design method for the variable-length QC LDPC code may be also applied to a fixed length by removing only the lifting process from the fourth and fifth operations.

For example, a code may be designed on the assumption that the number of information word bits is set to a small number and that, in case of a low coding rate, some of codeword bits obtained after channel encoding are repetitively transmitted based on both complexity and performance. In this case, at the first operation in the above-discussed method of designing the variable-length QC LDPC code, the noise threshold is determined by increasing a part of the initial value for the density evolution analysis by the number of repetitive transmissions. In addition, if the coding rate or length is fixed, the lifting process may be excluded from the fourth and fifth operations.

Meanwhile, since the density evolution analysis method and the features of the trapping set are well known in the art, a detailed description is omitted herein and replaced by the following reference references:

REFERENCE [RSU2001]

T. J. Richardson, M. A. Shokrollahi, and R. L. Urbanke, "Design of capacity-approaching irregular low-density parity-check codes", IEEE Trans. Inf. Theory, vol. 47, no. 2, pp. 619-637, February 2001.

REFERENCE [KABA2012]

M. Karimi and A. H. Banihashemi, "Efficient algorithm for finding dominant trapping sets of LDPC codes", IEEE Trans. Inf. Theory, vol. 58, no. 11, pp. 6942-6958, November 2012.

As another embodiment of the disclosure, proposed is a method for designing an exponential matrix or sequence of LDPC codes in case of applying a plurality of exponential matrices or LDPC sequences on a given single base matrix. For example, a single base matrix is fixed, and an exponential matrix or sequence of LDPC codes defined on the base matrix is determined. Then, from the determined exponential matrix or sequence, the lifting is applied to meet a block size included in each block size group. In this way, variable-length LDPC encoding and decoding are performed. In this design method, although entries or numbers constituting the exponential matrix or LDPC sequence of LDPC codes may have different values, the corresponding entries or numbers have features of exactly coinciding in positions. The respective exponential matrices or LDPC sequences refer to exponents of the circulant permutation matrix, i.e., a kind of circular shift values for bits. By setting the positions of entries or numbers to be equal to each other, it is easy to know the positions of bits corresponding to the circulant permutation matrix. For reference, because the exponential matrix or LDPC sequence proposed in this disclosure corresponds to the circular shift value of bits corresponding to a block size Z, the exponential matrix may be referred to as a shift matrix, a shift value matrix, a shift sequence, or a shift value sequence.

The block size Z to be supported may be divided into a plurality of block size groups (or sets) as shown in Equation 13 below. Note that the block size Z is a value corresponding to the size Z×Z of a circulant permutation matrix or circulant matrix in a parity check matrix of the LDPC code.

$Z1=\{2, 4, 8, 16, 32, 64, 128, 256\}$ $Z2=\{3, 6, 12, 24, 48, 96, 192, 384\}$ $Z3=\{5, 10, 20, 40, 80, 160, 320\}$ $Z4=\{7, 14, 28, 56, 112, 224\}$ $Z5=\{9, 18, 36, 72, 144, 288\}$ $Z6=\{11, 22, 44, 88, 176, 352\}$ $Z7=\{13, 26, 52, 104, 208\}$ $Z8=\{15, 30, 60, 120, 240\}$     Equation 13

All values of the block size Z included in the block size groups of Equation 13 may be used, or block size values included in a certain subset may be used as shown in Equation 14 below. In addition, certain values may be added to or excluded from the block size groups (or sets) of Equation 13 or 14.

$Z1'=\{8, 16, 32, 64, 128, 256\}$ $Z2'=\{12, 24, 48, 96, 192, 384\}$ $Z3'=\{10, 20, 40, 80, 160, 320\}$ $Z4'=\{14, 28, 56, 112, 224\}$ $Z5'=\{9, 18, 36, 72, 144, 288\}$ $Z6'=\{11, 22, 44, 88, 176, 352\}$ $Z7'=\{13, 26, 52, 104, 208\}$ $Z8'=\{15, 30, 60, 120, 240\}$     Equation 14

The block size groups of Equations 13 and 14 have features of different granularities and the same ratio of neighboring block sizes. For example, the block sizes included in one group are in the relation of divisors or multiples. When the exponential matrix corresponding to the p-th (p=1, 2, . . . , 8) group is $E_P=(e_{i,j}^{(p)})$, and when the exponential matrix corresponding to a Z value included in the p-th group is $E_P(Z)=(e_{i,j}(Z))$, it is assumed that the sequence conversion method as shown in Equation 7 is applied using $f_P(x,Z)=x(\mod Z)$. For example, for example, when the block size Z is determined as Z=28, each entry $e_{i,j}(28)$ of the exponential matrix (or LDPC sequence) $E_4(28)=(e_{i,j}(28))$ for Z=28 with respect to the exponential matrix $E_4=(e_{i,j}^{(4)})$ corresponding to the 4th block size group that includes Z=28 may be obtained as shown in Equation 15.

$$e_{i,j}(28) = \begin{cases} e_{i,j}^{(4)} & e_{i,j}^{(4)} \leq 0 \\ e_{i,j}^{(4)}(\mod 28) & e_{i,j}^{(4)} > 0 \end{cases}$$

$$e_{i,j}(28) = \begin{cases} e_{i,j}^{(4)} & e_{i,j}^{(4)} < 0 \\ e_{i,j}^{(4)}(\mod 28) & e_{i,j}^{(4)} \geq 0 \end{cases}$$
Equation 15

The conversion as shown in Equation 15 may be simply expressed as shown in Equation 16.

$E_P(Z)=E_P(\mod Z), Z \in Z_P$     Equation 16

Although it is described above that the lifting or exponentiation matrix conversion method of Equation 7, 8, or 13 to 16 is applied to the entire exponential matrix corresponding to the parity check matrix, it is also possible to partially apply to the exponential matrix. For example, a partial matrix corresponding to a parity bit of a parity check matrix usually has a special structure for efficient encoding. In this case, the encoding method or the complexity may change due to lifting. Therefore, in order to maintain the same encoding method or complexity, no lifting may be applied to a part of an exponential matrix for a partial matrix corresponding to parity in a parity check matrix, or the lifting other than a lifting scheme applied to an exponential matrix for a partial matrix corresponding to an information word bit may be applied. For example, in the exponential matrix, a lifting scheme applied to a sequence corresponding to information word bits and a lifting scheme applied to a sequence corresponding to a parity bit may be set differently. In addition, by applying no lifting to the entire or part of a sequence corresponding to a parity bit, a fixed value may be used without a sequence conversion.

As another embodiment of the disclosure, a method for designing an LDPC exponential matrix or sequence when a base matrix is given based on the above-described Equations 13 to 16 is proposed as follows. Although described in the following embodiment is a method for designing an exponential matrix or sequence corresponding to one block size group, this may be applied to various block size groups in the same way to design another exponential matrix or sequence.

Now, a second design method of a variable-length LDPC code will be described.

First operation: A base matrix is given.

Second operation: A block size (Z) included in a block size group has the following values: $L_1 < L_2 < L_3 \ldots < L_S$.

For convenience, it is assumed that the lifting is performed based on $f(x,Z)=x(\bmod Z)$ (In general, other lifting methods are also applicable).

Third operation: A design starts by setting $L_k$ ($L_k > L_1$) as a starting point of lifting. To determine an exponential matrix or sequence according to the $L_k$ values, the girth (i.e., the smallest value of cycle lengths on the Tanner graph) is maximized first, and trapping sets are removed maximally in a predetermined removal order. Here, the predetermined order of removing the trapping sets is as follows.

First priority: (4,0) trapping set
Second priority: (3,1) trapping set
Third priority: (2,2) trapping set
Fourth priority: (3,2) Trapping set
Fifth priority: (4,1) trapping set
Sixth priority: (4,2) trapping set When the exponent value of the exponential matrix is determined according to the order of removing the trapping sets, the smaller value is selected from candidate exponent values if possible. In addition, a plurality of exponential matrices or sequences may be obtained.

Fourth operation: Determine the exponential matrix by applying the same rule as the third operation according to the $L_{k+1}$ value. At this time, the value of the exponential matrix or sequence should satisfy the following condition.

[Condition] When the exponential matrix for $L_k$ determined at the third operation is $E_p(L_k)$ ($e_{i,j}(L_k)$), and when the exponential matrix to be determined at the fourth operation is $E_p(L_{k+1})(e_{i,j}(L_{k+1}))$, the value of $w_{i,j}(L_{k+1})$ should be determined as one of $$e_{i,j}(L_k), e_{i,j}(L_k) + L_k, \ldots, e_{i,j}(L_k) + \left(\frac{L_{k+1}}{L_k} - 1\right) \times L_k.$$

Fifth operation: Repeat the first to fourth operations a given number of times, and determine an LDPC exponential matrix or sequence for $L_k, L_{k+1}, \ldots, L_S$. Meanwhile, there may be a large number of LDPC exponential matrices or sequences satisfying the trapping set removal order of the third operation and the above condition of the fourth operation. In this case, a plurality of LDPC exponential matrices or sequences having excellent average performance is determined through computational experiments. Here, the average performance may be defined in various ways. For example, it is possible to find the minimum SNR necessary for achieving a BLER required in the system while varying the Z value, and then finally select a code having the smallest average SNR.

Sixth operation: Generate a plurality of $E_p(L_1)$, $E_p(L_2), \ldots, E_p(L_{k-1})$ by applying $E_p(L_1) \equiv E_p(L_S)(\bmod L_1)$, $E_p(L_2) \equiv E_p(L_S)(\bmod L_2), \ldots, E_p(L_{k-1}) \equiv E_p(L_S)(\bmod L_{k-1})$, as shown in Equation 16, to the determined plurality of LDPC exponential matrices or sequences $E_p(L_S)=(e_{i,j}(L_S))$. Then, by considering the trapping set removal order of the third operation with respect to a set of the generated exponential matrices $E_p(L_1), E_p(L_2), \ldots, E_p(L_{k-1})$, determine a plurality of exponential matrices or sequences in which a bad trapping set is generated less.

Seventh operation: Determine a set of exponential matrices or sequences providing stable performance among the set of exponential matrices or sequences determined at the sixth operation, and then determine, as the final LDPC exponential matrix or sequence, $E_p(L_S)=(e_{i,j}(L_S))$ that can generate the determined set.

Here, the stable performance means that the SNR value for achieving a specific target BLER does not deviate significantly from any predefined value.

Compared with the existing design schemes, the second design method of a variable-length QC LDPC code differs in designing a parity check matrix or exponential matrix of the LDPC code by differentiating important priorities among block sizes to be supported. For example, in case of $Z \geq L_k$, the importance of the system is high, and the algebraic property of the exponential matrix should be guaranteed to a certain level or more. On the other hand, in case of $Z < L_k$, the importance of the system is somewhat low. Therefore, the above-described design method may allow an easy design of the LDPC code more suitable for the system.

FIGS. 11 to 18 are flow diagrams regarding various embodiments of an LDPC encoding or decoding process based on a base matrix and exponential matrix (or LDPC sequence) of an LDPC code designed through the above-described design method based on Equations 13 to 16 according to various embodiments of the disclosure.

Figure 11:
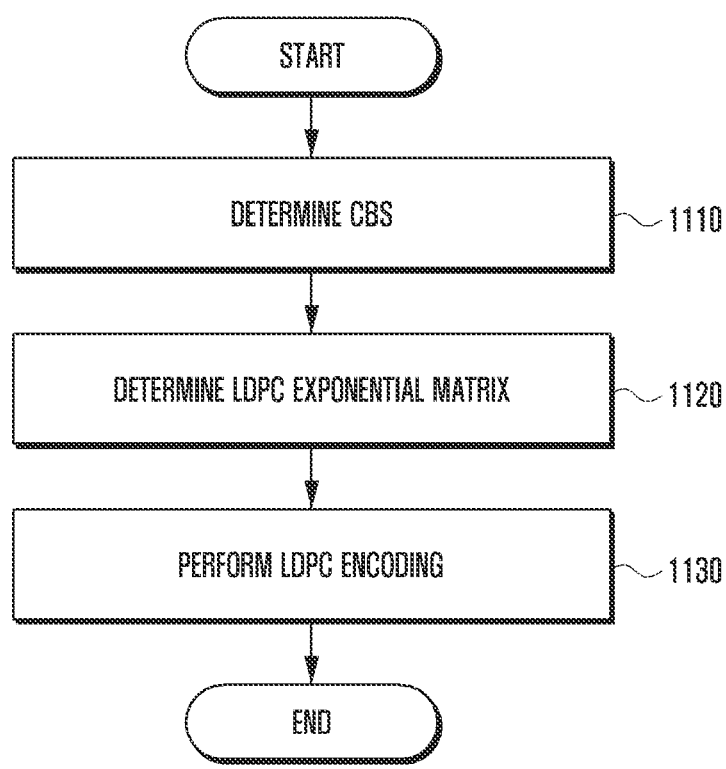
FIG. 11 is a flow diagram illustrating an LDPC encoding process according to an embodiment of the disclosure.

FIG. 11 is a diagram illustrating an embodiment of an LDPC encoding process according to an embodiment of the disclosure.

Referring to FIG. 11, at operation 1110, a transmitter (or transmitting apparatus) determines the length of an information word. In this disclosure, the length of an information word may be referred to as a code block size (CBS). Next, the transmitter determines an LDPC exponential matrix or sequence matched to the determined CBS at operation 1120, and then performs an LDPC encoding at operation 1130, based on the determined exponential matrix or sequence.

Figure 12:
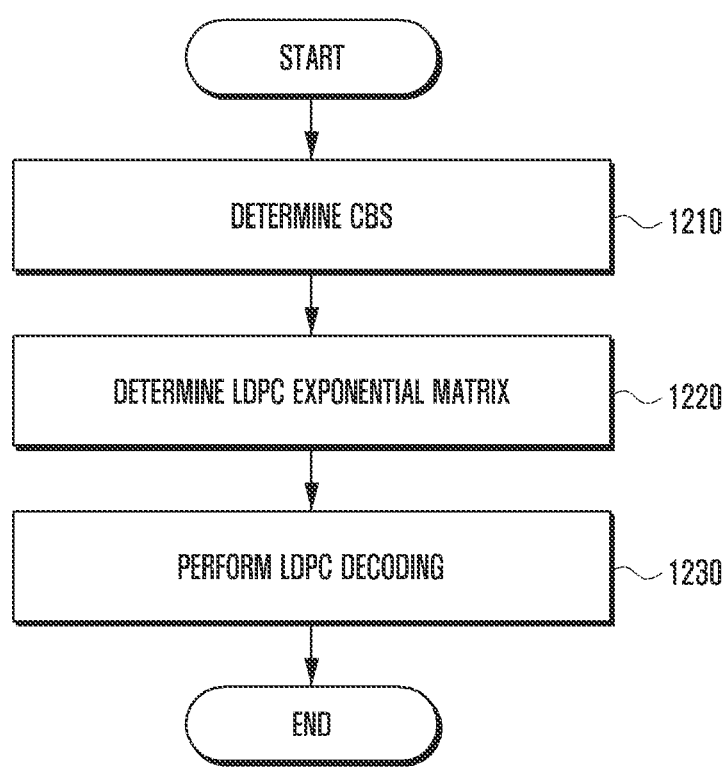
FIG. 12 is a flow diagram illustrating an LDPC decoding process according to an embodiment of the disclosure.

FIG. 12 is a flow diagram illustrating an LDPC decoding process according to an embodiment of the disclosure.

Referring to FIG. 12, an LDPC decoding process may be similar to the above. FIG. 12 is a diagram illustrating an embodiment of an LDPC decoding process. When the CBS is determined at operation 1210, a receiver (or receiving apparatus) may determine a suitable exponential matrix or sequence at operation 1220 and perform an LDPC decoding at operation 1230 by using the determined exponential matrix or sequence.

Figure 13:
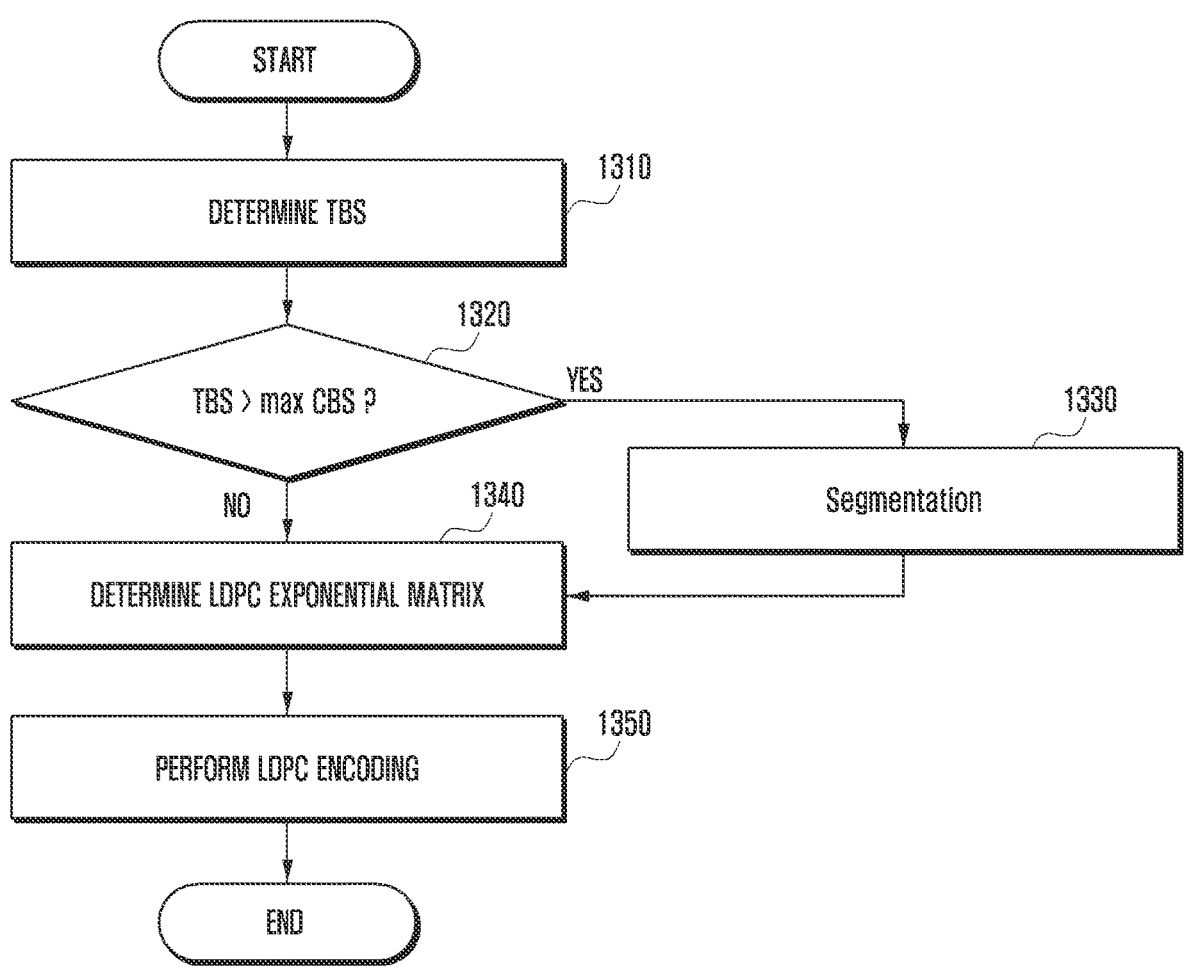
FIG. 13 is a flow diagram illustrating an LDPC encoding process according to an embodiment of the disclosure.
Figure 14:
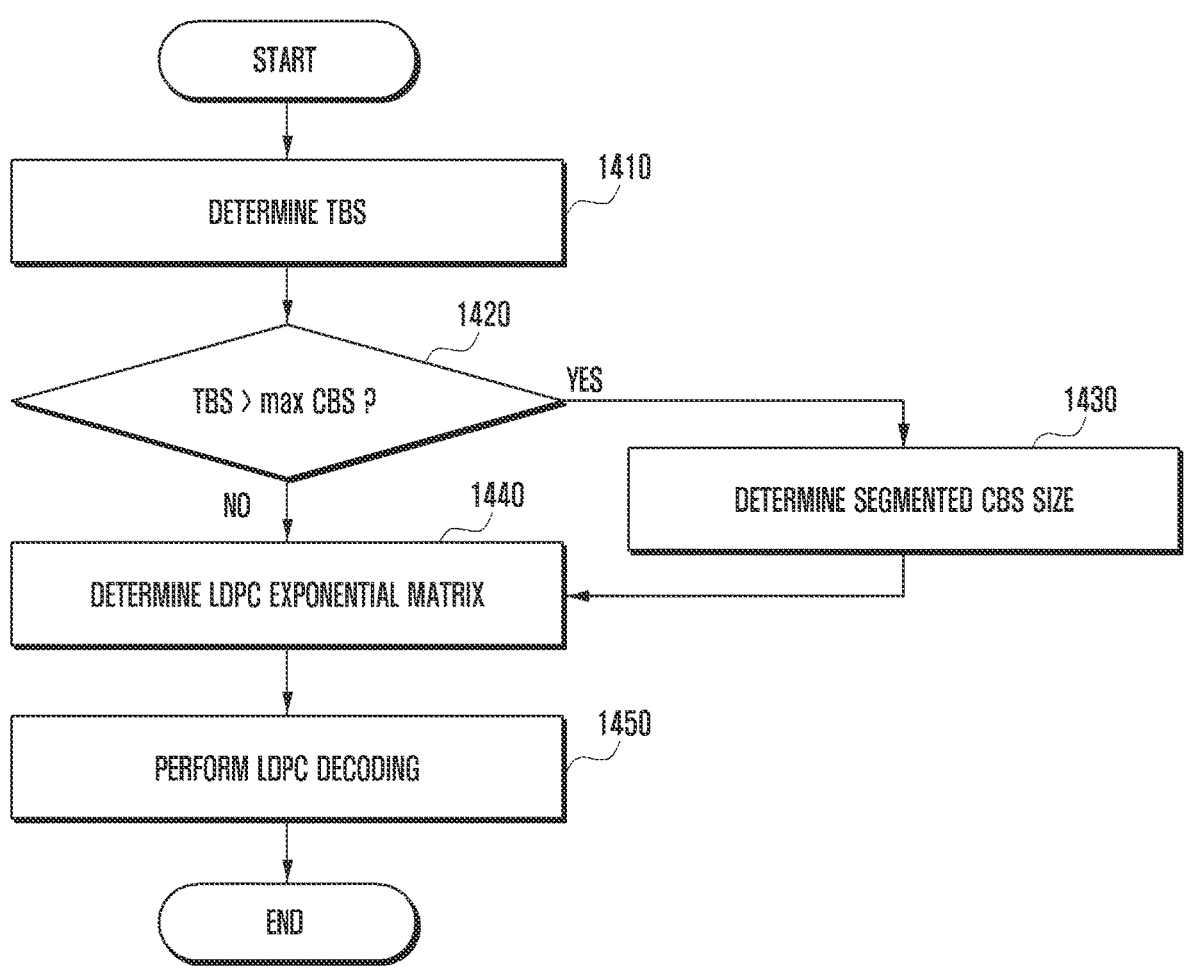
FIG. 14 is a flow diagram illustrating an LDPC decoding process according to an embodiment of the disclosure.

Flow diagrams in another embodiment of the LDPC encoding and decoding processes based on the designed base matrix or exponential matrix are shown in FIGS. 13 and 14.

FIG. 13 is a diagram illustrating an embodiment of an LDPC encoding process according to an embodiment of the disclosure.

Referring to FIG. 13, at operation 1310, the transmitter determines a size of a transport block (i.e., transport block size (TBS)) to be transmitted. If the length of the maximum information word to which encoding can be applied at one time according to a channel code given in the system is referred to as max CBS, and if the size of the TBS is greater than the max CBS, the transmitter should perform encoding by segmenting the transport block into a plurality of information blocks (or code blocks). Therefore, at operation 1320, the transmitter determines whether the TBS is greater than the max CBS. If the TBS is greater than the max CBS, the transmitter segments the transport block and newly determines the CBS at operation 1330. If the TBS is not greater than the max CBS, the transmitter determines the TBS as the CBS without segmentation and then determines a suitable LDPC exponential matrix or sequence according to a value of the TBS or CBS at operation 1340. Then, at operation 1350, the transmitter performs an LDPC encoding based on the determined exponential matrix or sequence.

For example, let's suppose that the TBS is determined as 9216 at operation 1310 and the maximum CBS given in the system is 8448. Since it is determined at operation 1320 that the TBS is greater than the max CBS, a suitable segmentation is applied at operation 1330, and thereby two information blocks (or code blocks) each having the CBS of 4608 are obtained. Therefore, the transmitter determines the exponential matrix or sequence suitable for the CBS of 4608 at operation 1340 and then performs the LDPC encoding by using the determined exponential matrix or sequence at operation 1350.

FIG. 14 is a flow diagram illustrating an LDPC decoding process according to an embodiment of the disclosure.

Referring to FIG. 14, when the TBS is determined as 9216 at operation 1410, the receiver determines at operation 1420 that the TBS is greater than the max CBS, and then determines the segmented CBS size as 4608 at operation 1430. If it is determined at operation 1420 that the TBS is not greater than the max CBS, the TBS is determined as being equal to the CBS. Thereafter, the receiver determines the exponential matrix or sequence of the LDPC code at operation 1440 and then performs the LDPC decoding at operation 1450 by using the determined exponential matrix or sequence.

Figure 15:
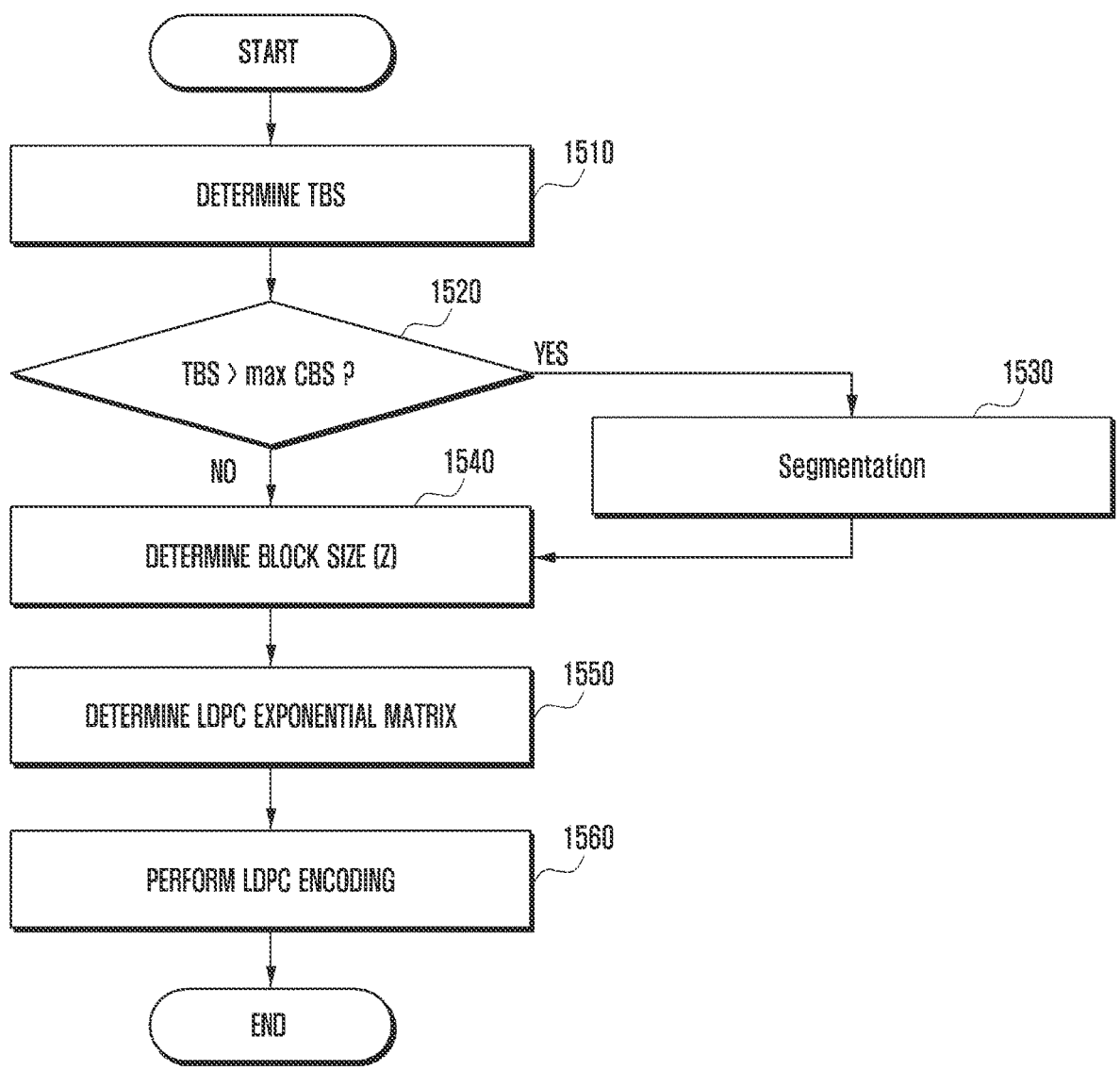
FIG. 15 is a flow diagram illustrating an LDPC encoding process according to an embodiment of the disclosure.
Figure 16:
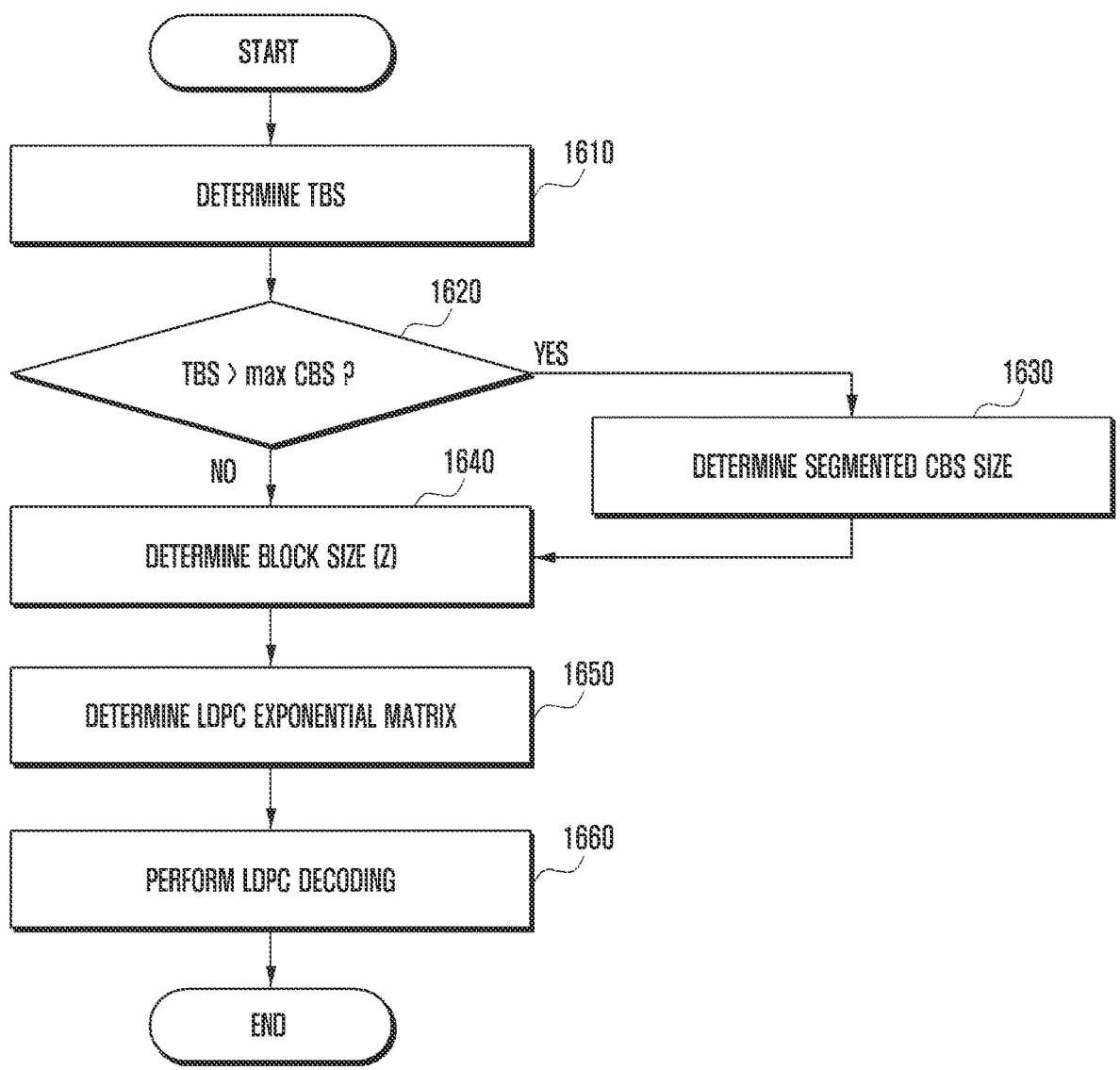
FIG. 16 is a flow diagram illustrating an LDPC decoding process according to an embodiment of the disclosure.

Flow diagrams in still another embodiment of the LDPC encoding and decoding processes based on the designed base matrix or exponential matrix are shown in FIGS. 15 and 16.

FIG. 15 is a diagram illustrating an embodiment of an LDPC encoding process according to an embodiment of the disclosure.

Referring to FIG. 15, first, at operation 1510, the transmitter determines the TBS of a transport block to be transmitted. Then, at operation 1520, the transmitter determines whether the TBS is greater than the max CBS. If the TBS is greater than the max CBS, the transmitter segments the transport block and newly determines the CBS at operation 1530. If the TBS is not greater than the max CBS, the transmitter determines the TBS as the CBS without segmentation and then determines a block size (Z) to be applied to the LDPC encoding, based on the CBS, at operation 1540. Then, at operation 1550, the transmitter determines a suitable LDPC exponential matrix or sequence according to a value of the block size (Z). Then, at operation 1560, the transmitter performs the LDPC encoding based on the determined block size and the determined exponential matrix or sequence. The operation 1560 may include a process of converting the determined LDPC exponential matrix or sequence, based on the determined block size.

FIG. 16 is a flow diagram illustrating an LDPC decoding process according to an embodiment of the disclosure.

Referring to FIG. 16, when the TBS is determined at operation 1610, the receiver determines at operation 1620 whether the TBS is greater than the max CBS. If the TBS is greater than the max CBS, the receiver determines the segmented CBS size at operation 1630. If it is determined at operation 1620 that the TBS is not greater than the max CBS, the TBS is determined as being equal to the CBS. Thereafter, the receiver determines the block size (Z) to be applied to the LDPC decoding at operation 1640 and then determines the LDPC exponential matrix or sequence suitable for the TBS, CBS, or block size (Z) at operation 1650. Then, at operation 1660, the receiver performs the LDPC decoding by using the determined block size and the determined exponential matrix or sequence. The operation 1660 may include a process of converting the determined LDPC exponential matrix or sequence, based on the determined block size.

Although it is described in the above embodiments that the exponential matrix or sequence of the LDPC code is determined based on one of the TBS, CBS, or block size (Z) at operation 1120, 1220, 1340, 1440, 1550, or 1650 in FIGS. 11 to 16, any other method may be used alternatively.

Figure 17:
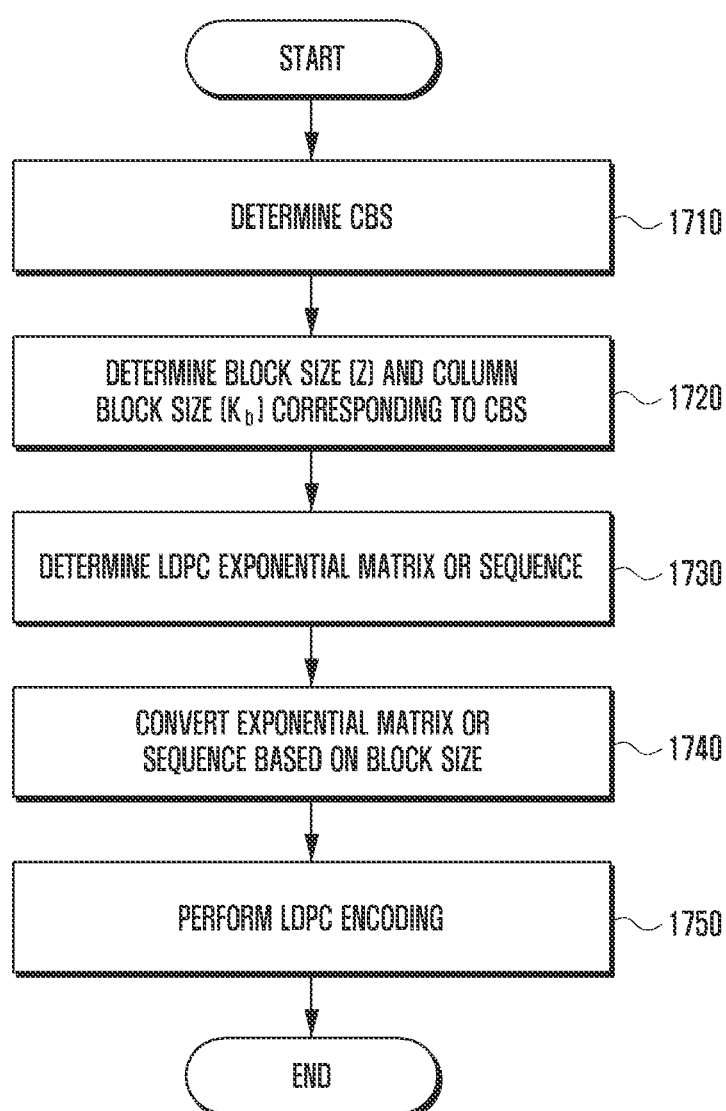
FIG. 17 is a flow diagram illustrating an LDPC encoding process according to an embodiment of the disclosure.
Figure 18:
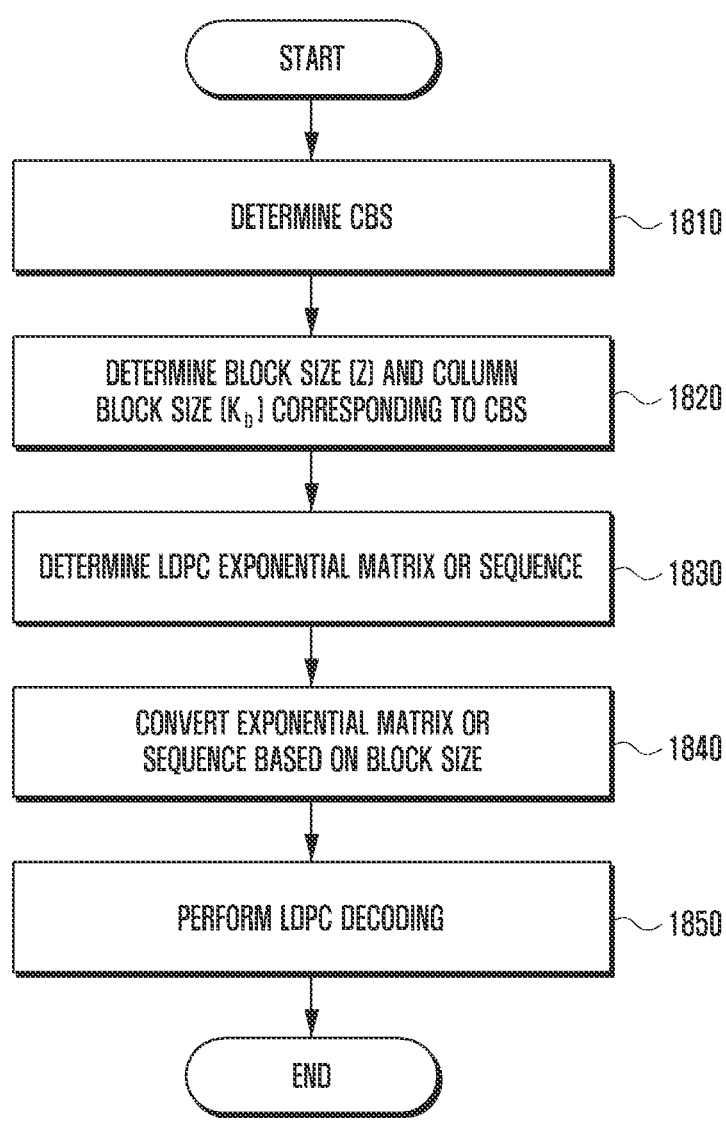
FIG. 18 is a flow diagram illustrating an LDPC decoding process according to an embodiment of the disclosure.

Flow diagrams in yet another embodiment of the LDPC encoding and decoding processes based on the designed base matrix or exponential matrix are shown in FIGS. 17 and 18.

FIG. 17 is a diagram illustrating an embodiment of an LDPC encoding process according to an embodiment of the disclosure.

Referring to FIG. 17, first, at operation 1710, the transmitter determines the CBS for transmission. Then, at operation 1720, the transmitter determines a block size (Z) and column block size ($K_b$) corresponding to the CBS in the LDPC exponential matrix according to the CBS. Normally, the number of columns corresponding to the information word bits is fixed in the exponential matrix of the LDPC code. However, in order to apply to various CBSs in encoding and provide optimized performance, all the columns corresponding to the information word bits are not used and may be appropriately shortened (zero padding) according to the CBS. The value of $K_b$ is a value determined based on this shortening. At operation 1730, the transmitter determines a suitable LDPC exponential matrix or sequence according to the CBS, column block size ($K_b$), or block size (Z). Then, at operation 1740, the transmitter may perform a process of converting the determined LDPC exponential matrix or sequence, based on the determined block size and the determined exponential matrix or sequence. At operation 1750, the transmitter performs the LDPC encoding based on the determined block size and the determined exponential matrix or sequence.

FIG. 18 is a flow diagram illustrating an LDPC decoding process according to an embodiment of the disclosure.

Referring to FIG. 18, first, at operation 1810, the receiver determines the CBS of received data. Then, at operation 1820, the receiver determines the block size (Z) and column block size ($K_b$) corresponding to the CBS in the LDPC exponential matrix according to the CBS. Then, at operation 1830, the receiver determines a suitable LDPC exponential matrix or sequence according to the CBS, column block size ($K_b$), or block size (Z). Then, at operation 1840, the receiver may perform a process of converting the determined LDPC exponential matrix or sequence, based on the determined block size and the determined exponential matrix or sequence. At operation 1850, the receiver performs the LDPC decoding by using the determined block size and the determined exponential matrix or sequence.

In the above-described embodiments of the LDPC encoding and decoding processes based on the base matrix and exponential matrix (or sequence) of the LDPC code as shown in FIGS. 11 to 18, by appropriately shortening a part of information word bits and puncturing a part of codeword bits with respect to the LDPC code, it is possible to support the LDPC encoding and decoding with various coding rates and various lengths. For example, various information word lengths (or code block lengths) and various coding rates can be supported by applying shortening to a part of information word bits in the base matrix or exponential matrix determined for the LDPC encoding and decoding in FIGS. 11 to 18, then always puncturing information word bits corresponding to the first two columns, and puncturing a part of parity.

In addition, when a variable information word length or a variable coding rate is supported using the shortening or zero-padding of the LDPC code, the code performance may be improved according to the order or method of shortening. If the shortening order is already set, the encoding performance may be improved by rearranging the entire or a part of the given base matrix. In addition, the performance may be improved by appropriately determining a block size or a size of a column block, to which the shortening is to be applied, with respect to a specific information word length (or code block length).

For example, when the number of columns required for the LDPC encoding and decoding in the given LDPC base matrix or exponential matrix is $K_b$, better performance can be obtained by applying an appropriate rule for shortening as given below and thereby determining the values of $K_b$ and the block size (Z).

```
if(CBS>A)
    K_b=10;
elseif(CBS>B)
    K_b=9;
elseif(CBS>C)
    K_b=8;
else
    K_b=6;
end
```

When the value of $K_b$ is determined in the above example, the block size (Z) value can be determined as the minimum value that satisfies $Z \times K_b \geq CBS$. When the degree of freedom to determine the $K_b$ value is higher, the performance is improved, but the system implementation complexity is deteriorated. Therefore, it is required to apply an appropriate level of rule in order to realize both better performance and better system implementation efficiency. For example, if a rule is created more precisely as given below, the performance is improved, but the implementation complexity is increased. Therefore, an appropriate rule is applied according to the requirements of the system.

```
if(CBS>A)
    K_b=10;
elseif(CBS>B)
    K_b=9;
elseif(CBS>C)
```

-continued

```
        K_b=8;
    Else
        If(CBS is member of [48,96,176,184,192])
            K_b=7;
        else
            K_b=6;
        end
    end
```

For reference, if the block size (Z) value is determined as the minimum value that satisfies $Z \times K_b \geq CBS$ when the value of $K_b$ is determined, the $K_b$ and the block size (Z) may be determined as shown in Equation 17.

$CBS=40 \Rightarrow K_b=6 \Rightarrow Z=7$ $CBS=48 \Rightarrow K_b=7 \Rightarrow Z=7$ $CBS=56 \Rightarrow K_b=6 \Rightarrow Z=10$ $CBS=64 \Rightarrow K_b=6 \Rightarrow Z=11$ $CBS=72 \Rightarrow K_b=6 \Rightarrow Z=12$ $CBS=80 \Rightarrow K_b=6 \Rightarrow Z=14$ $CBS=200 \Rightarrow K_b=8 \Rightarrow Z=26$ $CBS=640 \Rightarrow K_b=9 \Rightarrow Z=72$ $CBS=1024 \Rightarrow K_b=10 \Rightarrow Z=104$ Equation 17

This method for determining the $K_b$ and the block size is only, and any other method may be applied alternatively.

Figure 19A:
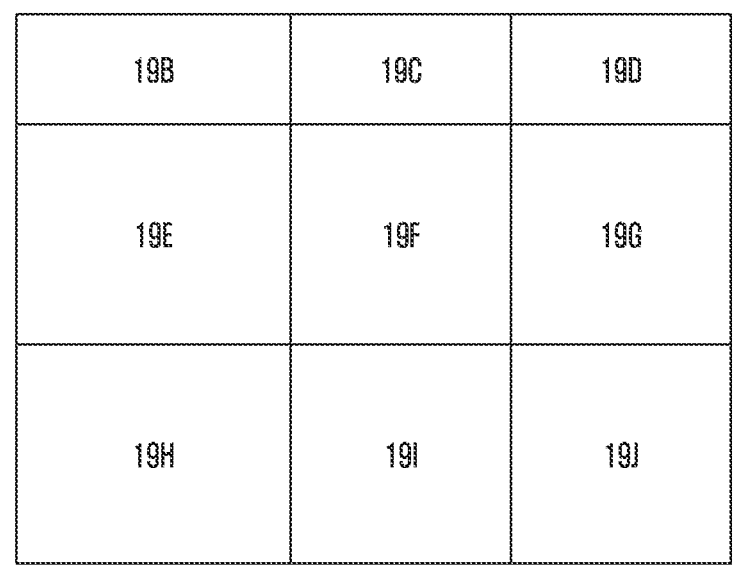
Figure 19C:
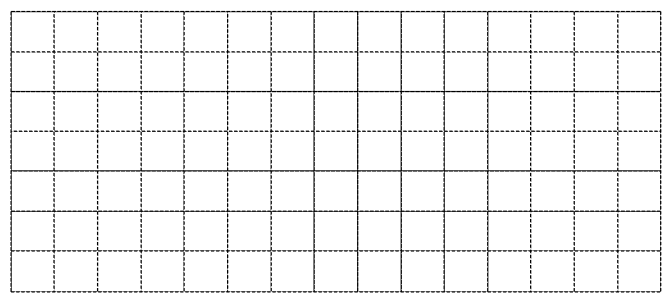
Figure 19D:
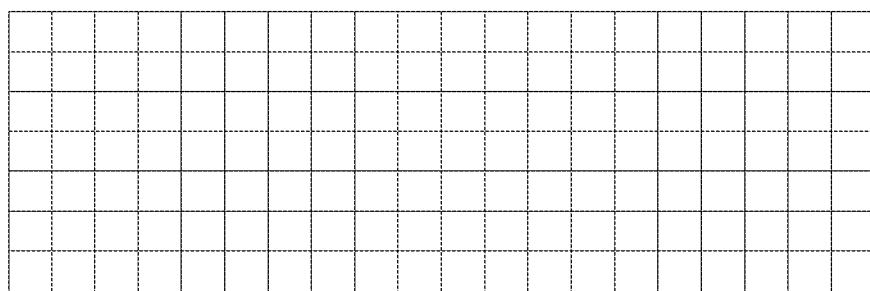
Figure 19F:
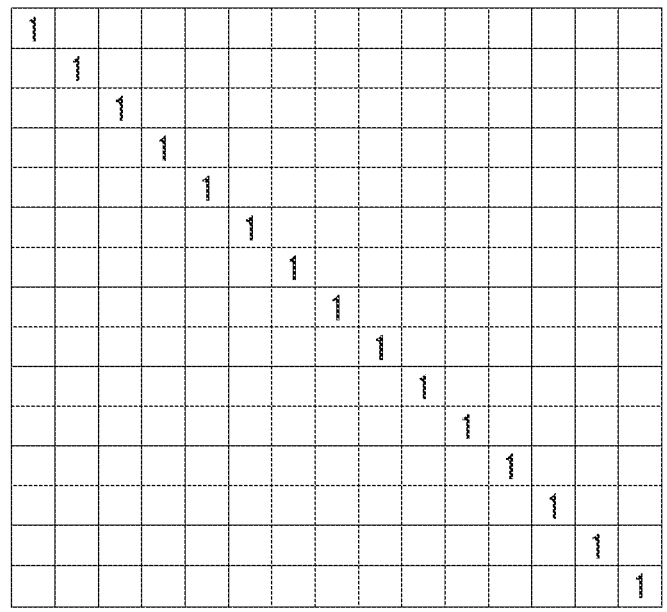
Figure 19G:
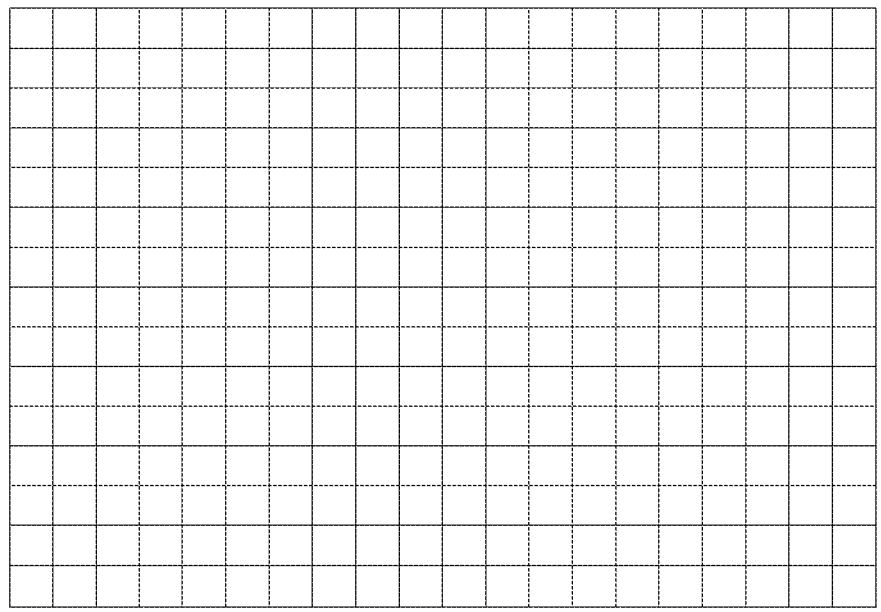
Figure 19H:
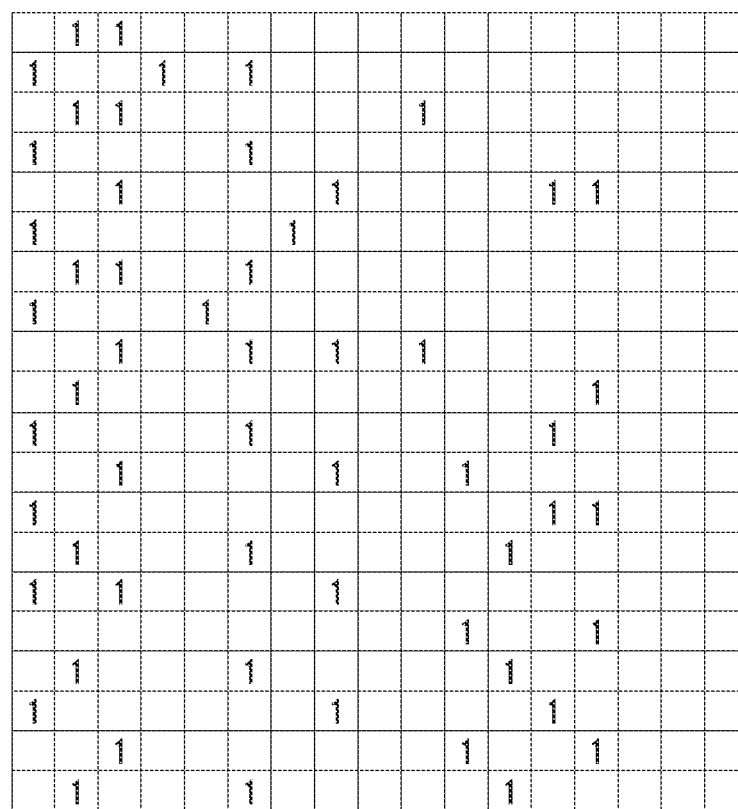
Figure 19I:
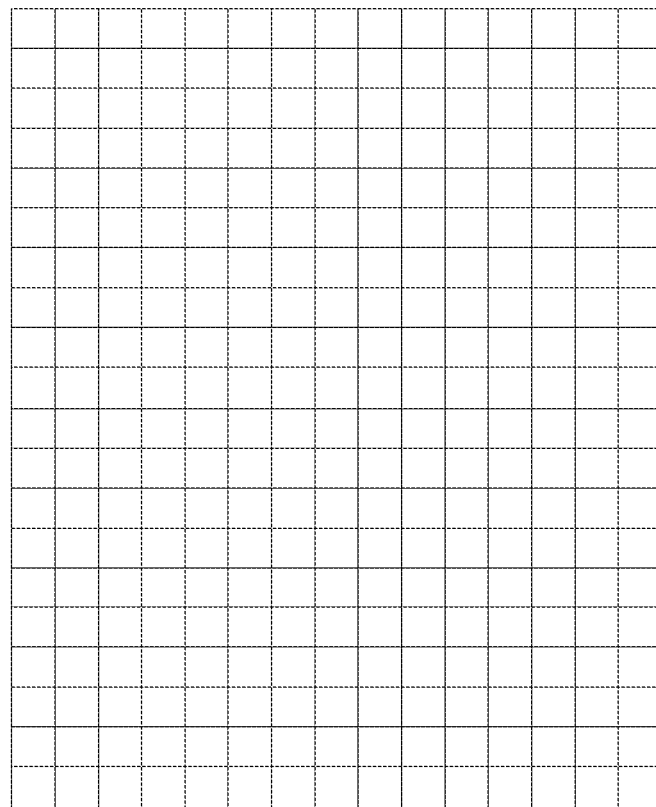
Figure 19J:
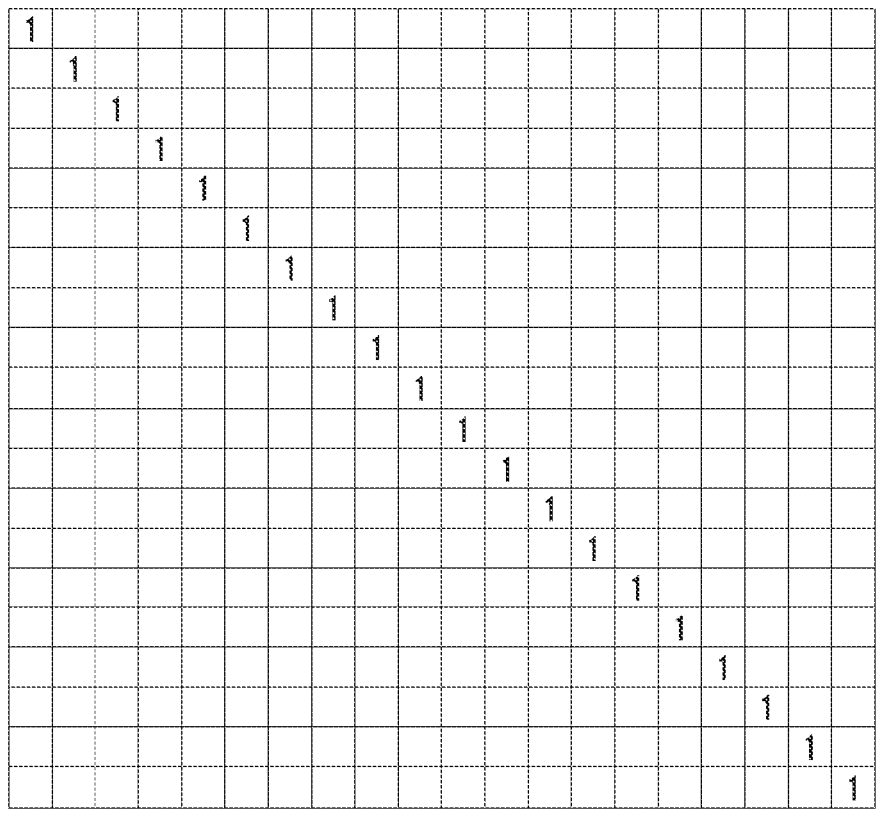
Figure 20A:
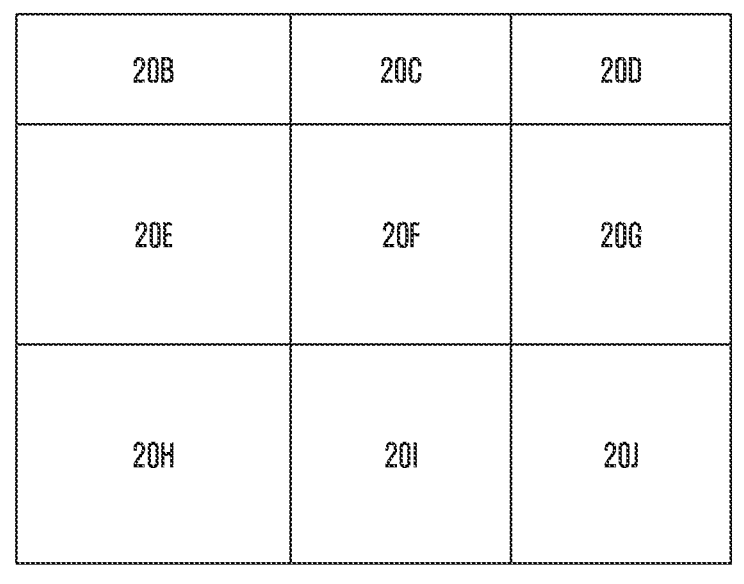
Figure 20C:
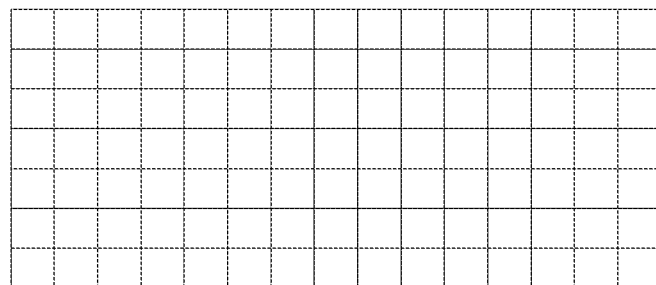
Figure 20D:
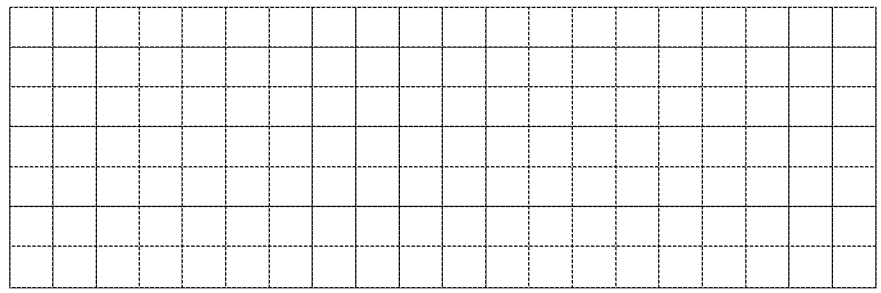
Figure 20F:
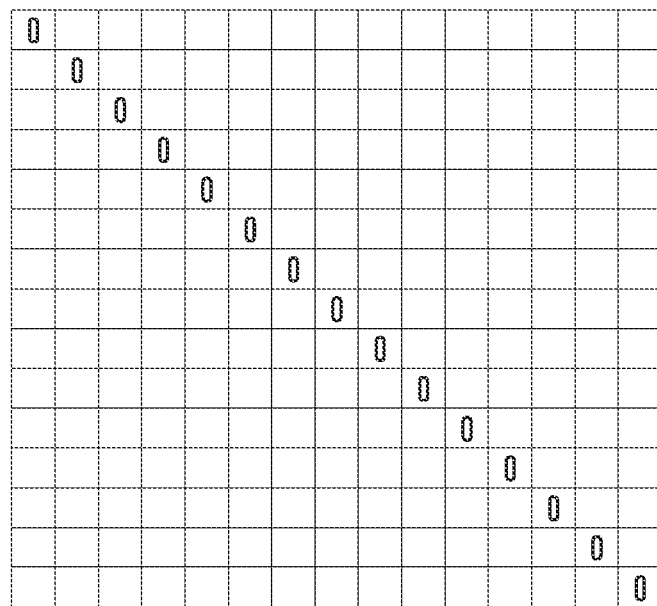
Figure 20G:
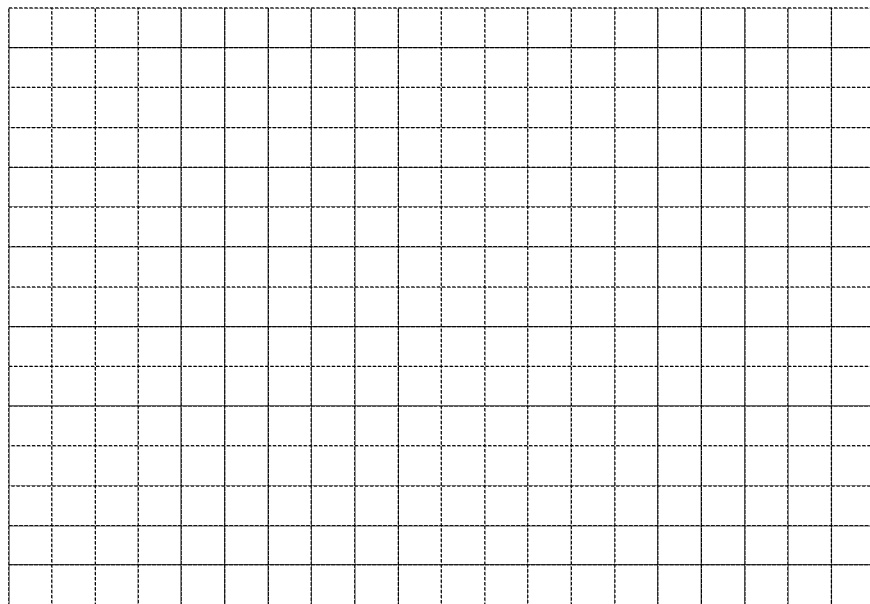
Figure 20I:
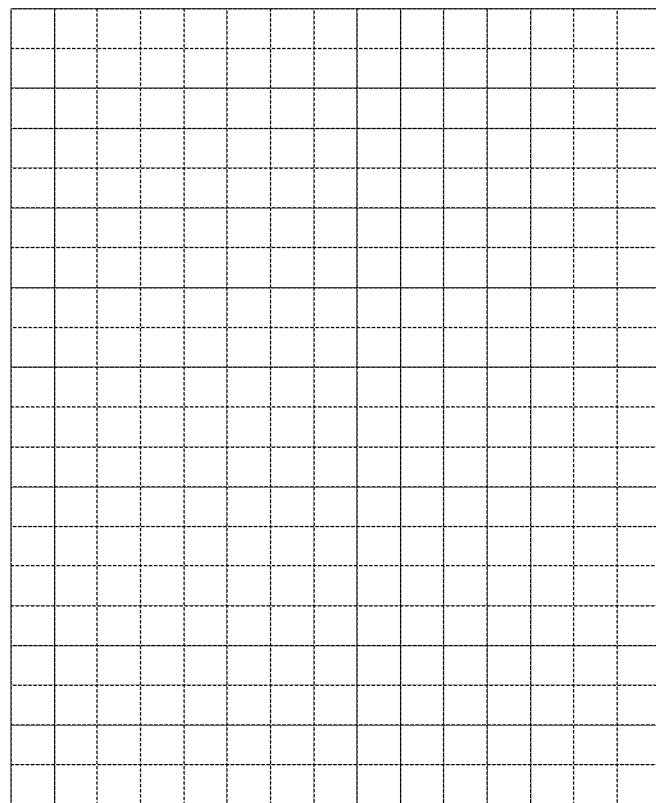
Figure 20J:
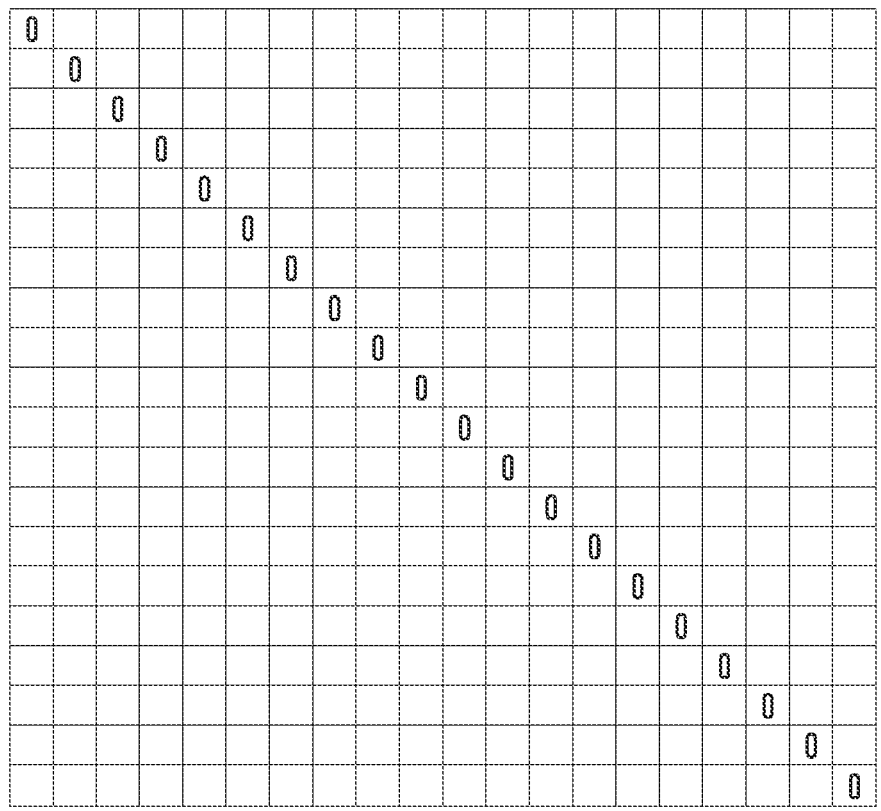
Figure 21A:
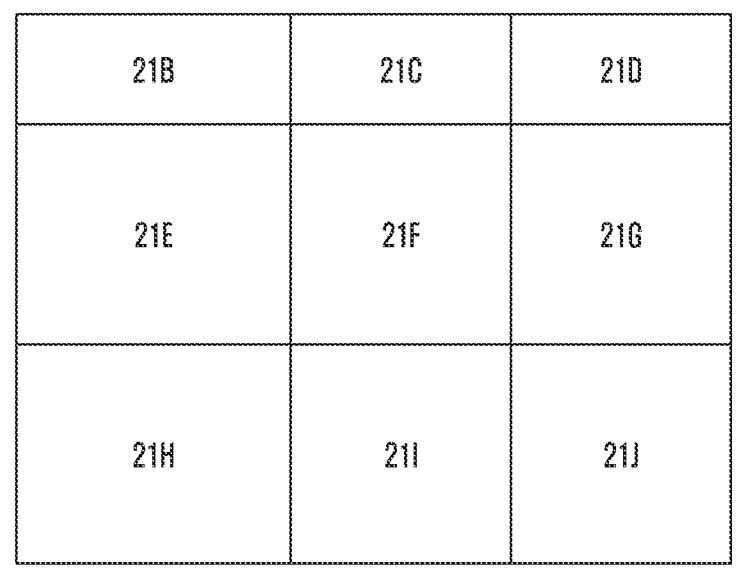

Various embodiments of the base matrix or exponential matrix corresponding to the parity check matrix of the LDPC code designed using the LDPC code design method proposed based on Equations 13 to 16 are shown in FIGS. 19A to 19J, 20A to 20J, and 21A. In the base matrix as shown in FIG. 19A, empty blocks denote entries of zero. In the exponential matrix as shown in FIGS. 20A and 21A, empty blocks denote portions corresponding to a zero matrix of Z×Z size and may be represented by a specific value, such as −1. The exponential matrices of the LDPC code shown in FIGS. 20A and 21A have the same base matrix.

FIGS. 19B to 19J are enlarged views illustrating respective portions divided from the base matrix shown in FIG. 19A. Reference numerals denoting respective portions in FIG. 19A indicate corresponding enlarged views of matrices. Therefore, a combination of FIGS. 19B to 19J is equal to one base matrix shown in FIG. 19A. Such descriptions may be similarly applied to the exponential matrices shown in FIGS. 20A and 21A. In the exponential matrices in FIGS. 20A and 21A, empty blocks denote portions corresponding to a zero matrix of Z×Z size.

FIGS. 20B to 20J are enlarged views showing respective portions divided from the exponential matrix shown in FIG. 20A. Reference numerals denoting respective portions in FIG. 20A indicate corresponding enlarged views of matrices. Therefore, a combination of FIGS. 20B to 20J is equal to one exponential matrix shown in FIG. 20A. In addition, FIGS. 21B to 21D show only some portions of FIG. 21A, which correspond to FIGS. 20B, 20E, and 20H, respectively. Although not shown, other portions of FIG. 21A are the same as FIGS. 20C, 20D, 20F, 20G, 20I, and 20J. Therefore, by combining FIGS. 21B to 21D with FIGS. 20C, 20D, 20F, 20G, 20I, and 20J, the new exponential matrix of FIG. 21A is obtained.

FIGS. 19A to 19J, 20A to 20J, and 21A to 21D are diagrams illustrating a base matrix or LDPC exponential matrix of a 42×52 size according to various embodiments of the disclosure.

Referring to FIGS. 19A to 19J, 20A to 20J, and 21A to 21D, in this base matrix or exponential matrix, a partial matrix formed of upper 4 rows and front 14 columns does not have a column of degree 1. For example, this means that the parity check matrix that can be generated by applying lifting to the above partial matrix does not have a column or column block having a degree of 1. In addition, the base matrix or exponential matrix shown in FIGS. 19A to 19J, 20A to 20J, and 21A to 21D has a feature that all columns from the 15th column to the 52nd column have a degree of 1. For example, the base matrix or exponential matrix of a 38×52 size including rows from the 5th row to the 42nd row in the exponential matrices corresponds to a single parity-check code.

The exponential matrices shown in FIGS. 20A and 21A correspond to the LDPC codes designed based on the block size groups defined in Equations 13 and 14. However, depending on the requirements of the system, it is not necessary to support all block sizes included in the block size groups. For reference, the exponential matrix of FIG. 20A is designed to correspond to the group Z1 or Z1' in Equation 13 or 14, and the exponential matrix of FIG. 21A is designed to correspond to the group Z7 or Z7' in Equation 13 or 14.

Depending on systems, the base matrix or exponential matrix as shown in FIGS. 19A to 19J, 20A to 20J, or 21A to 21D may be used as it is, or only a part thereof may be used. For example, in the base matrix or exponential matrix of FIGS. 19A to 19J, 20A to 20J, or 21A to 21D, a new exponential matrix may be generated to apply LDPC encoding and decoding by concatenating a partial matrix including upper 22 rows with another exponential matrix of a 20×52 size.

Similarly, in the base matrix or exponential matrix as shown in FIGS. 19A to 19J, 20A to 20J, or 21A to 21D, a new exponential matrix may be generated to perform LDPC encoding and decoding by concatenating a partial matrix including rows from the 23th row to the last row with another partial matrix of a 22×52 size.

Normally, a partial matrix formed by appropriately selecting rows and columns in the base matrix of FIGS. 19A to 19J may be applied as a new base matrix to perform the LDPC encoding and decoding. Likewise, a partial matrix formed by appropriately selecting rows and columns in the exponential matrix of FIGS. 20A to 20J or 21A to 21D may be applied as a new exponential matrix to perform the LDPC encoding and decoding. In addition, a new matrix formed by appropriately rearranging rows and columns in the base matrix of FIGS. 19A to 19J may be considered as the base matrix for the LDPC encoding and decoding. Likewise, a new matrix formed by appropriately rearranging rows and columns in the exponential matrix of FIGS. 20 A to 20J or 21A to 21D may be considered as the exponential matrix for the LDPC encoding and decoding.

In addition, the coding rate of the LDPC code may be adjusted by differently applying puncturing of codeword bits according to the coding rate. When parity bits corresponding to a column of degree 1 are punctured in the LDPC code based on the base matrix or exponential matrix shown in FIGS. 19A to 19J, 20A to 20J, or 21A to 21D, the LDPC decoder may perform decoding without using the corresponding portions in the parity check matrix. Therefore, there is an advantage of reducing the decoding complexity.

However, in case of considering the coding performance, there is a method for improving the performance of the LDPC codes by adjusting the puncturing order of parity bits or the transmission order of generated LDPC codeword.

For example, when information word bits corresponding to front two columns of the base matrix or exponential matrix corresponding to FIGS. 19A to 19J, 20A to 20J, or 21A to 21D are punctured and when all parity bits having a degree of 1 and corresponding to columns from the 18th column to the 52nd column are punctured, the LDPC codeword with a coding rate of 10/15 can be transmitted. Normally, the performance may be further improved by appropriately applying rate matching after generating the LDPC codeword by using the base matrix or exponential matrix corresponding to FIGS. 19A to 19J, 20A to 20J, or 21A to 21D. Of course, it is possible to apply to the LDPC encoding and decoding by appropriately rearranging the order of columns in the base matrix or exponential matrix based on the rate matching.

Typically, in the LDPC encoding process, the transmitter determines an input bit size (or a CBS) to which LDPC encoding will be applied, determines a block size (Z) to which the LDPC encoding will be applied, determines a suitable LDPC exponential matrix or sequence, and then performs the LDPC encoding based on the determined block size (Z) and the determined exponential matrix or LDPC sequence. In this case, the LDPC exponential matrix or sequence may be applied to the LDPC encoding without conversion, or be appropriately converted according to the block size (Z).

Similarly, in the LDPC decoding process, the receiver determines an input bit size (or a CBS) for a transmitted LDPC codeword, determines a block size (Z) to which LDPC decoding will be applied, determines a suitable LDPC exponential matrix or sequence, and performs the LDPC decoding based on the determined block size (Z) and the determined exponential matrix or LDPC sequence. In this case, the LDPC exponential matrix or sequence may be applied to the LDPC decoding without conversion, or be appropriately converted according to the block size (Z).

The base matrix shown in FIGS. 19A to 19J may be expressed in various forms. For example, it is possible to express the base matrix by using a sequence as shown in the following Equation 18. Equation 18 represents the positions of an entry 1 in each row of the base matrix of FIGS. 19A to 19J. For example, in Equation 18, the second value 3 of the second sequence means that an entry 1 exists at the second column of the second row in the base matrix. In this example, the starting order of entries in a sequence and a matrix is counted from zero.

0 1 2 3 6 9 10 11

0 3 4 5 6 7 8 9 11 12

0 1 3 4 8 10 12 13

1 2 4 5 6 7 8 9 10 13

0 1 11 14

0 1 5 7 11 15

0 5 7 9 11 16

1 5 7 11 13 17

0 1 12 18

1 8 10 11 19

0 1 6 7 20

0 79 13 21

1 3 11 22

0 1 8 13 23

1 6 11 13 24

0 10 11 25

1 9 11 12 26

1 5 11 12 27

0 6 7 28

0 1 10 29

1 4 11 30

0 8 13 31

1 2 32

0 3 5 33

1 2 9 34

0 5 35

27 12 13 36

0 6 37

1 2 5 38

0 4 39

2 5 7 9 40

1 13 41

0 5 12 42

2 7 10 43

0 12 13 44

1 5 11 45

0 2 7 46

10 13 47

1 5 11 48

0 7 12 49

2 10 13 50

1 5 11 51                                                    Equation 18

Similarly, the exponential matrix shown in FIGS. 20A to 20J or 21A to 21D may be expressed in various forms, for example, using a sequence as shown in the following Equation 19 or 20. Equation 19 or 20 represents entries in respective rows of the exponential matrix having a 42×52 size shown in FIGS. 20A to 20J or 21A to 21D. In the exponential matrix, a specific entry value (e.g., −1) corresponding to a zero matrix of Z×Z size may be excluded. For example, in Equation 19, the second value 251 of the second sequence means that an exponent value (or a circular shift values for bits) of the second circulant permutation matrix that does not correspond to the zero matrix of Z×Z size in the second row of the exponential matrix of FIGS. 20A to 20J is 251. In this example, the starting order of entries in a sequence and a matrix is counted from zero.

190 219 193 18 182 0 0 0

203 4 212 173 46 45 172 213 0 0

164 125 251 238 240 1 0 0

73 228 129 95 226 246 81 209 0 0

217 168 73 0

210 76 177 110 224 0

115 204 29 59 124 0

138 161 181 123 179 0

44 138 195 0

194 4 192 105 0

36 80 243 25 0

224 189 89 238 0

207 133 233 0

147 184 226 3 0

228 14 31 33 0

22 138 38 0

61 74 105 2 0

46 38 83 5 0

6 6 248 0

202 212 250 0

232 156 251 0

35 249 36 0

106 166 0

109 10 181 0

166 29 221 0

138 38 0

226 55 28 150 0

5 115 0

64 3 240 0

12 177 0

3 109 96 241 0

9 237 0

25 78 51 0

227 130 91 0

177 254 220 0

177 48 46 0

22 0 236 0

231 191 0

50 11 191 0

16 253 207 0

1 243 129 0

218 8 202 0

143 19 176 165 196 13 0 0

18 27 3 102 185 17 14 180 0 0

126 163 47 183 132 1 0 0

36 48 18 111 203 3 191 160 0 0

43 27 117 0

136 49 36 132 62 0

7 34 198 168 12 0

163 78 143 107 58 0

101 177 22 0

186 27 205 81 0

125 60 177 51 0

39 29 35 80

18 155 49 0

32 53 95 186 0

91 20 52 109 0

174 108 102 0

125 31 54 176 0

57 201 142 35 0

129 203 140 0

110 124 52 0

196 35 1140

10 122 23 0

202 126 0

52 170 13 0

113 161 88 0

197 194 0

164 172 49 161 0

168 193 0

Equation 19

14 186 46 0

50 27 0

70 17 50 60

115 189 0

110 0 163 0

206 97 136 0

81 29 108 0

95 207 46 0

82 57 48 0

74 20 0

15 42 49 0

47 96 174 0

62 24 167 0

52 18 49 0

Equation 20

Another embodiment of the exponential matrix corresponding to the parity check matrix of the LDPC code designed using the LDPC code design method proposed herein based on Equations 13 to 16 are shown in Equations 21 to 33.

Each of Equations 21 to 33 represents entries in respective rows of the exponential matrix having a 42×52 size. In Equation 21, the second value 245 of the second sequence means that an exponent value (or a circular shift values for bits) of the second circulant permutation matrix that does not correspond to the zero matrix of Z×Z size in the second row of the exponential matrix is 245. In this example, the starting order of entries in a sequence and a matrix is counted from zero.

232 76 250 10 132 221 0 0

107 126 62 99 50 55 191 232 0 0

90 136 245 64 102 1 0 0

197 224 243 140 70 179 5 8 0 0

64 18 247 0

154 219 164 94 196 0

135 204 53 59 98 0

210 253 103 110 255 0

200 222 113 0

83 18 101 108 0

122 157 203 107 0

190 149 5 218 0

38 58 233 0

118 68 40 245 0

68 67 79 243 0

14 227 39 0

38 244 16 7 0

114 156 1 38 0

167 136 204 0

201 215 180 0

75 194 58 0

217 37 246 0

190 58 0

44 200 147 0

129 241 254 0

47 197 0

121 14 51 18 0

19 208 0

229 191 155 0

197 138 0

104 95 50 234 0

57 233 0

218 21 61 0

247 237 45 0

196 171 212 0

254 72 150 0

212 226 188 0

204 219 0

214 175 77 0

47 195 245 0

24 81 134 0

40 6 112 0

161 9 186 186 19 47 0 0

58 33 144 176 176 120 186 70 0 0

188 23 75 11 176 1 0 0

147 25 181 40 44 189 20 19 0 0

139 20 166 0

163 39 38 114 156 0

35 180 123 0 149 0

81 134 172 76 145 0

124 113 13 0

177 183 93 109 0

Equation 21

15 50 184 22 0

6 114 190 161 0

189 159 128 0

110 28 100 33 0

27 188 27 161 0

158 17 14 0

142 153 129 44 0

139 181 112 67 0

177 20 62 0

185 152 145 0

158 46 171 0

21 33 9 0

90 8 0

102 190 18 0

66 13 181 0

145 45 0

135 55 186 157 0

44 125 0

130 145 104 0

20 181 0

148 170 14 162 0

67 5 0

173 94 122 0

144 29 177 0

85 46 175 0

145 77 87 0

55 189 159 0

124 14 0

63 130 32 0

54 25 125 0

45 144 29 0

149 187 148 0

142 18 38 127 4 16 0 0

108 126 85 134 106 135 10 22 0 0

17 1 94 140 119 1 0 0

14 127 57 85 37 115 108 18 0 0

151 12 136 0

Equation 22

12 127 122 158 72 0

128 6 46 146 121 0

149 120 13 29 53 0

48 126 58 0

59 24 37 50 0

110 147 20 116 0

56 151 133 37 0

25 81 133 0

48 114 94 2 0

113 142 17 13 0

56 146 137 0

91 33 26 37 0

59 99 121 39 0

147 150 13 0

109 54 31 0

142 0 3 0

155 138 97 0

80 17 0

12 44 25 0

157 63 158 0

23 70 0

151 65 45 9 0

85 125 0

33 141 130 0

37 42 0

137 39 144 154 0

46 133 0

153 84 6 0

73 48 156 0

126 110 24 0

1 125 38 0

119 4 63 0

7 26 89 0

50 41 118 0

109 136 126 0

150 42 1060

86 13 182 141 23 143 0 0

53 55 214 6 39 41 18 21 0 0

65 105 49 176 95 1 0 0

168 221 173 86 18 55 180 170 0 0

106 2 92 0

169 20 151 21 209 0

179 159 203 48 138 0

182 35 209 22 213 0

26 114 158 0

211 191 217 1 0

134 99 62 53 0

1 8 38 0 0

70 25 23 0

25 149 37 18 0

63 31 0 214 0

7 108 8 0

201 201 142 167 0

63 52 215 125 0

86 122 27 0

31 92 66 0

92 222 41 0

74 219 169 0

114 2 0

78 103 223 0

96 214 196 0

173 184 0

87 208 24 75 0

20 130 0

189 25 168 0

38 60 0

188 174 6 51 0

58 196 0

73 197 180 0

170 108 198 0

110 190 192 0

9 213 158 0

31 19 128 0

188 223 0

Equation 23

183 210 169 0

8 91 109 0

4 184 149 0

134 42 218 0 Equation 24

17 102 80 5 75 59 0 0

26 69 46 53 54 115 68 36 0 0

95 71 116 30 2 1 0 0

59 52 16 137 27 96 75 129 0 0

79 103 15 0

129 24 39 28 23 0

138 100 127 117 42 0

42 31 17 115 16 0

116 88 112 0

100 119 25 40 0

97 122 9 136 0

8 143 134 110 0

12 78 15 0

73 96 21 143 0

26 106 102 53 0

110 56 37 0

95 66 91 95 0

19 123 90 71 0

54 124 9 0

62 24 54 0

123 40 38 0

116 143 5 0

42 120 0

15 10 28 0

11 27 54 0

122 143 0

1 136 143 23 0

39 87 0

31 46 14 0

137 104 0

134 58 104 52 0

101 13 0

86 103 108 0

135 16 130 0

95 82 97 0

72 97 113 0

58 66 86 0

96 50 0

115 131 10 0

74 111 71 0

105 32 131 0

133 101 3 0 Equation 25

156 143 14 3 40 123 0 0

1765 63 1 55 37 171 133 0 0

98 168 107 82 142 1 0 0

53 174 174 127 17 89 17 105 0 0

86 67 83 0

79 84 35 103 60 0

47 154 10 155 29 0

48 125 24 47 55 0

53 31 161 0

104 142 99 64 0

111 25 174 23 0

91 175 24 141 0

122 11 4 0

29 91 27 127 0

11 145 8 166 0

137 103 40 0

78 158 17 165 0

134 23 62 163 0

173 31 22 0

13 135 145 0

128 52 173 0

156 166 40 0

18 163 0

110 132 150 0

113 108 61 0

72 136 0

36 38 53 145 0

42 104 0

64 24 149 0

139 161 0

84 173 93 29 0

117 148 0

116 73 142 0

105 137 29 0

11 41 162 0

126 152 172 0

73 154 129 0

167 38 0

112 7 19 0

109 6 105 0

160 156 82 0

132 6 8 0

9 148 1 184 37 148 0 0

185 20 39 130 203 111 39 1 0 0

86 16 192 119 74 1 0 0

126 107 156 113 199 166 90 790 0

60 3 10 0

117 184 61 70 49 0

37 99 64 39 174 0

120 48 18 51 29 0

33 118 175 0

23 64 170 119 0

145 86 185 127 0

131 20 140 194 0

34 185 174 0

78 107 55 34 0

185 167 59 48 0

91 10 152 0

45 198 138 186 0

182 42 135 21 0

28 100 37 0

187 96 181 0

61 181 161 0

123 186 35 0

54 197 0

Equation 26

33 27 50 0

160 203 74 0

193 98 0

84 178 100 17 0

28 138 0

130 120 171 0

12 2 0

77 160 173 57 0

49 63 0

136 189 190 0

168 181 198 0

206 58 101 0

185 157 132 0

58 7 157 0

39 205 0

79 98 187 0

37 50 189 0

18 4 94 0

161 55 154 0

75 22 197 27 180 215 0 0

218 22 129 161 189 201 30 81 0 0

35 3 198 212 79 1 0 0

53 80 103 62 176 50 189 140 0 0

239 198 124 0

96 87 178 212 23 0

150 34 90 144 214 0

166 108 177 107 30 0

68 129 40 0

158 6 219 78 0

51 44 124 22 0

67 108 154 226 0

46 0 194 0

100 2 172 231 0

117 40 75 230 0

227 168 140 0

233 94 202 92 0

90 53 167 188 0

Equation 27

111 45 175 0

25 171 182 0

1 238 132 0

170 118 235 0

182 95 0

103 20 228 0

238 150 216 0

83 53 0

54 132 22 230 0

47 181 0

30 146 206 0

215 227 0

99 20 227 235 0

232 157 0

228 158 29 0

194 213 189 0

208 191 163 0

181 185 158 0

199 223 4 0

196 52 0

86 46 8 0

187 1 139 0

8 216 65 0

149 162 26 0

161 201 378 378 211 239 0 0

58 225 144 176 176 120 378 262 0 0

380 23 75 203 176 1 0 0

147 25 181 232 44 189 20 211 0 0

139 212 358 0

163 39 38 306 348 0

35 372 123 0 149 0

273 326 172 268 337 0

124 305 205 0

369 375 93 109 0

15 242 184 214 0

6 114 190 353 0

189 159 320 0

Equation 28

302 220 292 33 0

27 188 27 161 0

158 209 14 0

142 345 321 236 0

331 181 112 67 0

177 20 254 0

185 344 337 0

158 46 171 0

21 33 9 0

90 200 0

102 190 210 0

66 205 181 0

145 45 0

327 247 378 349 0

44 125 0

322 145 296 0

20 373 0

340 362 206 354 0

67 5 0

365 286 314 0

144 221 369 0

277 46 175 0

337 269 87 0

247 381 351 0

124 206 0

255 130 32 0

246 25 125 0

237 336 221 0

149 187 148 0

302 18 198 287 164 16 0 0

268 286 85 134 106 295 170 182 0 0

177 161 254 140 119 1 0 0

174 127 217 245 37 275 108 178 0 0

151 172 296 0

12 127 122 318 232 0

128 166 46 306 281 0

149 280 13 189 213 0

Equation 29

48 126 58 0

219 24 37 50 0

270 307 20 276 0

216 151 133 37 0

185 81 293 0

48 114 254 2 0

113 302 17 173 0

56 146 297 0

91 193 26 37 0

59 259 281 39 0

307 310 173 0

269 214 191 0

302 0 3 0

315 138 257 0

80 177 0

12 44 185 0

157 223 158 0

23 70 0

311 225 205 169 0

85 125 0

193 141 290 0

37 202 0

297 199 304 314 0

46 133 0

313 244 166 0

73 208 316 0

286 110 24 0

161 285 38 0

279 164 223 0

156 270 0

167 186 89 0

210 41 118 0

269 296 286 0

150 42 106 0

161 102 224 149 219 59 0 0

26 213 46 53 54 259 212 180 0 0

239 71 260 1742 1 0 0

203 52 16 137 27 240 219 273 0 0

79 103 15 0

273 168 39 172 167 0

138 244 271 261 186 0

186 31 17 115 16 0

116 88 256 0

244 119 25 40 0

97 122 9 280 0

152 143 134 110 0

12 78 159 0

73 96 165 143 0

26 250 102 53 0

110 56 181 0

95 66 235 239 0

19 123 90 71 0

198 124 9 0

206 168 198 0

123 40 38 0

116 143 149 0

42 264 0

15 10 28 0

11 171 54 0

122 143 0

145 280 143 23 0

39 87 0

175 46 158 0

137 248 0

278 202 248 196 0

101 13 0

230 247 252 0

135 160 274 0

239 226 97 0

72 241 113 0

202 210 86 0

96 194 0

115 275 10 0

74 111 71 0

Equation 30

249 176 275 0

133 101 147 0

332 143 190 3 216 299 0 0

193 65 63 1 231 37 171 309 0 0

274 168 283 258 142 1 0 0

229 174 174 303 17265 193 281 0 0

262 243 259 0

79 260 35 279 236 0

223 330 10 331 205 0

48 125 200 223 55 0

229 207 337 0

280 142 99 240 0

111 25 174 199 0

91 175 24 317 0

298 11 4 0

29 91 203 303 0

11 321 8 342 0

137 279 40 0

78 334 17 165 0

310 199 62 163 0

173 31 198 0

189 135 321 0

128 52 173 0

332 166 40 0

18 339 0

110 132 326 0

113 284 61 0

72 312 0

212 214 229 321 0

42 104 0

64 24 325 0

139 337 0

260 349 269 205 0

117 148 0

292 249 318 0

105 313 205 0

187 41 162 0

Equation 31

302 328 172 0

249 330 305 0

167 214 0

288 7 195 0

285 6 105 0

336 332 258 0

132 6 8 0

195 175 20 165 92 203 0 0

18 131 159 206 81 121 165 171 0 0

126 59 99 79 39 1 0 0

36 204 70 59 99 159 114 173 0 0

147 27 13 0

84 101 140 80 114 0

111 86 198 81 64 0

7 130 91 3 6

49 125 22

186 75 205 81

177 60 21 103

195 29 185 164

174 51 49

84 1 53 134

39 176 104 5

122 4 154

125 9 106 176

57 201 194 35

77 47 88

58 72 0

144 191 166

10 135 127

98 178

156 118 65

61 57 36

145 38

112 172 101 5

168 89

118 186 202

102 79

Equation 32

$$
\begin{array}{l}
122\ 17\ 154\ 163 \\
\\
11\ 33 \\
\\
162\ 156\ 59 \\
\\
59\ 17\ 179 \\
\\
41\ 128\ 17 \\
\\
7\ 175\ 75 \\
\\
187\ 156\ 24 \\
\\
168\ 78\ 109 \\
\\
26\ 73\ 87 \\
\\
55\ 34\ 207 \\
\\
114\ 161\ 189
\end{array}
\qquad \text{Equation 33}
$$

The exponential matrix of Equation 21 is optimized to fit a block size corresponding to a group Z1 or Z1' or a subset thereof in Equation 13 or 14, and is defined to provide better performance when Z=256 is set to the maximum value.

The exponential matrix of Equation 22 is optimized to fit a block size corresponding to a group Z2 or Z2' or a subset thereof in Equation 13 or 14, and is defined to provide better performance when Z=192 is set to the maximum value.

The exponential matrix of Equation 23 is optimized to fit a block size corresponding to a group Z3 or Z3' or a subset thereof in in Equation 13 or 14, and is defined to provide better performance when Z=160 is set to the maximum value.

The exponential matrix of Equation 24 is optimized to fit a block size corresponding to a group Z4 or Z4' or a subset thereof in in Equation 13 or 14, and is defined to provide better performance when Z=224 is set to the maximum value.

The exponential matrix of Equation 25 is optimized to fit a block size corresponding to a group Z5 or Z5' or a subset thereof in in Equation 13 or 14, and is defined to provide better performance when Z=144 is set to the maximum value.

The exponential matrix of Equation 26 is optimized to fit a block size corresponding to a group Z6 or Z6' or a subset thereof in in Equation 13 or 14, and is defined to provide better performance when Z=176 is set to the maximum value.

The exponential matrix of Equation 27 is optimized to fit a block size corresponding to a group Z7 or Z7' or a subset thereof in in Equation 13 or 14, and is defined to provide better performance when Z=208 is set to the maximum value.

The exponential matrix of Equation 28 is optimized to fit a block size corresponding to a group Z8 or Z8' or a subset thereof in in Equation 13 or 14, and is defined to provide better performance when Z=240 is set to the maximum value.

The exponential matrix of Equation 29 is optimized to fit a block size corresponding to a group Z2 or Z2' or a subset thereof in in Equation 13 or 14, and is defined to provide better performance when Z=384 is set to the maximum value. It can be seen that the feature of the exponential matrix of Equation 29 is that the same exponential matrix as Equation 22 is generated through modulo operation of Equation 16 for the block size 192.

The exponential matrix of Equation 30 is optimized to fit a block size corresponding to a group Z3 or Z3' or a subset thereof in in Equation 13 or 14, and is defined to provide better performance when Z=320 is set to the maximum value. It can be seen that the feature of the exponential matrix of Equation 30 is that the same exponential matrix as Equation 23 is generated through modulo operation of Equation 16 for the block size 160.

The exponential matrix of Equation 31 is optimized to fit a block size corresponding to a group Z5 or Z5' or a subset thereof in in Equation 13 or 14, and is defined to provide better performance when Z=288 is set to the maximum value. It can be seen that the feature of the exponential matrix of Equation 31 is that the same exponential matrix as Equation 25 is generated through modulo operation of Equation 16 for the block size 144.

The exponential matrix of Equation 32 is optimized to fit a block size corresponding to a group Z6 or Z6' or a subset thereof in in Equation 13 or 14, and is defined to provide better performance when Z=352 is set to the maximum value. It can be seen that the feature of the exponential matrix of Equation 32 is that the same exponential matrix as Equation 26 is generated through modulo operation of Equation 16 for the block size 176.

The exponential matrix of Equation 33 is optimized to fit a block size corresponding to a group Z7 or Z7' or a subset thereof in in Equation 13 or 14, and is defined to provide better performance when Z=208 is set to the maximum value. For reference, the exponential matrix of Equation 33 has the same design parameter as the exponential matrix of Equation 27. However, such exponential matrices are derived by slightly changing the BLER value required for design or the minimum SNR requiring a specific performance.

Examples of representing the sequences of the above Equations as the exponential matrix are shown in FIGS. 22A to 22D and 23A to 23D.

FIGS. 22A, 22B, 22C, and 22D are diagrams illustrating an LDPC code exponential matrix according to various embodiments of the disclosure.

FIGS. 23A, 23B, 23C, and 23D are diagrams illustrating an LDPC code exponential matrix according to various embodiments of the disclosure.

Referring to FIGS. 22A to 22D and 23A to 23D, empty blocks denote portions corresponding to a zero matrix of Z×Z size and may be represented by a specific value, such as −1. The exponential matrices of the LDPC code shown in FIGS. 22A to 22D and 23A to 23D have the same base matrix as that of FIGS. 19A to 19J.

Figure 22A:
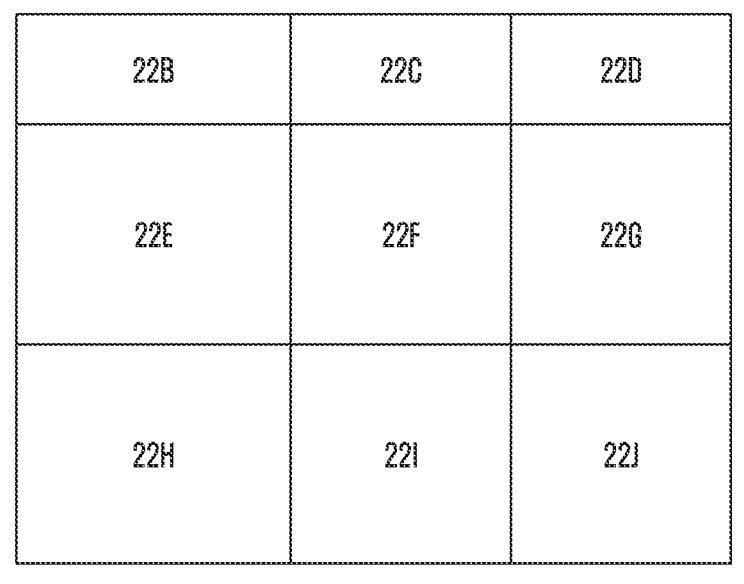
Figure 23A:
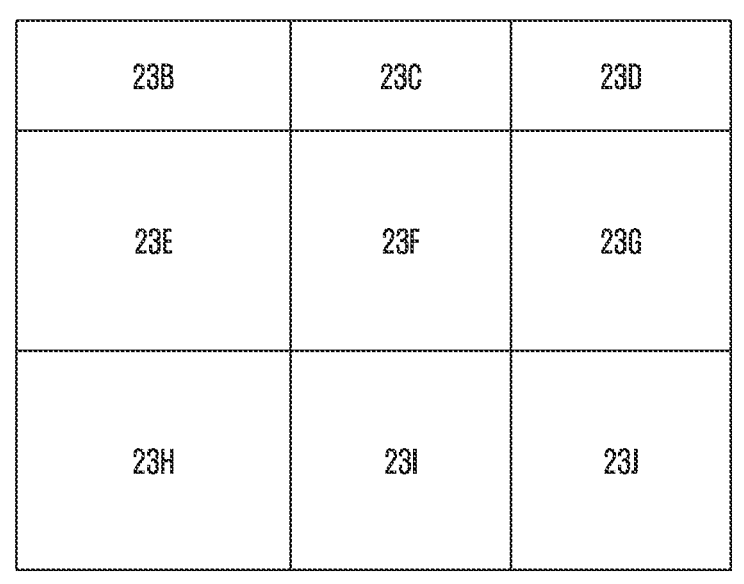

FIGS. 22B to 22D show only some portions of FIG. 22A, which correspond to FIGS. 20B, 20E, and 20H, respectively. Although not shown, other portions of FIG. 22A are the same as FIGS. 20C, 20D, 20F, 20G, 20I, and 20J. Therefore, by combining FIGS. 22B to 22D with FIGS. 20C, 20D, 20F, 20G, 20I, and 20J, the new exponential matrix of FIG. 22A is obtained. Similarly, FIGS. 23B to 23D show only some portions of FIG. 23A, which correspond to FIGS. 20B, 20E, and 20H, respectively. Although not shown, other portions of FIG. 23A are the same as FIGS. 20C, 20D, 20F, 20G, 20I, and 20J. Therefore, by combining FIGS. 23B to 23D with FIGS. 20C, 20D, 20F, 20G, 20I, and 20J, the new exponential matrix of FIG. 23A is obtained.

Like the LDPC exponential matrices shown in FIGS. 20A to 20J and 21A to 21D, when parity bits corresponding to a column of degree 1 are punctured in the LDPC codes based on the exponential matrices shown in FIGS. 22A to 22D and 23A to 23D or Equation 21 to 33, the LDPC decoder may perform decoding without using the corresponding portions in the parity check matrix. Therefore, there is an advantage of reducing the decoding complexity. However, in case of considering the coding performance, there is a method for improving the performance of the LDPC codes by adjusting the puncturing order of parity bits or the transmission order of generated LDPC codeword.

Generally, the performance may be further improved by appropriately applying rate matching after generating the LDPC codeword by using the base matrix and exponential matrix corresponding to FIGS. 19A to 19J, 20A to 20J, 21A to 21D, 22A to 22D, and 23A to 23D or Equations 18 to 33. The rate matching may include interleaving of codeword bits. Of course, it is possible to apply to the LDPC encoding and decoding by appropriately rearranging the order of columns in the base matrix or exponential matrix based on the rate matching.

As another method for expressing the base matrix or exponential matrix of FIGS. 19A to 19J, 20A to 20J, 21A to 21D, 22A to 22D, and 23A to 23D or Equations 18 to 33, there is a method for representing the positions or values of entries of each matrix by each column. If there is a certain rule for a part of a matrix, such as the base matrix or exponential matrix of FIGS. 19A to 19J, 20A to 20J, 21A to 21D, 22A to 22D, and 23A to 23D or Equations 18 to 33, the base matrix or exponential matrix may be expressed more simply. For example, in case where columns from the 15th column (or column block) to the last column (or column block) have a diagonal structure like the base matrix or exponential matrix of FIGS. 19A to 19J, 20A to 20J, 21A to 21D, 22A to 22D, and 23A to 23D or Equations 18 to 33, the positions of entries or their exponent values may be omitted on the assumption that the transmitting and receiving apparatuses know this rule.

As described above, the base matrix and exponential matrix may be expressed in various ways. If permutation of column or row is applied in the base matrix or exponential matrix, the same expression is possible by appropriately changing the positions of sequences or of numbers in the sequence in Equations 18 to 33.

An example of a converted exponential matrix that can be obtained through permutation of columns or rows in a given exponential matrix is shown in FIGS. 24A to 24D.

FIGS. 24A, 24B, 24C, and 24D are diagrams illustrating an LDPC code exponential matrix according to various embodiments of the disclosure.

Figure 24A:
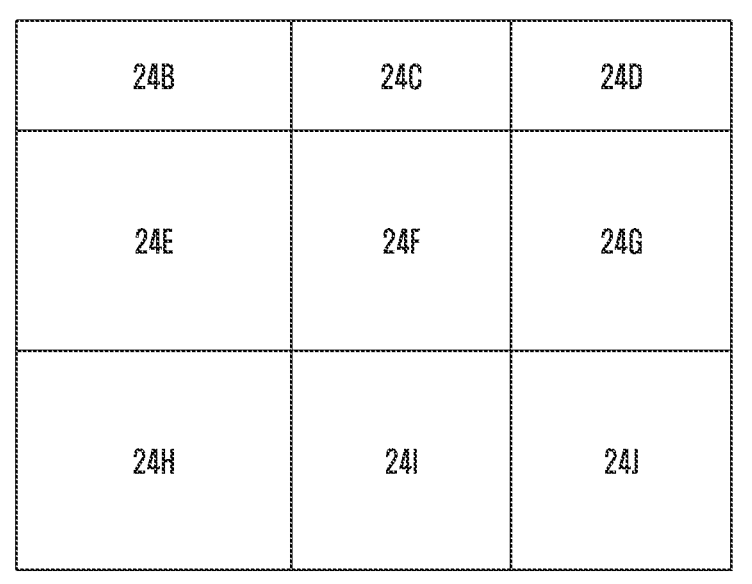

Referring to FIGS. 24 A to 24D, the exponential matrix is obtained by adding 11 to all the exponent values (or shift values) included in the second column block of the exponential matrix corresponding to Equation 33, subtracting 7 from the exponent values included in the fourth column block, adding 53 to the exponent values included in the seventh column block, adding 32 to the exponent values included in the 12th row block, and subtracting 25 from the exponent values included in the 24th row block. This method of adding or subtracting a predetermined integer value to or from exponent values included in the same column block or row block is a method for simply rearranging columns or rows in a parity check matrix having a quasi-cyclic structure. In this case, the values of B, C, E, F, H, and I portions in FIG. 24A are fixed to 0 without change. This is because such portions are including columns having a degree of 1 and thereby the column can always be rearranged properly to have the exponent value of zero without a change of logarithmic nature of the code.

As in the exponential matrices of Equations 21 to 33, the exponential matrix of FIGS. 24A to 24D may also be expressed using a sequence as shown in Equation 34.

195 175 31 165 92 203 0 0

18 131 152 206 81 174 165 171 0 0

126 59 99 72 39 1 0 0

36 215 63 59 99 4 114 173 0 0

147 27 13 0

84 101 140 133 114 0

111 86 43 81 64 0

7 130 144 3 6

49 125 22

186 75 205 81

177 60 21 156

195 82 185 164

206 83 81

84 1 53 134

39 176 104 5

122 4 154

125 9 106 176

57 201 194 35

77 47 141

58 72 0

144 184 166

10 135 127

98 189

156 118 65

36 43 11

145 38

123 17 101 5

168 89

118 197 202

102 72

133 17 207 163

11 33

162 156 59

70 70 179

41 128 17

$$\begin{array}{l}
7\ 175\ 75\\
187\ 167\ 77\\
81\ 122\\
168\ 78\ 109\\
26\ 126\ 87\\
66\ 34\ 207\\
114\ 161\ 189
\end{array}\quad\text{Equation 34}$$

It should be noted that a partial matrix formed by appropriately selecting rows and columns from the base matrix and exponential matrix of FIGS. 19A to 19J, 20A to 20J, 21A to 21D, 22A to 22D, 23A to 23D, and 24A to 24D can be applied to a new base matrix and exponential matrix and used in the LDPC encoding and decoding methods and apparatuses.

In addition, depending on systems, the base matrix and the exponential matrix as shown in FIGS. 19A to 19J, 20A to 20J, 21A to 21D, 22A to 22D, 23A to 23D, and 24A to 24D or Equations 18 to 34 may be used as they are, or only a part thereof may be used. For example, a new base matrix or exponential matrix may be generated to apply LDPC encoding and decoding by concatenating partial matrices including upper 25 rows in the above matrices with another base matrix or exponential matrix of a 21×68 size corresponding to single parity-check codes. For reference, FIGS. 19A to 19F may form a single partial matrix, and portions A to F of FIGS. 20A to 20J, 21A to 21D, 22A to 22D, 23A to 23D, and 24A may form the partial matrix. This is, however, is not construed as a limitation.

FIGS. 25A, 25B, 25C, and 25D are diagrams illustrating an LDPC code exponential matrix according to various embodiments of the disclosure.

Referring to FIGS. 25A, 25B, 25C, and 25D, the exponential matrix is formed by suitably changing the lower nine rows in the exponential matrix of Equation 33 while leaving the upper 33 rows. The nine changed rows in FIGS. 25A to 25D are not designed to be optimized for the upper 33 rows of the exponential matrix of Equation 33. However, the performance of the system is not significantly deteriorated even if rows are suitably changed according to the purpose of the system. However, when too many rows are changed without considering the optimization process, system performance may be degraded.

As in the exponential matrices of Equations 21 to 34, the exponential matrix of FIGS. 25A to 25D may also be expressed using a sequence as shown in Equation 35.

$$\begin{array}{l}
195\ 175\ 20\ 165\ 92\ 203\ 0\ 0\\
18\ 131\ 159\ 206\ 81\ 121\ 165\ 171\ 0\ 0\\
126\ 59\ 99\ 79\ 39\ 1\ 0\ 0\\
36\ 204\ 70\ 59\ 99\ 159\ 114\ 173\ 0\ 0\\
147\ 27\ 13\ 0\\
84\ 101\ 140\ 80\ 114\ 0\\
111\ 86\ 198\ 81\ 64\ 0\\
7\ 130\ 91\ 3\ 6\\
49\ 125\ 22\\
186\ 75\ 205\ 81\\
177\ 60\ 21\ 103\\
195\ 29\ 185\ 164\\
174\ 51\ 49\\
84\ 1\ 53\ 134\\
39\ 176\ 104\ 5\\
122\ 4\ 154\\
125\ 9\ 106\ 176\\
57\ 201\ 194\ 35\\
77\ 47\ 88\\
58\ 72\ 0\\
144\ 191\ 166\\
10\ 135\ 127\\
98\ 178\\
156\ 118\ 65\\
61\ 57\ 36\\
145\ 38\\
112\ 172\ 101\ 5\\
168\ 89\\
118\ 186\ 202\\
102\ 79\\
122\ 17\ 154\ 163\\
11\ 33\\
162\ 156\ 59\\
163\ 173\ 179\\
197\ 191\ 193\\
157\ 167\ 181\\
197\ 167\ 179\\
181\ 193\\
157\ 173\ 191\\
181\ 157\ 173\\
193\ 163\ 179\\
191\ 197\ 167
\end{array}\quad\text{Equation 35}$$

The parity check matrix of the LDPC code defined by the base matrix and the exponential matrix shown in FIGS. 19A to 19J, 20A to 20J, 21A to 21D, 22A to 22D, 23A to 23D, 24A to 24D, and 25A to 25D may be considered as corresponding to single parity-check codes having a 38×52 size partial matrix consisting of 38 rows from the bottom. This parity check matrix that applies a concatenation scheme with single parity-check codes is easy of expandability, thus being advantageous in applying the IR technique. Because the IR technique is important for supporting the HARQ, the efficient and high-performance IR technique increases the efficiency of the HARQ system. The LDPC codes based on the parity check matrices may apply the efficient and high-performance IR technique by generating and transmitting a new parity using a portion expanded from a single parity-check code.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a transmitter in a communication system, the method comprising:
    identifying a code block by a segmentation of a transport block based on a code block size, wherein a block size Z is associated with the code block size;
    identifying a parity check matrix H based on the block size Z, a shift value sequence corresponding to the block size, and a base matrix;
    performing a low density parity check (LDPC) encoding on the code block based on the parity check matrix H; and
    transmitting at least a part of the encoded code block to a receiver,
    wherein the block size Z is identified as one of 13 and multiples of 13, and
    wherein the shift value sequence includes following values:
        143, 19, 176, 165, 196, 13, 0, and 0 corresponding to a row of the base matrix,
        18, 27, 3, 102, 185, 17, 14, 180, 0, and 0 corresponding to a row of the base matrix,
        126, 163, 47, 183, 132, 1, 0, and 0 corresponding to a row of the base matrix,
        36, 48, 18, 111, 203, 3, 191, 160, 0, and 0 corresponding to a row of the base matrix,
        43, 27, 117, and 0 corresponding to a row of the base matrix,
        136, 49, 36, 132, 62, and 0 corresponding to a row of the base matrix,
        7, 34, 198, 168, 12, and 0 corresponding to a row of the base matrix,
        163, 78, 143, 107, 58, and 0 corresponding to a row of the base matrix,
        101, 177, 22, and 0 corresponding to a row of the base matrix,
        186, 27, 205, 81, and 0 corresponding to a row of the base matrix,
        125, 60, 177, 51, and 0 corresponding to a row of the base matrix,
        39, 29, 35, 8, and 0 corresponding to a row of the base matrix,
        18, 155, 49, and 0 corresponding to a row of the base matrix,
        32, 53, 95, 186, and 0 corresponding to a row of the base matrix,
        91, 20, 52, 109, and 0 corresponding to a row of the base matrix,
        174, 108, 102, and 0 corresponding to a row of the base matrix,
        125, 31, 54, 176, and 0 corresponding to a row of the base matrix,
        57, 201, 142, 35, and 0 corresponding to a row of the base matrix,
        129, 203, 140, and 0 corresponding to a row of the base matrix,
        110, 124, 52, and 0 corresponding to a row of the base matrix,
        196, 35, 114, and 0 corresponding to a row of the base matrix,
        10, 122, 23, and 0 corresponding to a row of the base matrix,
        202, 126, and 0 corresponding to a row of the base matrix,
        52, 170, 13, and 0 corresponding to a row of the base matrix,
        113, 161, 88, and 0 corresponding to a row of the base matrix,
        197, 194, and 0 corresponding to a row of the base matrix,
        164, 172, 49, 161, and 0 corresponding to a row of the base matrix,
        168, 193, and 0 corresponding to a row of the base matrix,
        14, 186, 46, and 0 corresponding to a row of the base matrix,
        50, 27, and 0 corresponding to a row of the base matrix,
        70, 17, 50, 6, and 0 corresponding to a row of the base matrix,
        115, 189, and 0 corresponding to a row of the base matrix, and
        110, 0, 163, and 0 corresponding to a row of the base matrix.

2. The method of claim 1, wherein the block size Z is identified as one of block sizes in a block size group including 13, 26, 52, 104 or 208.

3. The method of claim 1,
    wherein the parity check matrix H is identified by replacing 1s in the base matrix by circular shifted identity matrices of size Z×Z according to each of circular shift values, and by replacing 0s in the base matrix by 0-matrices of size Z×Z, and
    wherein the circular shift values are obtained based on a modulo operation using values of the shift value sequence and the block size Z.

4. The method of claim 1,
    wherein a part of the code block is not included in the encoded code block, and
    wherein a length of the part of the code block is 2×Z.

5. The method of claim 1, wherein the base matrix corresponds to a base matrix of size 42×52.

6. A method performed by a receiver in a communication system, the method comprising:
    identifying a block size Z, and a shift value sequence corresponding to the block size Z;
    identifying a parity check matrix H based on the block size Z, the shift value sequence, and a base matrix; and
    performing a low density parity check (LDPC) decoding on at least a part of a demodulated received signal based on the parity check matrix H to obtain a code block,
    wherein a size of the code block is associated with the block size Z,
    wherein the block size Z is identified as one of 13 and multiples of 13, and
    wherein the shift value sequence includes the following values:
        143, 19, 176, 165, 196, 13, 0, and 0 corresponding to a row of the base matrix, 18, 27, 3, 102, 185, 17, 14, 180, 0, and 0 corresponding to a row of the base matrix, 126, 163, 47, 183, 132, 1, 0, and 0 corresponding to a row of the base matrix, 36, 48, 18, 111, 203, 3, 191, 160, 0, and 0 corresponding to a row of the base matrix, 43, 27, 117, and 0 corresponding to a row of the base matrix, 136, 49, 36, 132, 62, and 0 corresponding to a row of the base matrix, 7, 34, 198, 168, 12, and 0 corresponding to a row of the base matrix, 163, 78, 143, 107, 58, and 0 corresponding to a row of the base matrix, 101, 177, 22, and 0 corresponding to a row of the base matrix, 186, 27, 205, 81, and 0 corresponding to a row of the base matrix, 125, 60, 177, 51, and 0 corresponding to a row of the base matrix, 39, 29, 35, 8, and 0 corresponding to a row of the base matrix, 18, 155, 49, and 0 corresponding to a row of the base matrix, 32, 53, 95, 186, and 0 corresponding to a row of the base matrix, 91, 20, 52, 109, and 0 corresponding to a row of the base matrix, 174, 108, 102, and 0 corresponding to a row of the base matrix, 125, 31, 54, 176, and 0 corresponding to a row of the base matrix, 57, 201, 142, 35, and 0 corresponding to a row of the base matrix, 129, 203, 140, and 0 corresponding to a row of the base matrix, 110, 124, 52, and 0 corresponding to a row of the base matrix, 196, 35, 114, and 0 corresponding to a row of the base matrix, 10, 122, 23, and 0 corresponding to a row of the base matrix, 202, 126, and 0 corresponding to a row of the base matrix, 52, 170, 13, and 0 corresponding to a row of the base matrix, 113, 161, 88, and 0 corresponding to a row of the base matrix, 197, 194, and 0 corresponding to a row of the base matrix, 164, 172, 49, 161, and 0 corresponding to a row of the base matrix, 168, 193, and 0 corresponding to a row of the base matrix, 14, 186, 46, and 0 corresponding to a row of the base matrix, 50, 27, and 0 corresponding to a row of the base matrix, 70, 17, 50, 6, and 0 corresponding to a row of the base matrix, 115, 189, and 0 corresponding to a row of the base matrix, and 110, 0, 163, and 0 corresponding to a row of the base matrix.

7. The method of claim 6, wherein the block size Z is identified as one of block sizes in a block size group including 13, 26, 52, 104 or 208.

8. The method of claim 6,
wherein the parity check matrix H is identified by replacing 1s in the base matrix by circular shifted identity matrices of size Z×Z according to each of circular shift values, and by replacing 0s in the base matrix by 0-matrices of size Z×Z, and
wherein the circular shift values are obtained based on a modulo operation using values of the shift value sequence and the block size Z.

9. The method of claim 6,
wherein values for a part of the code block is not included in values of the demodulated received signal, and
wherein a length of the part of the code block is 2×Z.

10. The method of claim 6, wherein the base matrix corresponds to a base matrix of size 42×52.

11. A transmitter in a communication system, the transmitter comprising:
a transceiver; and
a controller coupled with the transceiver and configured to:
identify a code block by a segmentation of a transport block based on a code block size, wherein a block size Z is associated with the code block size,
identify a parity check matrix H based on the block size Z, a shift value sequence corresponding to the block size, and a base matrix,
perform a low density parity check (LDPC) encoding on the code block based on the parity check matrix H, and
transmit at least a part of the encoded code block to a receiver,
wherein the block size Z is identified as one of 13 and multiples of 13, and
wherein the shift value sequence includes following values:
143, 19, 176, 165, 196, 13, 0, and 0 corresponding to a row of the base matrix,
18, 27, 3, 102, 185, 17, 14, 180, 0, and 0 corresponding to a row of the base matrix,
126, 163, 47, 183, 132, 1, 0, and 0 corresponding to a row of the base matrix,
36, 48, 18, 111, 203, 3, 191, 160, 0, and 0 corresponding to a row of the base matrix,
43, 27, 117, and 0 corresponding to a row of the base matrix,
136, 49, 36, 132, 62, and 0 corresponding to a row of the base matrix,
7, 34, 198, 168, 12, and 0 corresponding to a row of the base matrix,
163, 78, 143, 107, 58, and 0 corresponding to a row of the base matrix,
101, 177, 22, and 0 corresponding to a row of the base matrix,
186, 27, 205, 81, and 0 corresponding to a row of the base matrix,
125, 60, 177, 51, and 0 corresponding to a row of the base matrix,
39, 29, 35, 8, and 0 corresponding to a row of the base matrix,
18, 155, 49, and 0 corresponding to a row of the base matrix,
32, 53, 95, 186, and 0 corresponding to a row of the base matrix,
91, 20, 52, 109, and 0 corresponding to a row of the base matrix,
174, 108, 102, and 0 corresponding to a row of the base matrix, 125, 31, 54, 176, and 0 corresponding to a row of the base matrix,
57, 201, 142, 35, and 0 corresponding to a row of the base matrix,
129, 203, 140, and 0 corresponding to a row of the base matrix,
110, 124, 52, and 0 corresponding to a row of the base matrix,
196, 35, 114, and 0 corresponding to a row of the base matrix,
10, 122, 23, and 0 corresponding to a row of the base matrix,
202, 126, and 0 corresponding to a row of the base matrix,
52, 170, 13, and 0 corresponding to a row of the base matrix,
113, 161, 88, and 0 corresponding to a row of the base matrix,
197, 194, and 0 corresponding to a row of the base matrix,
164, 172, 49, 161, and 0 corresponding to a row of the base matrix,
168, 193, and 0 corresponding to a row of the base matrix,
14, 186, 46, and 0 corresponding to a row of the base matrix,
50, 27, and 0 corresponding to a row of the base matrix,
70, 17, 50, 6, and 0 corresponding to a row of the base matrix,
115, 189, and 0 corresponding to a row of the base matrix, and
110, 0, 163, and 0 corresponding to a row of the base matrix.

12. The transmitter of claim 11, wherein the block size Z is identified as one of block sizes in a block size group including 13, 26, 52, 104 or 208.

13. The transmitter of claim 11,
wherein the parity check matrix H is identified by replacing 1s in the base matrix by circular shifted identity matrices of size Z×Z according to each of circular shift values, and by replacing 0s in the base matrix by 0-matrices of size Z×Z, and
wherein the circular shift values are obtained based on a modulo operation using values of the shift value sequence and the block size Z.

14. The transmitter of claim 11,
wherein a part of the code block is not included in the encoded code block, and
wherein a length of the part of the code block is 2×Z.

15. The transmitter of claim 11, wherein the base matrix corresponds to a base matrix of size 42×52.

16. A receiver in a communication system, the receiver comprising:
a transceiver; and
a controller coupled with the transceiver and configured to:
identify a block size Z, and a shift value sequence corresponding to the block size Z,
identifying a parity check matrix H based on the block size Z, the shift value sequence, and a base matrix, and
perform a low density parity check (LDPC) decoding on at least a part of a demodulated received signal based on the parity check matrix H to obtain a code block,
wherein a size of the code block is associated with the block size Z,
wherein the block size Z is identified as one of 13 and multiples of 13, and
wherein the shift value sequence includes the following values:
143, 19, 176, 165, 196, 13, 0, and 0 corresponding to a row of the base matrix,
18, 27, 3, 102, 185, 17, 14, 180, 0, and 0 corresponding to a row of the base matrix,
126, 163, 47, 183, 132, 1, 0, and 0 corresponding to a row of the base matrix,
36, 48, 18, 111, 203, 3, 191, 160, 0, and 0 corresponding to a row of the base matrix,
43, 27, 117, and 0 corresponding to a row of the base matrix,
136, 49, 36, 132, 62, and 0 corresponding to a row of the base matrix,
7, 34, 198, 168, 12, and 0 corresponding to a row of the base matrix,
163, 78, 143, 107, 58, and 0 corresponding to a row of the base matrix,
101, 177, 22, and 0 corresponding to a row of the base matrix,
186, 27, 205, 81, and 0 corresponding to a row of the base matrix,
125, 60, 177, 51, and 0 corresponding to a row of the base matrix,
39, 29, 35, 8, and 0 corresponding to a row of the base matrix,
18, 155, 49, and 0 corresponding to a row of the base matrix,
32, 53, 95, 186, and 0 corresponding to a row of the base matrix,
91, 20, 52, 109, and 0 corresponding to a row of the base matrix,
174, 108, 102, and 0 corresponding to a row of the base matrix,
125, 31, 54, 176, and 0 corresponding to a row of the base matrix,
57, 201, 142, 35, and 0 corresponding to a row of the base matrix,
129, 203, 140, and 0 corresponding to a row of the base matrix,
110, 124, 52, and 0 corresponding to a row of the base matrix,
196, 35, 114, and 0 corresponding to a row of the base matrix,
10, 122, 23, and 0 corresponding to a row of the base matrix,
202, 126, and 0 corresponding to a row of the base matrix,
52, 170, 13, and 0 corresponding to a row of the base matrix,
113, 161, 88, and 0 corresponding to a row of the base matrix,
197, 194, and 0 corresponding to a row of the base matrix,
164, 172, 49, 161, and 0 corresponding to a row of the base matrix,
168, 193, and 0 corresponding to a row of the base matrix,
14, 186, 46, and 0 corresponding to a row of the base matrix,
50, 27, and 0 corresponding to a row of the base matrix,
70, 17, 50, 6, and 0 corresponding to a row of the base matrix,
115, 189, and 0 corresponding to a row of the base matrix, and 110, 0, 163, and 0 corresponding to a row of the base matrix.

17. The receiver of claim 16, wherein the block size Z is identified as one of block sizes in a block size group including 13, 26, 52, 104 or 208.

18. The receiver of claim 16,
wherein the parity check matrix H is identified by replacing 1s in the base matrix by circular shifted identity matrices of size Z×Z according to each of circular shift values, and by replacing 0s in the base matrix by 0-matrices of size Z×Z, and
wherein the circular shift values are obtained based on a modulo operation using values of the shift value sequence and the block size Z.

19. The receiver of claim 16,
wherein values for a part of the code block is not included in values of the demodulated received signal, and
wherein a length of the part of the code block is 2×Z.

20. The receiver of claim 16, wherein the base matrix corresponds to a base matrix of size 42×52.

* * * * *